US006845489B1

(12) United States Patent
Mizuno et al.

(10) Patent No.: US 6,845,489 B1
(45) Date of Patent: Jan. 18, 2005

(54) DATABASE FOR DESIGN OF INTEGRATED CIRCUIT DEVICE AND METHOD FOR DESIGNING INTEGRATED CIRCUIT DEVICE

(75) Inventors: Masanobu Mizuno, Osaka (JP); Sadashige Sugiura, Shiga (JP); Kasumi Hamaguchi, Osaka (JP); Hiroshi Takahashi, Osaka (JP); Katsuya Fujimura, Kyoto (JP); Toshiyuki Yokoyama, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/560,154

(22) Filed: Apr. 28, 2000

(30) Foreign Application Priority Data

Apr. 30, 1999 (JP) .......................................... 11-124068

(51) Int. Cl.[7] .............................................. G06F 17/50
(52) U.S. Cl. ................................... 716/1; 716/4; 716/5
(58) Field of Search ....................................... 716/1–14

(56) References Cited

U.S. PATENT DOCUMENTS

| 5,323,108 | A | * | 6/1994 | Marker et al. ............ 324/158.1 |
| 5,487,131 | A | * | 1/1996 | Kassatly et al. ............... 706/53 |
| 5,544,066 | A | | 8/1996 | Rostoker et al. ............... 716/18 |
| 5,623,684 | A | | 4/1997 | El-Ghoroury et al. ......... 712/37 |
| 5,812,561 | A | * | 9/1998 | Giles et al. .................. 714/726 |
| 5,867,400 | A | | 2/1999 | El-Ghoroury et al. .......... 716/1 |
| 5,892,678 | A | | 4/1999 | Tokunoh et al. ................ 716/2 |
| 5,987,506 | A | * | 11/1999 | Carter et al. ................ 709/213 |
| 6,289,412 | B1 | * | 9/2001 | Yuan et al. .................... 703/14 |
| 6,469,751 | B1 | * | 10/2002 | Isobe et al. .................. 348/734 |

* cited by examiner

Primary Examiner—Vuthe Siek
Assistant Examiner—Sun James Lin
(74) Attorney, Agent, or Firm—McDermott Will & Emery LLP

(57) ABSTRACT

A database for design of an integrated circuit device having data stored therein in a flexibly utilizable state, and a method for designing an integrated circuit device using such a database. A virtual core database (VCDB) for storing design data and a VCDB management system (VCDBMS) as a control system are provided. The VCDB includes virtual core (VC) clusters, test vector clusters, and purpose-specific function testing models. The VCDB also includes a system testing database having shared test clusters and peripheral model clusters. The VCDBMS includes a function testing assist section for generating test scenarios, the purpose-specific function testing models, system testing models, and the like, a VC interface synthesis section, and the like.

34 Claims, 50 Drawing Sheets

Fig. 5

| | |
|---|---|
| Hierarchical layer | :Specification layer or Behavioral layer or RT layer |
| Design data (graphics) | : |
| Testing data | :test vector |
| Performance information | :area, delay, (power consumption) |
| Hierarchical information | :higher-level layer VC having superordinate concept on object VC and lower-level layer VC having subordinate concept |
| Derived information | :VC in the same layer to which reference was made during VC generation and VC that made reference to the object VC |
| Shared information | :information shared by VCs in the same layer |
| Modification | :addition or correction |
| Interface | :ex. parallel or serial or PCI path··· |

Fig. 7

```
PRCESS P1;
  DCL Vin integer;
  DCL Vout integer;
START;
  TASK Vin i=0, Vout i=0;
  OUTPUT F1( );
  NEXTSTATE S1;
START S1;
  INPUT F2( );
  NEXTSTATE S2;
  ENDSTATE;
START S2;
    ⋮
ENDPROCESS P1;
```

Fig. 8

```
module HW1(A, B, S);
input A, B;
output S;
reg S;
always @(AorB) begin
 S<=A+B;
end
endmodule
```

Fig. 9

```
int SW1( ){
    ⋮
switch (cond){
case S1;
    ⋮
return;
}
```

Behavioral layer

RT layer

Fig. 12

| RT layer | | Meta | Instance |
|---|---|---|---|
| Design data | | module %module1(clk,reset,data1,data2,out);<br>input clk,reset;<br>input [3:0] data1,data2;<br>output out;<br>wire [3:0] data3;<br>%module2 counter_1(clk,reset,data1,data3);<br>%module3 counter_2(clk,reset,data2,out);<br>endmodule | module channel(clk,reset,data1,data2,out);<br>input clk,reset;<br>input [3:0] data1,data2;<br>output out;<br>wire [3:0] data3;<br>counter counter_1(clk,reset,data1,data3);<br>counter counter_2(clk,reset,data2,out);<br>endmodule |
| Verification data | | module %module4;<br>reg clk,reset;<br>parameter [3:0] data1=4'b0000;<br>parameter [3:0] data2=4'b1111;<br>wire out;<br>%module1 chan_1(clk,reset,data1,data2,out);<br>..<br>endmodule | module test;<br>reg clk,reset;<br>parameter [3:0] data1=4'b0000;<br>parameter [3:0] data2=4'b1111;<br>wire out;<br>channel chan_1(clk,reset,data1,data2,out);<br>..<br>endmodule |

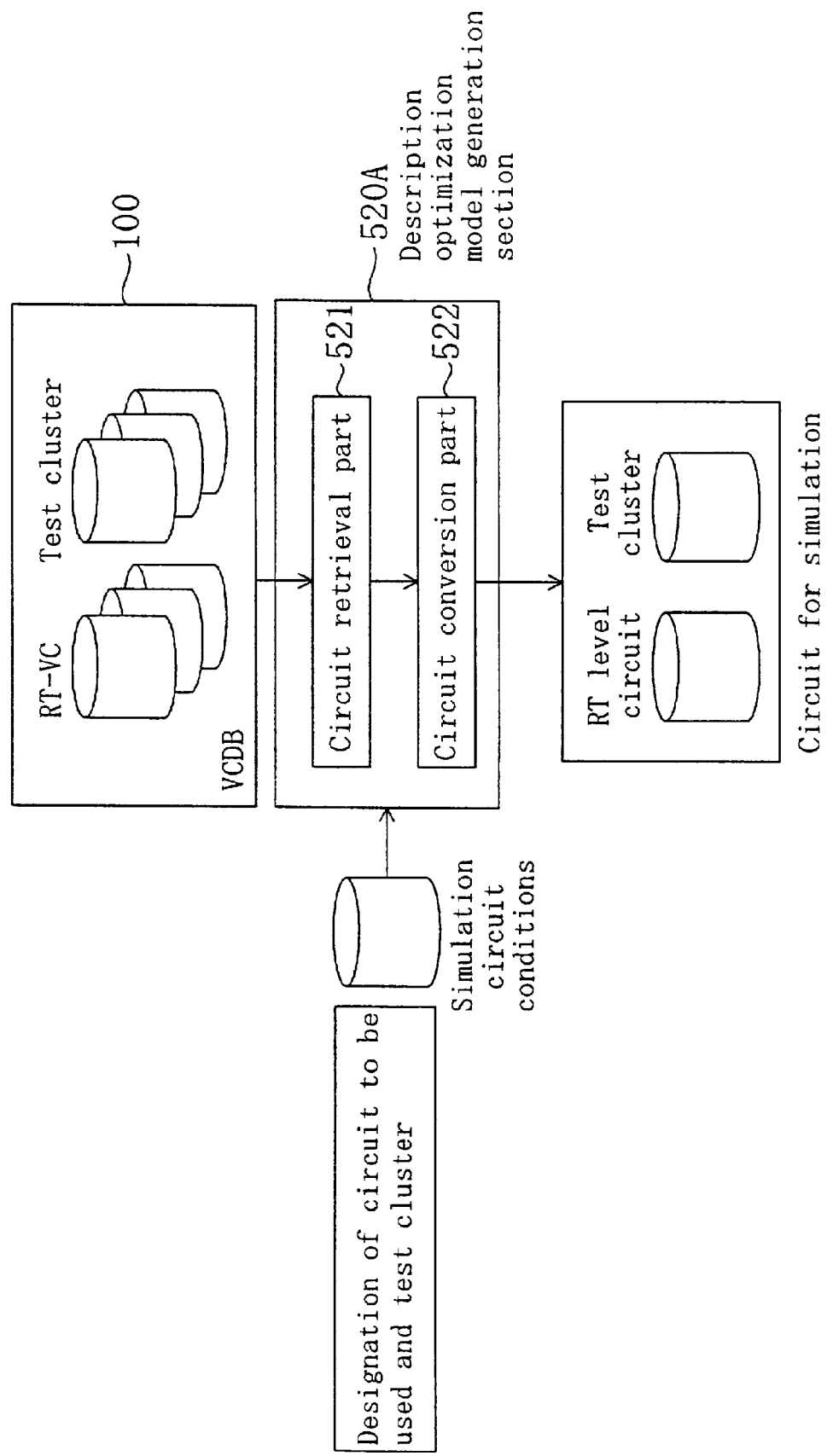

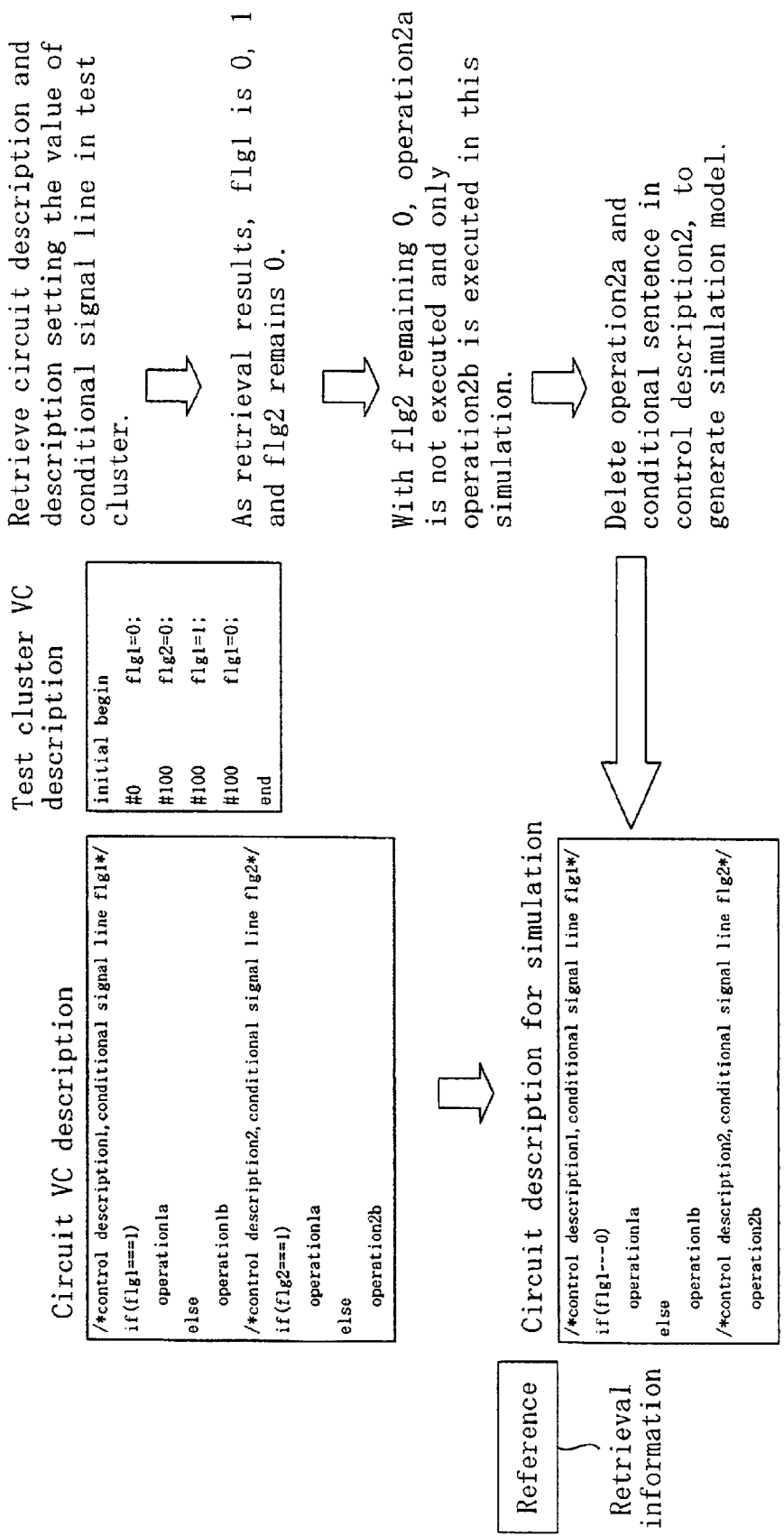

Fig. 38

| | Type | Bit width | Read/write cycle | Max. bus clock frequency |
|---|---|---|---|---|
| VC1 | Bus I/F-A | 8 | 2 | 20MHz |
| | Bus I/F-B | 16 | 1 | 20 |
| | Bus I/F-C | 32 | 1 | 20 |
| VC2 | Bus I/F-X | 16 | 1 | 40 |
| | Bus I/F-Y | 32 | 1 | 40 |

|       | Bit width | Read/write cycle | Max. bus clock frequency |
|-------|-----------|------------------|--------------------------|
| CPU-1 | 8         | 1                | 10MHz                    |
| CPU-2 | 16        | 1                | 20                       |
| CPU-3 | 32        | 2                | 40                       |

Construction of VC interface model

Fig.54 Example of VC interface model

DATABASE FOR DESIGN OF INTEGRATED CIRCUIT DEVICE AND METHOD FOR DESIGNING INTEGRATED CIRCUIT DEVICE

BACKGROUND OF THE INVENTION

The present invention relates to a database used for design of an integrated circuit device and a method for designing an integrated circuit device using such a database. More specifically, the present invention relates to design technology for supporting system-on-chip implementation.

Conventionally, semiconductor devices for an electronic apparatus are fabricated in the following manner. LSIs prepared individually for each type such as a memory and a processor are formed on respective semiconductor chips, and such semiconductor chips are packaged on a motherboard such as a printed board.

In recent years, in an attempt of utilizing electronic apparatuses in a wider range of fields, semiconductor devices used for electronic apparatuses have been requested to reduce the size, weight, power consumption, and cost thereof. This trend is particularly evident in the field of digital information home appliances. In order to respond to such requests from the electronic apparatus industry, the semiconductor industry has been forced to shift the keystone thereof from memories to system LSIs.

A system LSI is practically implemented by mounting memories and various logical circuits on one chip. Such system-on-chip implementation naturally requires process technology for enabling elements such as transistors having different structures to be formed on a common substrate. In addition, it requires great innovation in design technology.

As design technology for supporting such system-on-chip implementation, proposed is a design technique where data for designing a block composed of a plurality of cells for implementing a certain function (for example, one called a function block) is prepared beforehand, and such data is utilized to design a desired system LSI composed of a combination of such blocks. According to this technique, since the structure for implementing the function of each function block has been determined, only design of wiring between function blocks and peripheral circuits is required in the design of the entire semiconductor device. In this way, substantial improvement of design efficiency is intended.

However, the above conventional design technique only includes determining which blocks out of those obtained by lower-level design such as logic design and layout design should be used and how these blocks should be arranged and interconnected. It does not allow for flexible use of the respective blocks, such as using only some components of each block. This technique therefore may fail to fully satisfy a variety of requests directed to system LSIs such as size reduction.

SUMMARY OF THE INVENTION

In view of the above-noted problems with the prior art techniques, the present invention was made to construct a novel design system replacing the conventional design technique using blocks as described above. Specifically, an object of the present invention is to provide a database for design of an integrated circuit device where data of elements recognized as one collective core is stored in a flexibly utilizable state, and a method for designing an integrated circuit device using such a database.

The first database for design of an integrated circuit device according to the present invention comprises a virtual core cluster including a plurality of virtual cores for storing data required for designing the integrated circuit device, the virtual core cluster being arranged in a hierarchical structure of a plurality of layers according to the degree of abstraction. The virtual core cluster includes a test cluster for storing data required for verifying the function of the virtual cores and the function of a system constructed using the virtual cores, the test cluster being arranged in a hierarchical structure of the same number of layers as the virtual core cluster in correspondence with the respective hierarchical layers of the virtual core cluster.

With the above construction, in the testing of the integrated circuit device, the specification, behavior, function, and the like of the device can be verified by separately verifying the respective hierarchical layers of the virtual core cluster.

The test cluster preferably includes at least one of a test bench, a test scenario, a task, and a model.

The second database for design of an integrated circuit device according to the present invention includes a plurality of virtual core clusters each including a plurality of virtual cores for storing data required for designing the integrated circuit device, each of the virtual core clusters being arranged in a hierarchical structure of a plurality of layers according to the degree of abstraction. The database further includes a system testing database for verifying a system when the integrated circuit device is constructed by combining the virtual cores, the system testing database being arranged in a hierarchical structure of the same number of layers as the virtual core cluster in correspondence with the respective hierarchical layers of the virtual core cluster.

With the above construction, testing of the specification, behavior, function, and the like of the entire system of the integrated circuit device, not only a portion thereof, is possible.

In the second database, the system testing database preferably includes a test cluster for storing data required for verifying the function of the virtual cores and the function of the system constructed using the virtual cores, the test cluster being arranged in a hierarchical structure of the same number of layers as the virtual core cluster in correspondence with the respective hierarchical layers of the virtual core cluster.

In the second database, the system testing database preferably includes a peripheral model cluster connected to the peripheral of the virtual cores to be used for testing of the system, the peripheral model cluster being arranged in a hierarchical structure of the same number of layers as the virtual core cluster in correspondence with the respective hierarchical layers of the virtual core cluster.

The third database for design of an integrated circuit device according to the present invention includes a virtual core cluster including a plurality of virtual cores for storing data required for designing the integrated circuit device. The virtual core cluster includes: specification/behavior virtual cores for storing data in specification/behavior levels required for constructing the integrated circuit device; and register transfer virtual cores for storing data in a register transfer level required for satisfying the specification/behavior indicated by the data stored in the specification/behavior virtual cores. The database further includes purpose-specific function testing models specified according to the testing purpose used for verifying the function of the integrated circuit device, the purpose-specific function testing models being linked to the register transfer virtual cores.

With the above construction, the function testing of the integrated circuit device specific to a purpose can be done swiftly.

The purpose-specific function testing models include a synchronization model that changes signal timing used during function testing to a multiple of a given cycle synchronizing with a clock, and a description optimization model.

The description optimization model includes: a model that deletes operation unused during function testing among operation items used in actual behavior of the integrated circuit device; a model that unifies signal lines extending over a plurality of different layers for circuit data found in the respective layers in the virtual core cluster: a model that unifies circuit description formats for the integrated circuit device into a format with which a simulator used during function testing exhibits a highest operation speed; a model that deletes a description on a portion of the integrated circuit device that does not operate during function testing; a model provided with a means for warning upon detection of abnormal behavior.

The fourth database for design of an integrated circuit device according to the present invention includes a virtual core cluster including a plurality of virtual cores for storing data required for designing the integrated circuit device, the virtual core cluster being arranged in a hierarchical structure of a plurality of layers according to the degree of abstraction. The database further includes information on a technique for optimizing fault test in a body of the virtual core.

With the above construction, information usable for fault test and the like for minimizing the test cost is provided.

The fifth database for design of an integrated circuit device according to the present invention includes a virtual core cluster including a plurality of virtual cores for storing data required for designing the integrated circuit device, the virtual core cluster being arranged in a hierarchical structure of a plurality of layers according to the degree of abstraction. The database further includes a model for analyzing the toggle in a body of the virtual core.

The above construction makes it possible to provide a model usable for design of an integrated circuit device with a reduced or uniform toggle, reduced power consumption, and improved reliability.

The fifth database for design of an integrated circuit device according to the present invention includes a plurality of virtual core clusters each including a plurality of virtual cores for storing data required for designing the integrated circuit device, each of the virtual core clusters being arranged in a hierarchical structure of a plurality of layers according to the degree of abstraction. The database further includes a virtual core interface model usable for constructing a system LSI by combining the plurality of virtual core clusters, serving as a coupling model for combining the virtual cores in different layers in the respective virtual core clusters.

With the above construction, smooth simulation is possible even when the plurality of virtual core clusters are in different design levels.

The first method for designing an integrated circuit device according to the present invention is a design method using a virtual core database including a plurality of virtual core clusters each including a plurality of virtual cores for storing data required for designing the integrated circuit device, each of the virtual core clusters being arranged in a hierarchical structure of a plurality of layers according to the degree of abstraction. The method includes the step of: in response to a request for verifying the integrated circuit device, retrieving information on the virtual core cluster in the virtual core database and generating a test cluster for verifying the integrated circuit device.

By the above method, data required for testing, as well as descriptions, tasks, and the like relating to the procedure of the testing, can be automatically generated.

The second method for designing an integrated circuit device according to the present invention is a design method using a virtual core database including a plurality of virtual core clusters each including a plurality of virtual cores for storing data required for designing the integrated circuit device, each of the virtual core clusters being arranged in a hierarchical structure of a plurality of layers according to the degree of abstraction. The method includes the step of: in response to a request for verifying the integrated circuit device, generating purpose-specific function testing models specified according to the testing purpose used for verifying the function of the integrated circuit device, the purpose-specific function testing models being linked to virtual cores in a function layer in the virtual core cluster.

By the above method, the function testing of the integrated circuit device specific to a purpose can be done swiftly.

The purpose-specific function testing models include various models as described above.

The third method according to the present invention is a design method using a virtual core database including a plurality of virtual core clusters each including a plurality of virtual cores for storing data required for designing the integrated circuit device, each of the virtual core clusters being arranged in a hierarchical structure of a plurality of layers according to the degree of abstraction. The method includes the step of: generating a system testing model for verifying a system when the integrated circuit device is constructed by combining the virtual cores, the system testing database being arranged in a hierarchical structure of the same number of layers as the virtual core cluster in correspondence with the respective hierarchical layers of the virtual core cluster.

By the above method, the testing of the entire system can be done easily and swiftly.

The fourth method for designing an integrated circuit device according to the present invention is a design method using a virtual core database and a CPU for testing, the virtual core database including a plurality of virtual core clusters each including a plurality of virtual cores for storing data required for designing the integrated circuit device, each of the virtual core clusters being arranged in a hierarchical structure of a plurality of layers according to the degree of abstraction. The method includes the step of: retrieving a virtual core from the virtual core database according to simulation results, while extracting a parameter relating to the CPU used from the simulation results, to select or generate an interface matching with the parameter of the CPU used, and store the interface in the virtual core.

The above method eliminates the necessity of matching the interface with the CPU used every time required during simulation. Thus, swift simulation is realized.

In the fourth method, when the interface is a bus interface for allowing transmit/receive of a signal between the CPU and a bus, the bus interface is stored separately from a virtual core function base in the virtual core, and the bus interface is generated in compliance with a protocol of the CPU used. This allows for swift simulation.

The fifth method for designing an integrated circuit device according to the present invention is a design method using a virtual core database including a plurality of virtual core clusters each including a plurality of virtual cores for storing data required for designing the integrated circuit device, each of the virtual core clusters being arranged in a hierarchical structure of a plurality of layers according to the degree of abstraction. The method includes the step of: analyzing the toggle in a body of a virtual core.

The above method makes it possible to design an integrated circuit device with reduced power consumption and improved reliability.

The sixth method for designing an integrated circuit device according to the present invention is a design method using a virtual core database including a plurality of virtual core clusters each including a plurality of virtual cores for storing data required for designing the integrated circuit device, each of the virtual core clusters being arranged in a hierarchical structure of a plurality of layers according to the degree of abstraction. The method includes the step of: optimizing fault test in a body of a virtual core.

The above method makes it possible to design an integrated circuit device in consideration of the test cost for fault test and the restriction conditions.

BRIEF DESCRIPTION OF THE DRAWINGS

FIG. 5 is a view showing the structure of a VC in the embodiment of the present invention.

FIG. 7 shows an example of design data described in SDL format in the embodiment of the present invention.

FIG. 8 shows an example of data generated in a hardware section in the embodiment of the present invention.

FIG. 9 shows an example of data generated in a software section in the embodiment of the present invention.

FIG. 12 shows examples of meta data and instance data in the RT layer in the embodiment of the present invention.

FIG. 23 is a view illustrating a model generation method employed by a description optimization model generation section in the function testing assist section in the embodiment of the present invention.

FIG. 24 illustrates an example of operation used when generating a circuit for simulation in the embodiment of the present invention.

FIG. 38 shows the bit width, the read/write cycle, and the maximum bus clock frequency for bus I/Fs (bus I/F-A, B, C, X, Y) in the form of a table.

DESCRIPTION OF THE PREFERRED EMBODIMENTS

Hereinbelow, an embodiment of the present invention will be described with reference to the accompanying drawings. First, the definition of concepts such as VC, VCDS, and VCDB as used herein will be described, followed by the outline of the construction of the VCDS and detailed description of respective components.

[Concept of VC, VCDS, and VCDB]

The term "virtual core (VC)" as used herein, which is a concept different from the "VC" as 'virtual component' often used synonymously with "IP" (function block), is meant to be used for design of a system LSI constructed of one collective block and, in particular, refers to reusable data including hardware and software. The term "virtual core design system (VCDS)" as used herein is meant to refer to the entire system for optimizing hardware and software of a system LSI using the VC. The term "virtual core database (VCDB)" as used herein is meant to refer to a database used for the VC-using design.

[Outline of Construction of VCDS]

Figure 1:
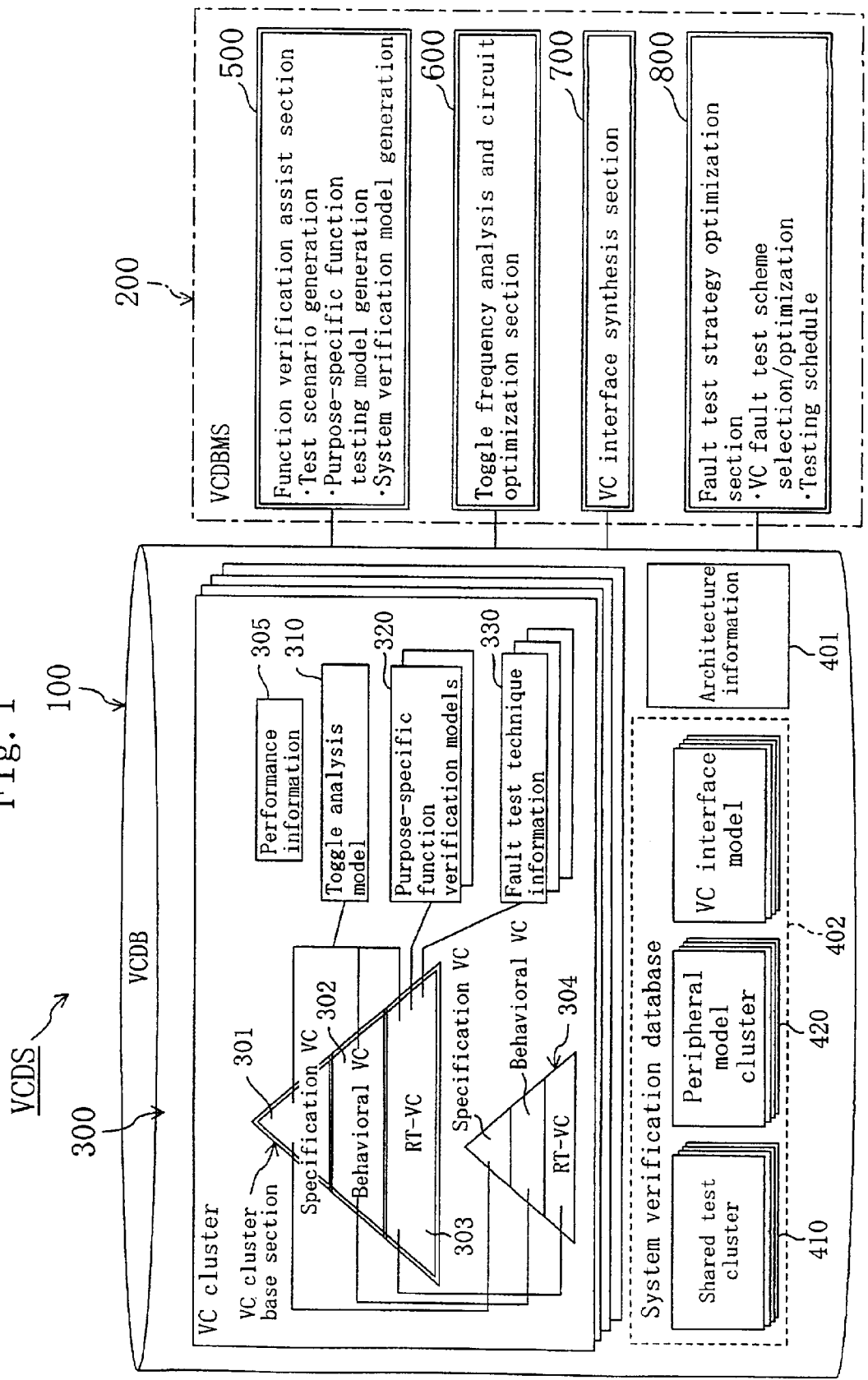
FIG. 1 is a conceptual view of the construction of a virtual core design system (VCDS) for system LSI design in an embodiment of the present invention.

FIG. 1 is a conceptual view of a virtual core design system (VCDS) for design of a system LSI in an embodiment according to the present invention.

Referring to FIG. 1, the VCDS in this embodiment includes a virtual core database (VCDB) 100 for storing data for system design and a VCDB management system (VCDBMS) 200 that is a control system for performing optimization of the VCDB 100 and the like.

The VCDB 100 includes a VC cluster 300 as a collective of VCs, architecture information 401 for determining the structure of the VCs in the VC cluster 300, and a system verification database 402.

The VC cluster 300 includes a body section generally composed of a specification layer for VCs storing data described in the specification form (specification VCs 301), an behavioral layer for VCs storing data described in the behavioral form (behavioral VCs 302), and a function layer for VCs storing data described in a register transfer (RT) level in (RT-VCs 303). The VC cluster 300 also includes: a test cluster 304 that has parameterized test patterns and performs circuit simulation; and performance information 350 for evaluating the performance of the VCs by simulation and the like.

The performance information 350 includes performance indicators that are parameters such as the area and the speed, for example. With these performance indicators, considerably accurate calculation of a value is possible in the RT level, for example. In addition, if hardware implementation has been actually done in the RT level, the results can also be incorporated as an information indicator.

The VC cluster 300 further includes the following components linked to one or more VCs in the base section: a toggle analysis model 310 linked to the specification VCs 301 (specification layer), the behavioral VCs 302 (behavioral layer), and the RT-VCs 303 (function layer); a purpose-specific function testing models 320 linked to the RT-VCs 303 (function layer); and fault test technique informtion 330 linked to the RT-VCs 303 (function layer) including information on the type of test such as scanning and BIST available for the VCs, and the like.

The architecture information 401 includes information on how the respective VCs should actually be used. For example, if a certain task is to be implemented by software, the architecture information 401 includes various items of information required for the system LSI, such as "what processor should be used to execute the tasks", "What bus (interface) should be used", "how the power and clock supply scheme should be", "what test scheme should be used for logical synthesis", and "how about restrictions in the naming rules (restrictions on tools and rules for preventing overlap naming)".

The system verification database 402 serves as a database for verifying the function of an LSI obtained by combining VCs, and includes a shared test cluster 410, a peripheral model cluster 420, and a VC interface model.

The shared test cluster 410 and the test cluster 304 in the VC cluster 300 respectively include a test bench, a test scenario, a task, and a model. The test bench includes a system structure for test and a function model. The test scenario refers to a flow of testing in the system level, i.e., a system behavioral sequence. The task refers to a task for initializing a VC or executing a specific function. The model refers to a link to a simulation model, a VC model, or a peripheral simulation model to be used in the construction of the test bench. Concrete examples of the constructions of the test clusters will be described hereinafter.

The peripheral model cluster 420 includes models for peripheral of VCs used during system testing, such as models describing an external medium, an external memory, a transmission route in the case of a communication LCI, and a sensor. By combining the VCs with these peripheral models, the entire system can be verified smoothly. The VC interface model serves as a model for coupling respective VCs during system simulation.

The VCDBMS 200 performs registration with the VCDB 100, external retrieval from the VCDB 100, generation of instances, and other various types of operation described below. The registration includes, not only registering a new core, but also generating a new VC based on an existing VC, modifying the function of the VC, adding data to the VC, storing associated difference management information, and the like. The retrieval is done based on what type of information in which level of VC is desired.

The VCDBMS 200 includes: a function testing assist section 500 for generating test scenarios, purpose-specific function testing models (simulation models), system testing models (system simulation models), and the like; a toggle analysis and circuit optimization section 600; a VC interface synthesis section 700; and a fault test strategy optimization section 800 for selecting/optimizing a VC fault test scheme and planning a testing schedule.

Figure 2:
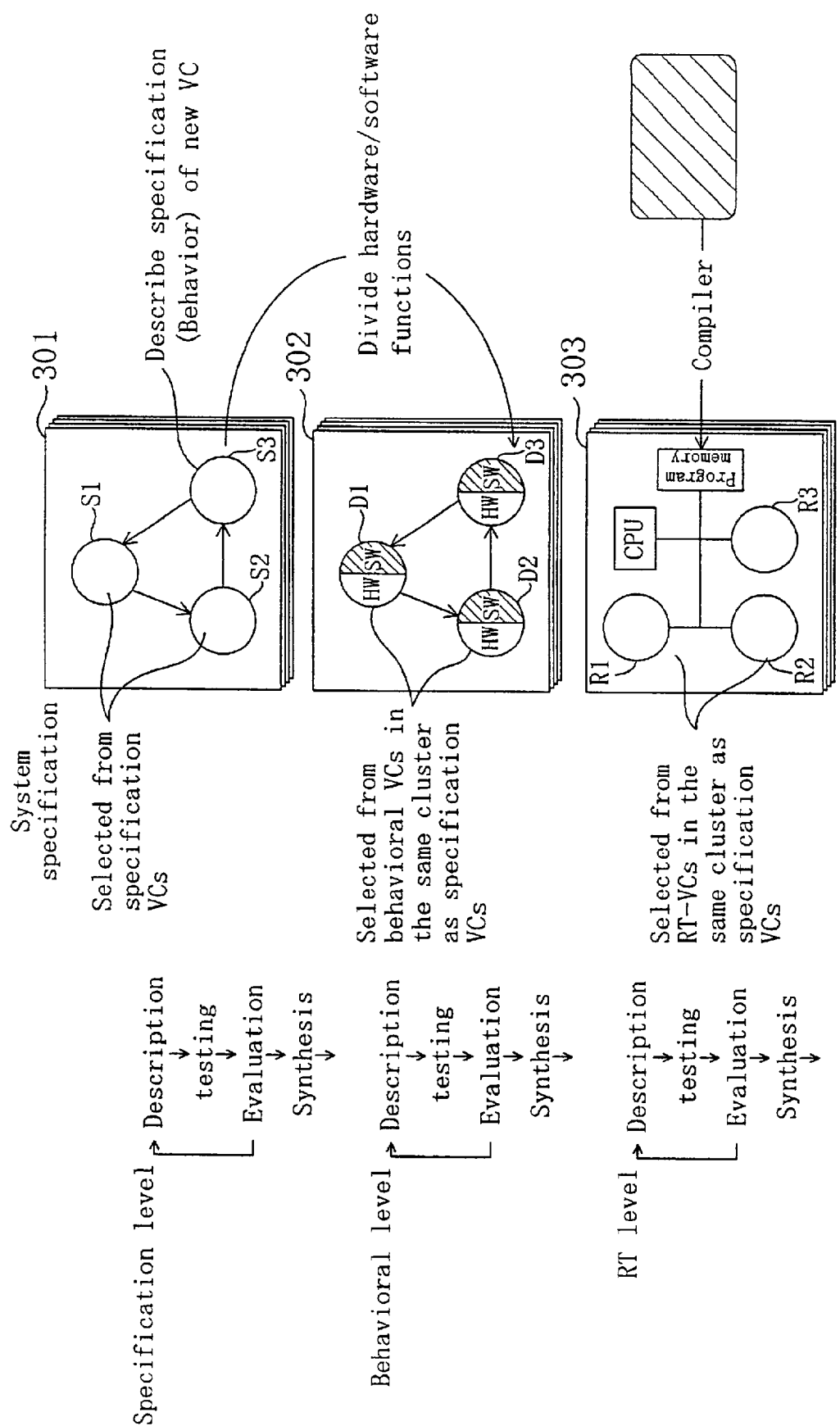
FIG. 2 is a view illustrating a basic task flow in the VCDS in the embodiment of the present invention.

FIG. 2 shows a basic design flow in the VCDS in this embodiment. As shown in FIG. 2, in all of the specification level, the behavioral level, and the RT level, VCs are generated, modified, or otherwise processed in the sequence of "description", "testing", "evaluation", and "synthesis". For example, in the specification level, existing specification VCs S1 and S2 are retrieved, or a new VC S3 is generated. In this occasion, data flows in the direction indicated by the arrows in the figure for description, testing, and evaluation of the data. The evaluation results are fed back. In the behavioral level, behavioral VCs D1, D2, and D3 respectively corresponding to the specification VCs S1 , S2 , and S3 are generated, each of which is functionally divided into hardware and software. In the RT level, RT-VCs R1, R2, and R3 respectively corresponding to the behavioral VCs D1, D2, and D3 are generated, together with a CPU, a memory, buses for connecting these VCs, and the like. Thus, in this level, the system becomes more concrete.

Each task is described by means of external input/output, a specification VC, state transfer, and the like. Each specification VC is described with a language or graphics capable of representing state transfer, logic, a truth table, and the like.

Thus, by arranging VCs in the respective hierarchical layers and managing these VCs collectively, a flexibly usable database can be provided, unlike the conventional function blocks.

Figure 3:
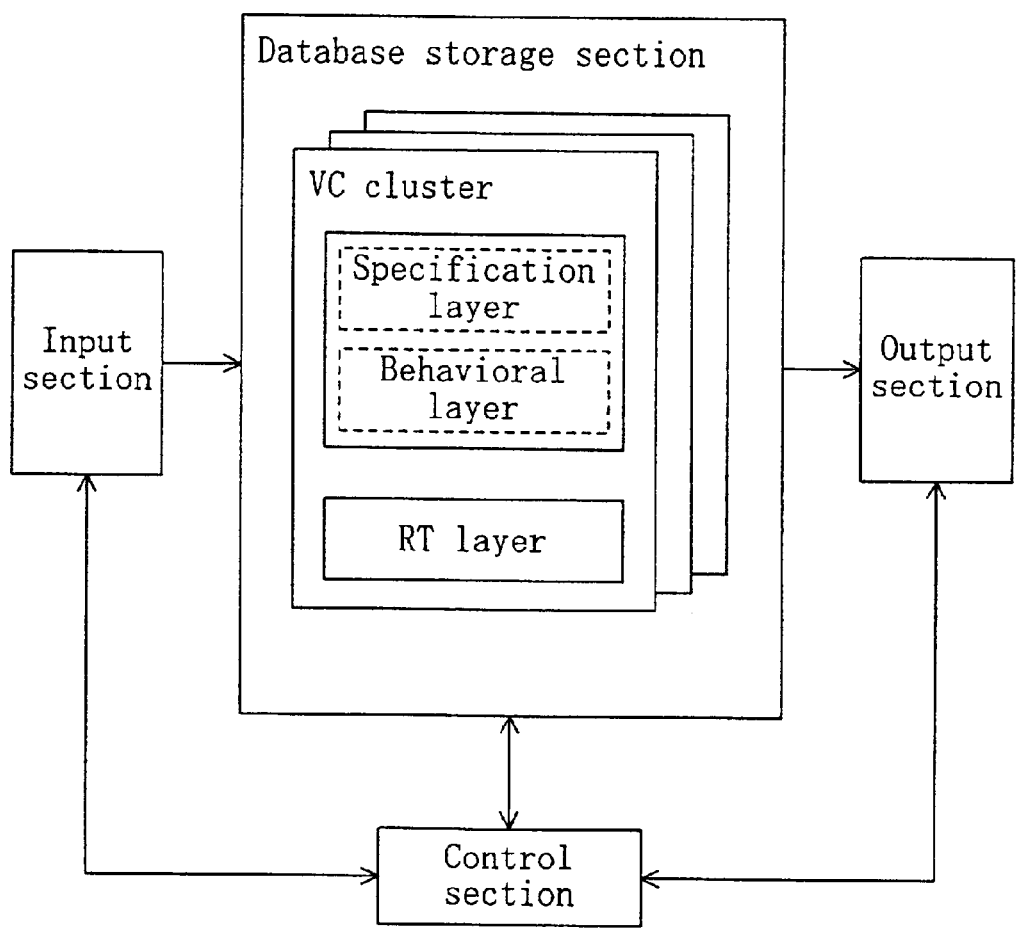
FIG. 3 is a block circuit diagram of a functional portion of the system shown in FIG. 1.

FIG. 3 is a block circuit diagram of functional part of the system shown in FIG. 1, showing an input section for supplying information to a database storage section where VC clusters are stored, an output section for receiving output information from the database storage section, and a control section for controlling the database storage section, the input section, and the output section. Each VC cluster includes a specification/behavior layer composed of a specification layer for generating specification VCs and an behavioral layer for generating behavioral VCs, and a RT layer for generating RT-VCs. The specification layer and the behavioral layer are put together in this case as the specification/behavior layer since they are not clearly distinguished from each other in some cases. The "behavior" as used herein refers to allocating one specification to software and hardware. In general, a plurality of behaviors exists for one specification. The "register transfer (RT)" as used herein refers to hardware implementation of the behavior. In general, a plurality of different methods exist for implementing one behavior depending on the parameter on which importance is placed, and the like. In other words, in general, a plurality of behavioral VCs exists for one specification VC, and a plurality of RT-VCs exists for one behavioral VC in a hierarchical manner. It should however be noted that the specification and the behavior as used herein both represent functional concepts and thus it may be difficult to distinguish one from the other. In such a case, it is possible to prepare a database for specification/behavior Vcs the components of the VCDS shown in FIG. 1 will be described individually in detail in structure, function, and the like.

[Construction of VC Cluster]

(Construction of Body Section of VC Cluster)

Figure 4:
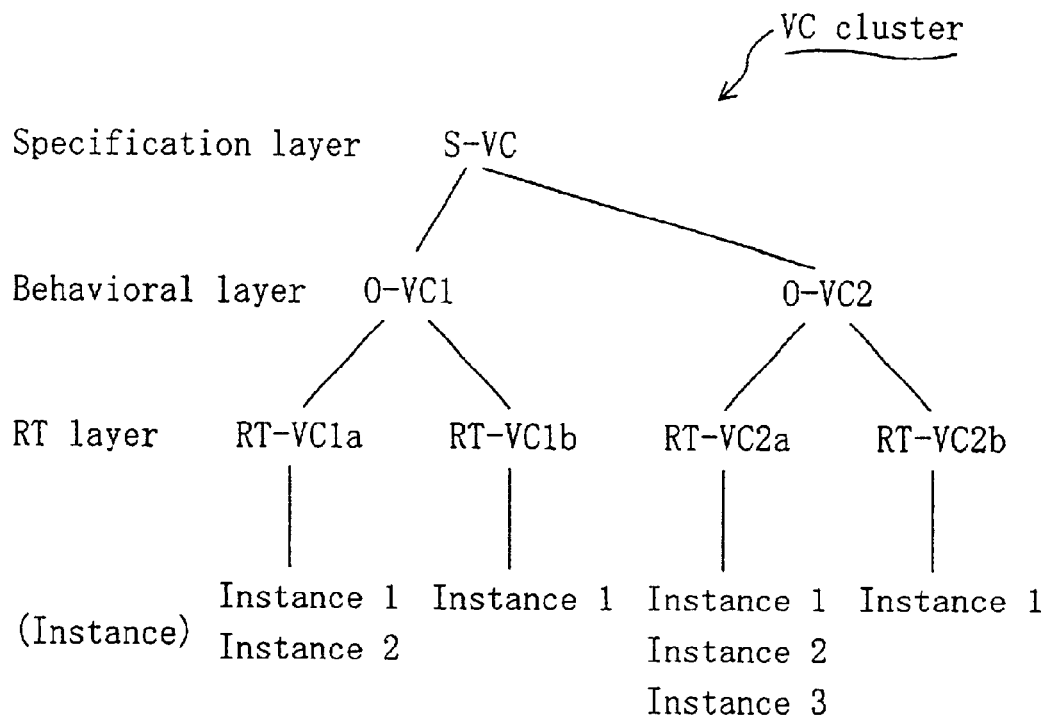
FIG. 4 is a view illustrating the function of a virtual core (VC) cluster in the embodiment of the present invention.

FIG. 4 is a view illustrating the function of the base section of the VC cluster. Referring to FIG. 4, when a specification VC S-VC representing a certain function exists in the specification layer, a plurality of behavioral VCs D-VC1, D-VC2 for implementing the specification VC generally exist in the behavioral layer downstream of the specification layer. In the RT layer downstream of the behavioral layer, a plurality of RT-VCs RT-VC1a, RT-VC1b and RT-VC2a, RT-VC2b for implementing the behavioral VCs O-VC1 and O-VC2 generally exist. For example, for one specification of "multiplication", a plurality of behaviors generally exist because the behavior for implementing the multiplication is a combination of a plurality of unit behaviors such as additions and shifts. There is of course a case where only one behavioral VC exists for one specification VC. In the example shown in FIG. 4, for one specificiation VC of "multiplication", the behavioral VC O-VC1 represents a method that places importance on the delay and the behavioral VC O-VC2 represents a method that places importance on the occupation area, for example. Each layer is provided with the function of generating an instance VC and adding it thereto. In the example shown in FIG. 4, one or more instance VCs are generated in the RT-VCs RT-VC1a, RT-VC1b, RT-VC2a, and RT-VC2b.

FIG. 5 shows the structure of a VC in the specification, behavior, and RT layers in this embodiment. The VC includes: design data (graphics) to be described hereinafter; testing data such as a test vector; performance information such as the area and delay (and power consumption, as required); hierarchical information to be used as link information regarding a higher-level layer VC having a superordinate concept and a lower-level layer VC having a subordinate concept, with respect to the object VC; derived information regarding a VC in the same layer to which reference was made during generation of the object VC and a VC that made reference to the object VC; shared information, if any, shared by VCs in the same layer (e.g., in the behavioral layer); details of modification if addition or correction was made; and interface information for generating buses such as parallel, serial, or PCI paths.

Figure 6:
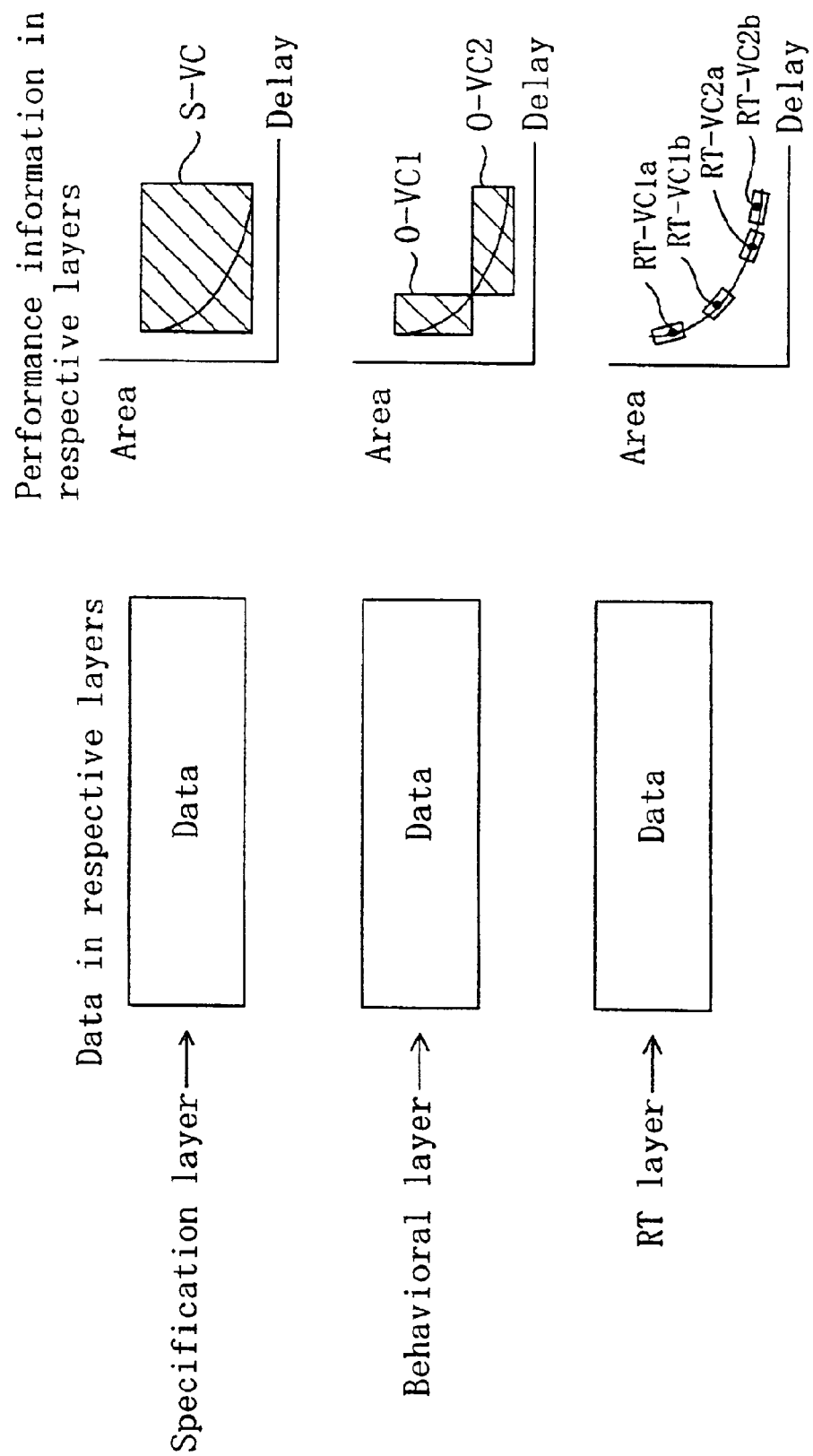
FIG. 6 is a view illustrating the relationship between data and performance information of a VC in each layer in the embodiment of the present invention.

FIG. 6 shows the relationship between data and performance information of a VC in each layer. On the right side of the figure there are shown examples of VC performance information in the respective layers obtained by using the occupation area and the delay as parameters for performance evaluation. On the left side there should exist design data and testing data for the respective layers as described hereinafter, which are however omitted in FIG. 6 for simplification of the description. The respective layers are now described in detail.

Specification Layer

The specification layer is the portion where the basic input/output (I/O) relationship, that is, the "function" of the system is defined. Therefore, design data in the specification layer includes the type of an I/O signal, text-base data, a standard such as a protocol, performance such as target performance for conforming to a given standard, and a function specification in the form of a document. A specification testing model includes a specification description (language or graphics) represented by finite state machine (FSM), a control flow graph (CFG), a data flow graph (DFG), or the like. Concrete examples of the format include VHDL, SDL, LOTOS, and C/C++. FIG. 7 shows an example of design data described in the format of SDL.

Behavioral Layer

The behavioral layer includes architecture information, a hardware section, and a software section. The architecture information includes the names of the object processor and OS, a hardware and software communication method, and the like. For example, in the case of combining a processor, an OS, and a simulation, the processor to be used may be Sparc, Pentium, or the like, the OS to be used may be UNIX, Windows, or the like, and the hardware and software communication method to be used may be IPC, PLI, or the like. An appropriate combination of these components, as well as required preconditions, are described as the architecture information. Note that CPU may not be required. The hardware section describes the function in the form of document in a more concrete manner than that in the specification layer. More specifically, the behavioral layer includes details of an behavioral mode that are not described in the specification layer. FIG. 8 shows an example of data stored in the hardware section, which is described with a hardware descriptive language such as VerilogHDL and VHDL. FIG. 9 shows an example of data stored in the software section, which is described with a source code (e.g., C/C++).

Figure 10:
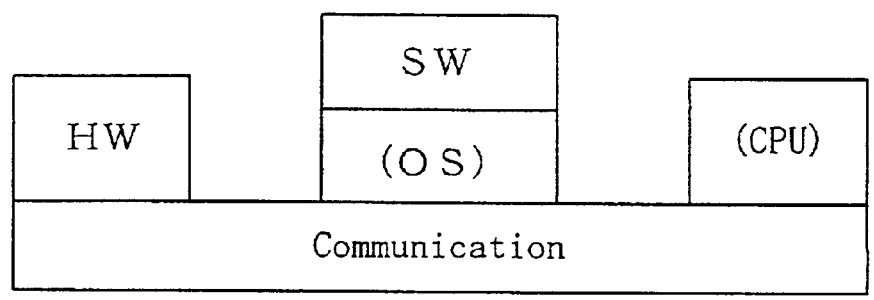
FIG. 10 shows an environment used for testing of an behavioral layer in the embodiment of the present invention.

FIG. 10 is a view illustrating an environment used during testing of the behavioral layer, including the hardware section (HW), the software section (SW), a CPU if any, and a communication section. Optionally, an OS may exist between the communication section and the software section. In this state of the behavioral layer, therefore, bus connection is undetermined.

RT Layer

Figure 11:
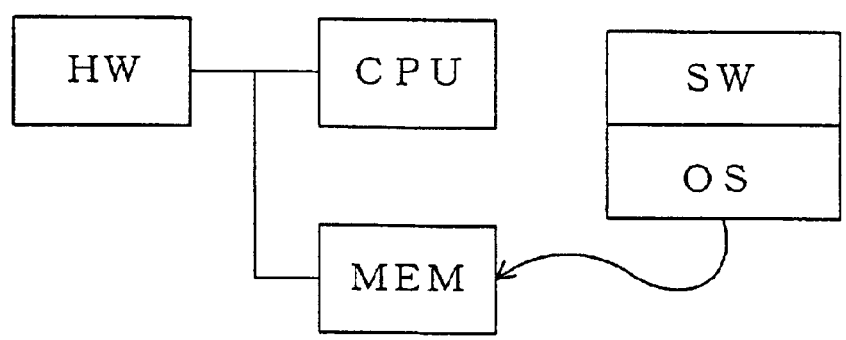
FIG. 11 shows an environment used for testing of a RT layer in the embodiment of the present invention.

The RT layer basically includes architecture information, a hardware section, and a software section, as in the behavioral layer. In this layer, however, as shown in FIG. 11, buses are formed connecting among the hardware section (HW), the CPU, a memory (MEM), and the software section (SW) including the OS. In this layer, therefore, the communication method is made concrete to such a degree that how to connect these components is known. The design data can now be embodied as hardware, that is, can be logically synthesized. Both the hardware section and the software section include meta data and instance data. The instance data as used herein refers to data obtained by replacing a variable in the meta data described as a parameter with a constant. FIG. 12 shows examples of meta data and instance data in the RT layer.

The architecture information of the RT layer includes the following.

Processor (CPU) information: a coordinating testing model used in the behavioral layer and the RT layer, which exists for each processor.

Bus (I/F) information: information on the type and width of a signal on a bus, and a protocol of a bus (timing), which includes data for connecting the processor to respective hardware components.

Test scheme information: information on the test scheme together with the function/specification required (e.g., dedicated terminals and additional circuits). In a full scan method, for example, information on Sin (scan in), Sout (scan out), Sclk (scan clock), TE signals, and the like is required. If JTAG, one of boundary scan test schemes, is employed, information on the control terminal, the TAP controller circuit, and the like is required. If respective cores are directly tested from outside separately, information on the test mode terminal, the selector circuit, and the like is required.

As the naming rules, included are: a restriction for each EDA tool that processes generated instance VCs, for instance, "the module name should include not more than 16 alphanumeric small characters"; and a restriction for preventing generation of different instance VCs having the same name, for instance, code, "A981005 N, should be prefixed to the module name."

Performance Information in Respective Layers

Assume that the specification VC S-VC exists in the specification layer as shown in FIG. 4. If the performance of this specification VC is represented by the area and the delay, the range of the performance corresponds to the hatched portion shown in the upper right graph of FIG. 6. For this specification VC, the behavioral layer provides the delay-stressing behavioral VC O-VC1 and the area-stressing behavioral VC O-VC2 as shown in FIG. 4. The ranges of the performances of the behavioral VCs O-VC1 and O-VC2 correspond to the hatched smaller-delay and smaller-area portions shown in the middle right graph of FIG. 6, respectively. For these behavioral VCs O-VC1 and O-VC2, the RT layer provides RT-VCs RT-VC1a and RT-VC1b, and RT-VC2a and RT-VC2b, respectively, as shown in FIG. 4. The area and delay of each of the RT-VCs are now determined as a point on the concrete curve as shown in the lower right graph of FIG. 6.

In reality, since the performance information includes a number of parameters, the performance information in each layer is represented by a multidimensional coordinate system, not the planar coordinate system as shown in FIG. 6. Thus, the performance information is actually represented as a range or a point in the RT layer or as a range in the specification or behavioral layer, in a multidimensional coordinate system.

(Construction of VC Cluster Other Than Body Section)

Toggle Analysis Model

Figure 13:
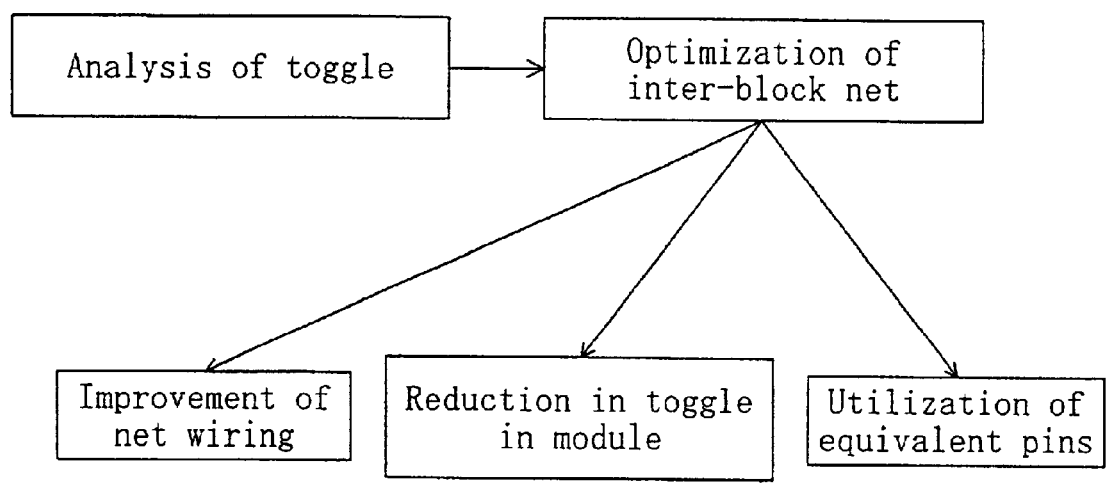
FIG. 13 is a conceptual block diagram of operation done by a toggle analysis and circuit optimization section shown in FIG. 1.

FIG. 13 is a conceptual block diagram of the operation done by the toggle analysis and circuit optimization section shown in FIG. 1. The length of an inter-block net tends to be larger than that of an inner-block net. Accordingly, if an interconnect having a high toggle exists between blocks, such an interconnect may be incorporated inside a block.

This reduces the capacitance of the interconnect and thus reduces power consumption. In addition, the toggle in a module may be reduced by dividing a circuit into parallel-arranged circuits to disperse the circuit behavior. When there exist a plurality of pins that can output the same results even if input information is exchanged therebetween, nets connected to the pins may be exchanged. This reduces the internal toggle. Moreover, by equalizing the transition of signals on the nets connected to such pins, degradation of the circuit can be minimized. In addition, net wiring may be designed in consideration of the toggle, which had been designed only in consideration of the total length thereof in the floor planning. This allows for reduction in toggle as long as the delay restriction is not violated. By incorporating a model for executing the above operation in the VCDB 100, design of an LSI with reduced power consumption and high reliability is possible.

Purpose-Specific Function Testing Model

Figure 14:
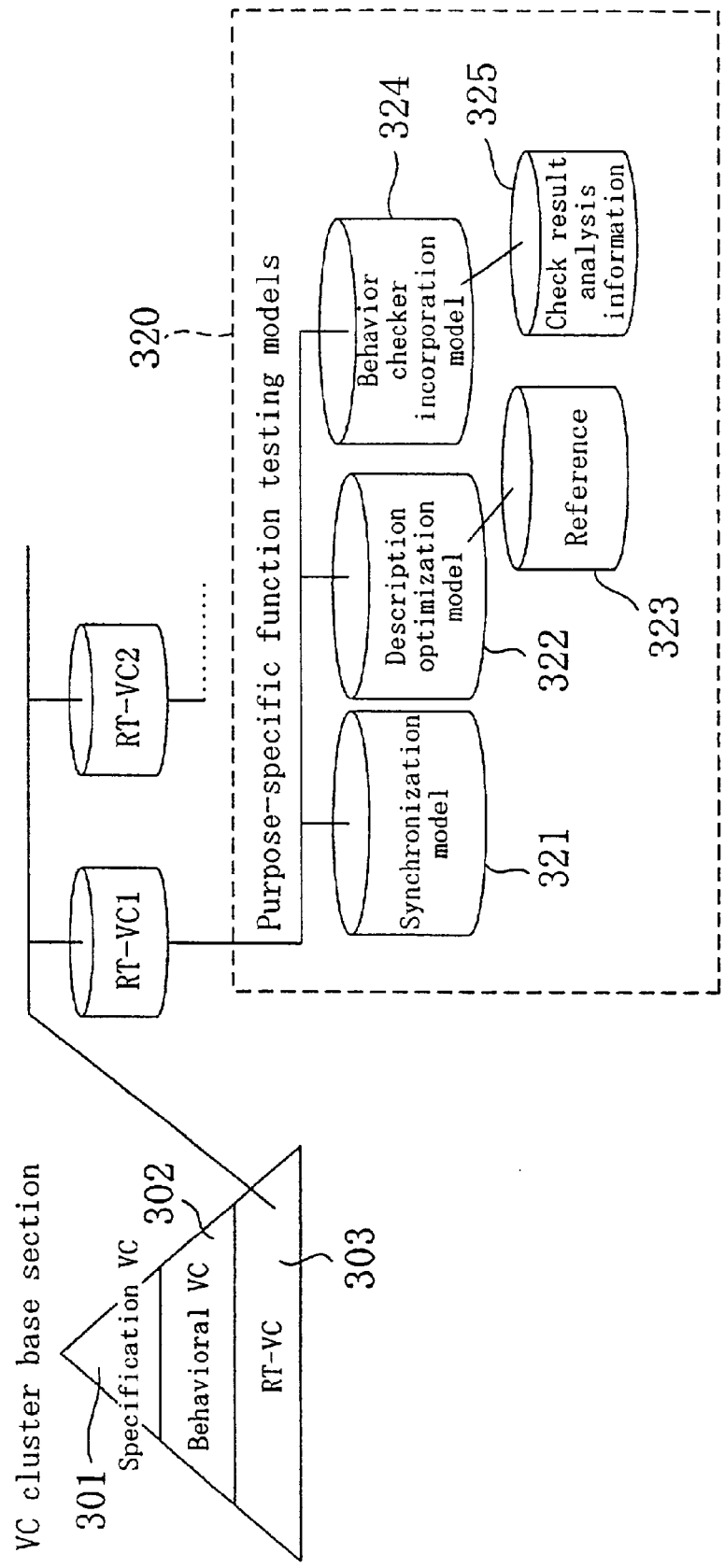
FIG. 14 is a view illustrating an example of details of purpose-specific function testing models in the embodiment of the present invention.

FIG. 14 shows an example of details of the purpose-specific function testing models 320. As shown in FIG. 14, the RT-VCs 303 in the VC cluster body section include RT-VC1, RT-VC2, . . . that are RT-level design descriptions representative of actual circuits. The purpose-specific function testing models 320 are prepared for each of RT-VC1, RT-VC2, . . . as testing models (simulation models) allowing for testing for specific purposes. A set of the purpose-specific function testing models 320 include, for example, a synchronization model 321, a description optimization model 322, the behavior checker incorporation model 324, and the like arranged in parallel.

The synchronization model 321 performs testing only every cycle of a synchronous clock signal for a model that operates at a normal unit time cycle. This is applied to such a type of testing that does not require so high accuracy as that required for actual behavior. Instead, this model intends to perform high-speed simulation while omitting minor delicate behavior, delay, and the like.

The description optimization model 322 is provided for the following purpose. While a description allowing for logical synthesis is required for implementation of a circuit, if such a description is used for testing simulation, the simulation may become too slow. In such a case, the description is changed for use in simulation, to obtain a high-speed model that is optimized for simulation although being inferior in the circuit synthesis. The description optimization model 322 is provided with a reference 323 for associating the description optimization model 322 with the original circuit description in the corresponding RT-VC in the VC cluster body section.

The behavior checker incorporation model 324 is a model indicating how to detect a VC when the VC is used, as described hereinafter. For example, the simulation model incorporates therein a prohibition such as that a certain signal pattern must not be included in an input signal and that transition of the inner state in a certain sequence is prohibited. The behavior checker incorporation model incorporates therein a mechanism that returns error information if any of such prohibitions occurs during the simulation. The behavior checker incorporation model 324 is provided with check result analysts information 325 for analyzing the meaning of an error when the error occurs. In other words, testing is performed, not using the design data of each VC in the VC cluster body section relating to an actual circuit directly, but using a model provided for performing optimum testing specific to a purpose.

Figure 15:
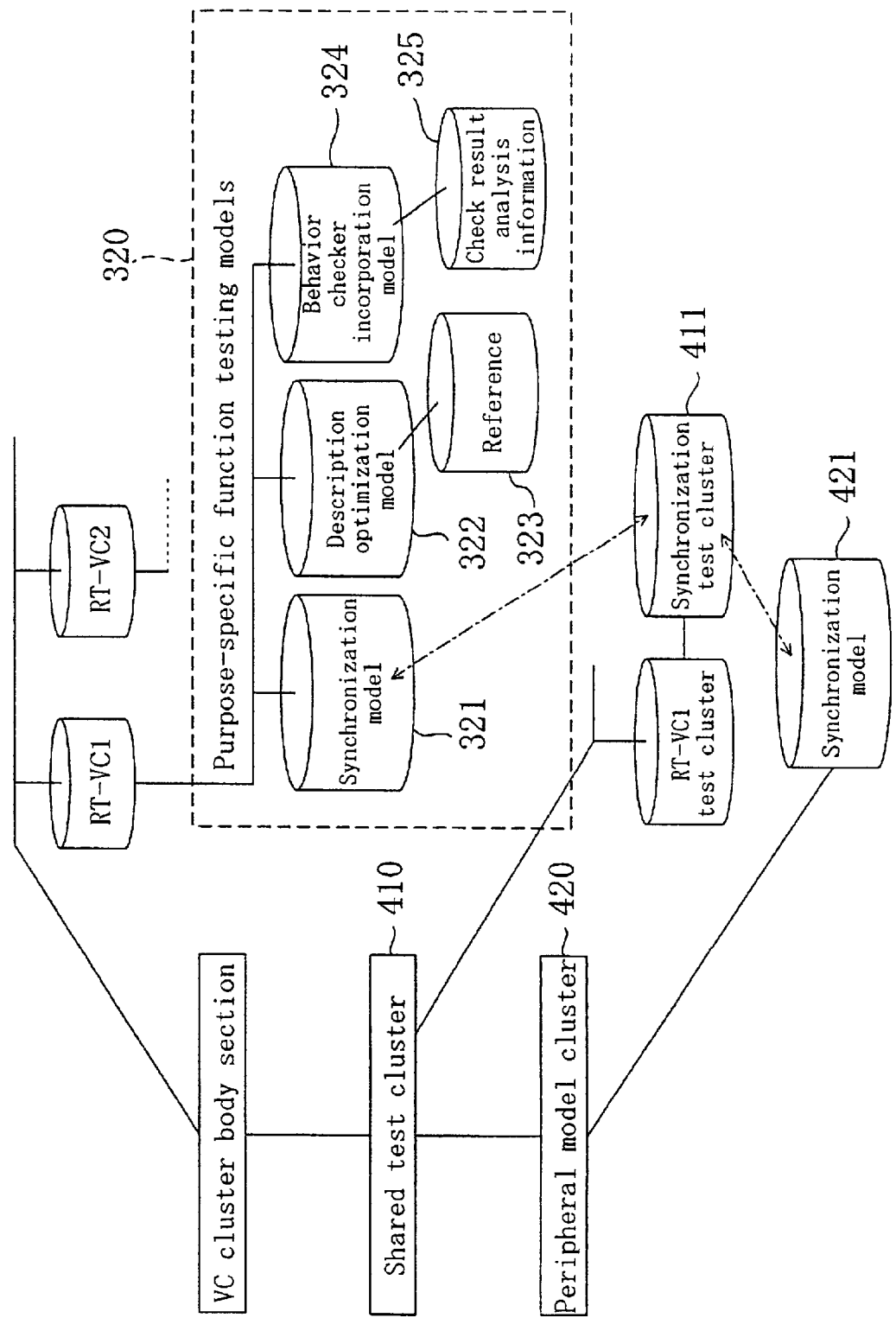
FIG. 15 is a view illustrating use of a synchronization model in the purpose-specific function testing models in the embodiment of the present invention.

FIG. 15 is a view focusing on the use of the synchronization model 321 among the purpose-specific function testing models 320. The synchronization model 321 in this embodiment is a model for allowing testing in synchronization with only the clock cycle as described above. Actually, however, the synchronization for high-speed testing is often difficult only with the existence of the synchronization model 321 in the VC cluster body section. Therefore, a synchronization test cluster 411 and a synchronization model 421 which have the same degree of precision as the synchronization model 321 in the VC cluster body section are provided for RT-VCs in the shared test cluster 410 and for the peripheral model cluster 420, respectively. How to generate these synchronization models will be described hereinafter.

System Testing Database

Figure 16:
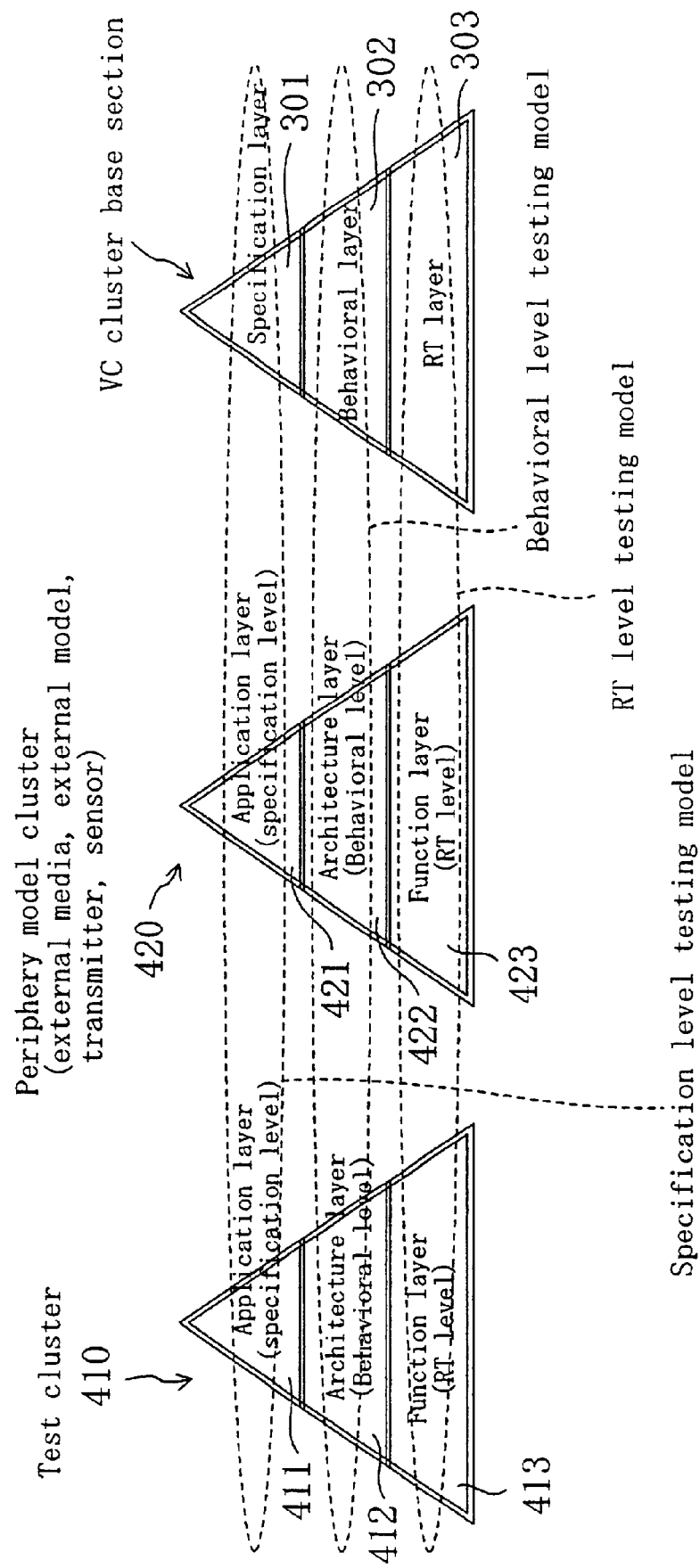
FIG. 16 is a view illustrating a flow (test scenario) of a test using a shared test cluster and a peripheral model cluster in a system testing database in the embodiment of the present invention.

FIG. 16 is a view illustrating the flow (scenario) of tests performed using the shared test cluster 410 and the peripheral model cluster 420 in the system testing database. Referring to FIG. 16, the shared test cluster 410 includes an application layer 411 (specification level), an architecture layer 412. (behavioral level), and a function layer 413 (RT level) in a hierarchical arrangement. The peripheral model cluster 420 includes an application layer 421 (specification level), an architecture layer 422 (behavioral level), and a function layer 423 (RT level) in a hierarchical arrangement. The system testing database 402 also includes specification-level system testing models, behavioral-level system testing models, and RT-level system testing models for effecting simulations between the shared test cluster 410 and the peripheral model cluster 420 in the respective levels corresponding to the VCs 301, 302, and 303 in the VC cluster body section.

Fault Test Strategy Optimization Section

Figure 17:
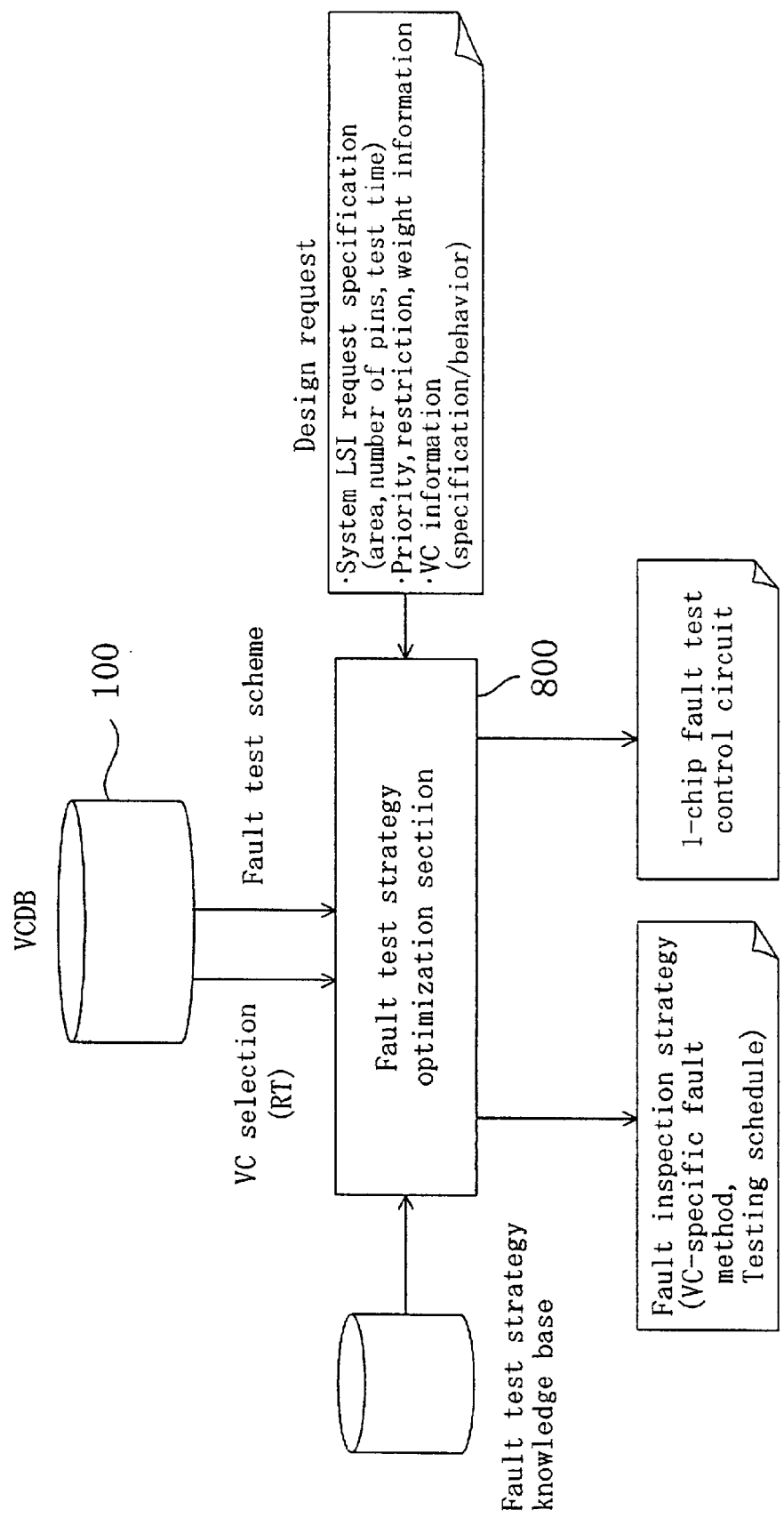
FIG. 17 is a block diagram illustrating a method for optimizing the fault test strategy in the embodiment of the present invention.

FIG. 17 is a block diagram illustrating a method for optimizing the fault test strategy by the fault test strategy optimization section 800. As shown in FIG. 17, upon receipt of a design request, the fault test strategy optimization section 800 selects a VC in the RT layer (RT-VC) and a fault test method from the VCDB 100. The design request includes specifications required for the system LSI (area, number of pins, test time, information on priority, restriction, and weighting, etc.) and VC information among others. The fault test strategy optimization section 800 executes optimization behavior in consideration of various parameters with reference to fault test strategy knowledge, to generate an optimum fault test strategy and a one-chip fault test control circuit.

The VCDB 100 includes a plurality of VC clusters that have the same function but require different test schemes. Also, the VCDB 100 includes in one VC cluster a plurality of test schemes that have the same function but are different in test pattern. Information relating to the test cost of the plurality of test schemes is also stored in the VCDB 100. This information includes, for example, the number of pins used by the IC device, the test pattern length, the area of the IC device, the fault detection rate, the test time, the man-hour for design, and the yield of the IC device. Information relating to the test restriction is also stored in the VCDB 100. This information includes, for example, the state of pins, restriction on being dynamic or static, and division of the test pattern.

Measures for minimizing the test cost will be described. Assume that the test cost is evaluated by three parameters, i.e., the area, the test time, and the design man-hour. Then, the total test cost Ctotl is expressed as the sum of the area cost Csize, the test time cost Ctime, and the man-hour cost Cproc, that is, $$Ctotl = Csize + Ctime + Cproc.$$

In consideration of the prohibitions and the trade-off relationship as described above, weights , , may be added to the area cost, the test time cost, and the man-hour cost, respectively, depending on the degree of importance placed by the user, so that restriction-considering cost evaluation is realized. As a result, the evaluation function for minimizing the test cost is represented by the following equation.

$$Ctotl=Csize+Ctime+Cproc$$

Thus, a test scheme for minimizing the test cost can be selected based on the above equation. It would be understood that parameters other than the above three may also be used for the construction of the evaluation function.

By providing the fault test optimization section 800, it becomes possible to minimize the test cost under restricted conditions such as that a prohibited combination of test types are selected and that test types in the trade-off relationship are selected.

VC Synthesis Interface Model

The VC interface models are simulation models for effecting VC-base system LSI simulation in a combination of VC models in different layers (for example, the specification layer and the RT layer) in the VC cluster.

In general, simulation is performed in a top-down manner starting from a higher degree of abstraction, i.e., in the order of the specification layer, the behavioral layer, and the RT layer. However, depending on how to proceed on the design, simulation of the entire circuit may be desired under the condition where, while RT-VCs to be used have already been determined for some VCs, only specification VCs have been determined for other VCs. If only simulation for VCs in the same layer is permitted, simulation cannot be easily performed for the system LSI in the case where VCs in the RT layer is partly incorporated at the stage of designing VCs in the specification and behavioral layers, and in the case where VCs in the specification layer is partially incorporated at the stage of designing VCs in the RT layer. This prevents improvement in design efficiency.

In addition, in the case where the requested degree of precision in simulation varies with the VCs, the simulation had better be performed at a level with a higher degree of abstraction, to realize higher speed simulation.

According to the present invention, by using an architecture-layer VC interface, for example, it is possible to combine models in different levels, such that the RT level is used for VC-A, B, C, the behavioral level is used for VC-X, and the specification level is used for VC-Y, for executing simulation. The VC interface model is a coupling model used to combine models in different levels for simulation. That is, the VC interface model is a model serving like a state transition diagram in the context of microcomputer control, when viewed from the application layer and the architecture layer.

Figure 53:
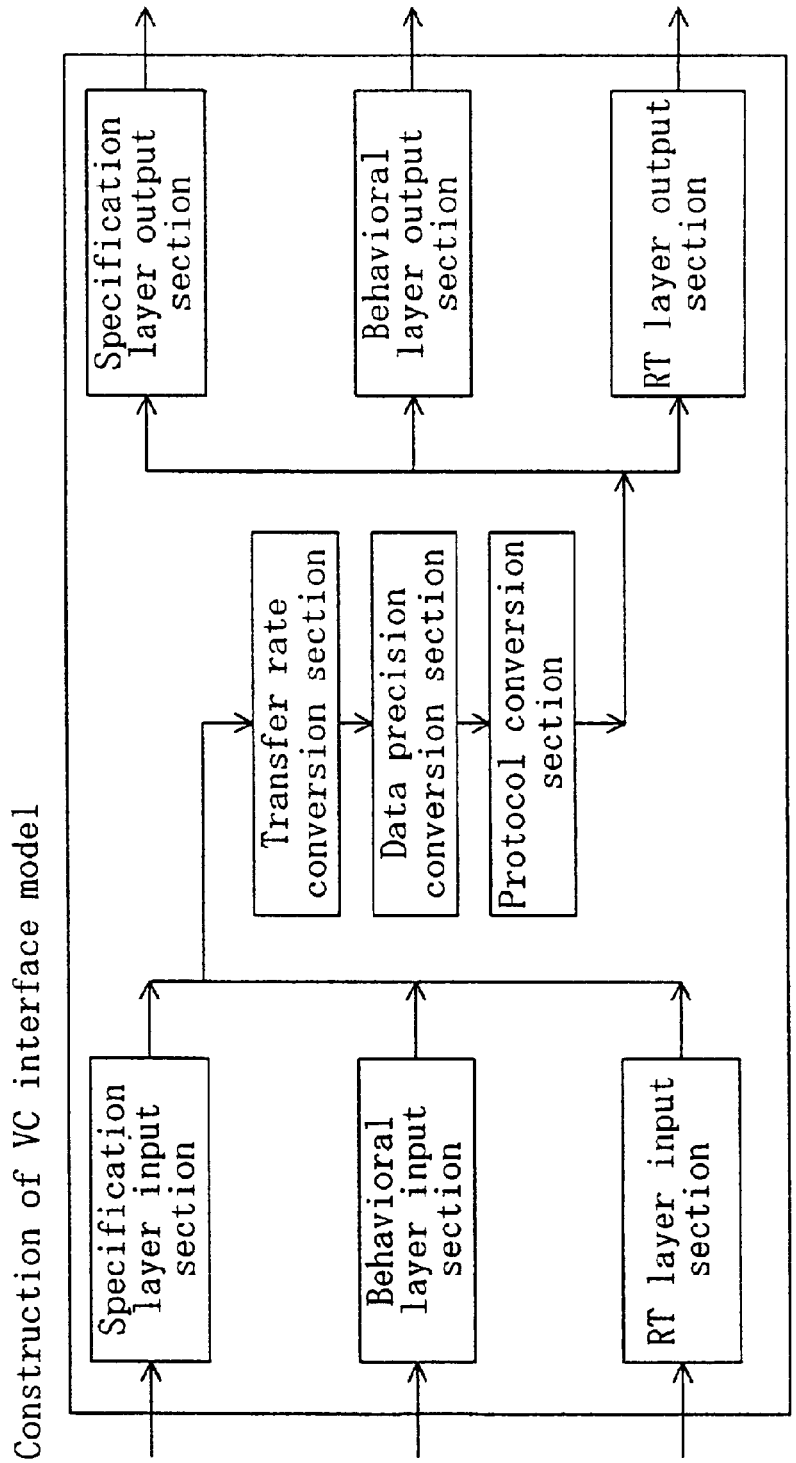
FIG. 53 is a block diagram of the construction of a VC interface model in the embodiment of the present invention.

FIG. 53 is a block diagram illustrating a construction of the VC interface model. As shown in FIG. 53, the VC interface model includes: a specification layer input section, an behavioral layer input section, and a RT layer input section for receiving data in the specification layer, the behavioral layer, and the RT layer, respectively, in the VC cluster; a transfer rate conversion section for converting the transfer rate of the input data in correspondence with the data transfer rate at the destination; a data precision conversion section for converting the precision of the data in correspondence with the data precision at the destination; a protocol conversion section for converting the protocol of the data in correspondence with the data protocol at the destination; and a specification layer output section, an behavioral layer output section, and a RT layer output section for outputting the data converted by the respective conversion sections to the specification layer, the behavioral layer, and the RT layer, respectively, in the VC cluster. For example, the I/O for the specification layer is handled in the form of a data file using real numbers, the I/O for the behavioral layer is handled in the form of synchronous transfer using integers, and the I/O for the RT layer is handled in the form of synchronous transfer using a finite bit allay, synchronous signal, and enable signal control.

Figure 54:
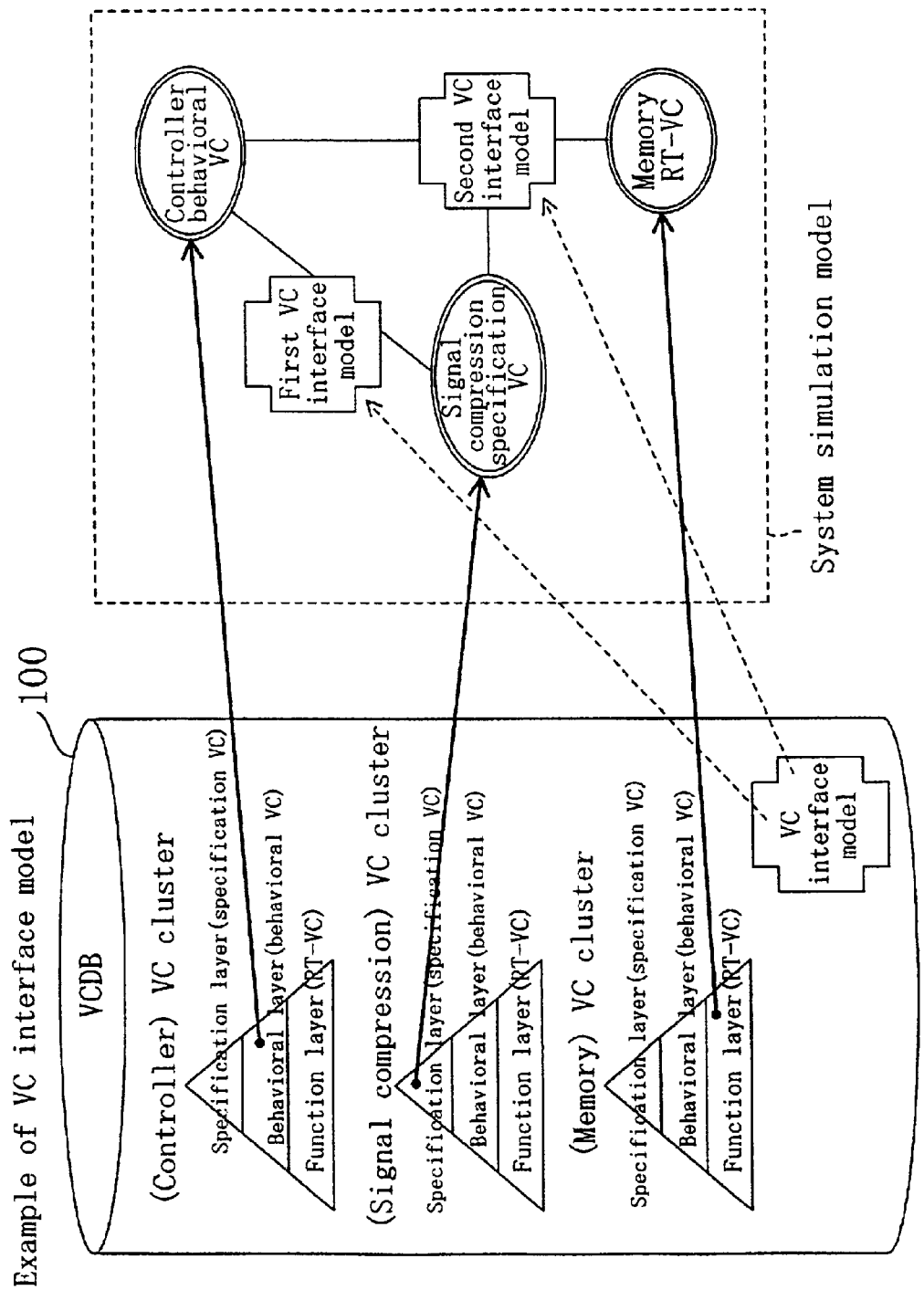
FIG. 54 is a block diagram illustrating an example of a system simulation model generated using the VCDB with the VC interface model stored therein in the embodiment of the present invention.

FIG. 54 is a block diagram illustrating an example of the system simulation model generated (by the function testing assist section 500, for example) when the system is simulated using the VCDB 100 including VC interface models. Referring to FIG. 54, the VCDB 100 includes VC interface models and the VC clusters such as a controller VC cluster, a signal compression VC cluster, and a memory VC cluster. The function testing assist section 500 generates as a system simulation model the following components, for example: a controller behavioral VC using an behavioral VC in the controller VC cluster in the VCDB 100; a signal compression specification VC using a specification VC in the signal compression VC cluster in the VCDB 100; and a memory RT-VC using a RT-VC in the memory VC cluster in the VCDB 100. The function testing assist section 500 also generates: a first VC interface model using an interface VC model in the VCDB 100 for coupling the two VCs in different layers generated in the system simulation model, i.e., the controller behavioral VC and the signal compression specification VC; and a second VC interface model for coupling the three VCs in different layers generated in the system simulation model, i.e., the controller behavioral VC, the signal compression specification VC, and the memory RT-VC.

Figure 55:
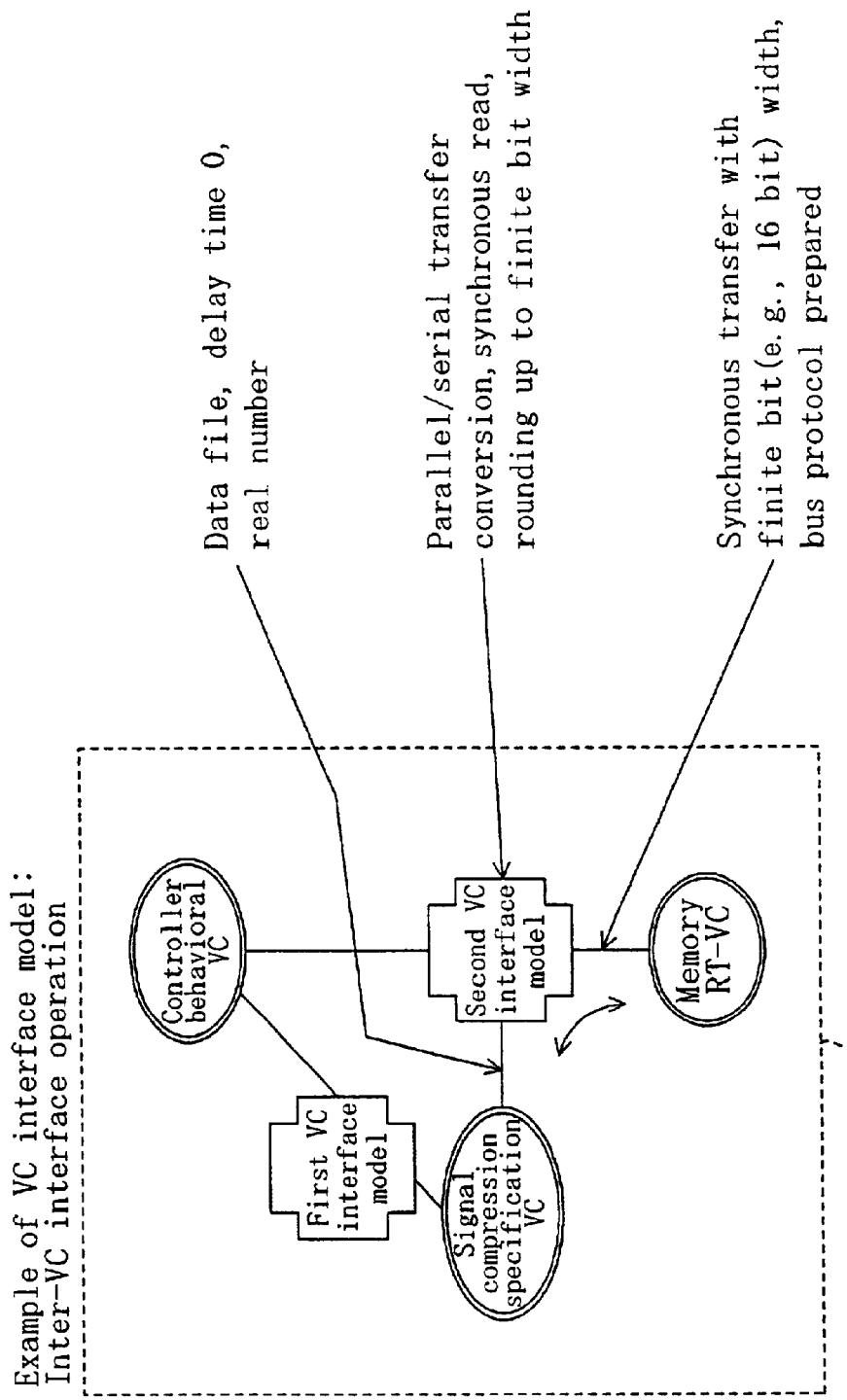
FIG. 55 is a block diagram illustrating the role of a second VC interface model in the system simulation model.

FIG. 55 is a block diagram illustrating the role of the second VC interface model in the system simulation model. As described above, the I/O for the specification layer is handled in the form of a data file using real numbers, the I/O for the behavioral layer is handled in the form of synchronous transfer using integers, and the I/O for the RT layer is handled in the form of synchronous transfer using a finite bit allay, synchronous signal, and enable signal control. In order to couple the signal compression specification VC and the memory RT-VC, for example, the second VC interface model is provided with functions such as parallel/serial transfer conversion, synchronous reading, and rounding up to a finite bit width. The second VC interface model provided with these functions actually performs data transmit/receive behavior with the signal compression specification VC in the form of a data file with a delay time of 0 using real numbers, while performing data transmit/receive behavior with the memory RT-CT in the form of synchronous transfer with a finite bit width (e.g., 16 bit width) with a bus protocol.

With the above VC interface models, it becomes possible to construct a simulation model with VC models in different layers easily and flexibly in the top-down design of a system LSI.

[Means for Function Testing and Generated Models]

Hereinbelow, the management schemes carried out by the respective sections included in the VCDBMS 200 shown in FIG. 1, as well as the resultantly generated testing models, will be described. The generated models are in principle included anywhere in the VCDB 100 shown in FIG. 1 although they are not necessarily included therein.

(Function Testing Assist Section)

Outline of Construction

Figure 18:
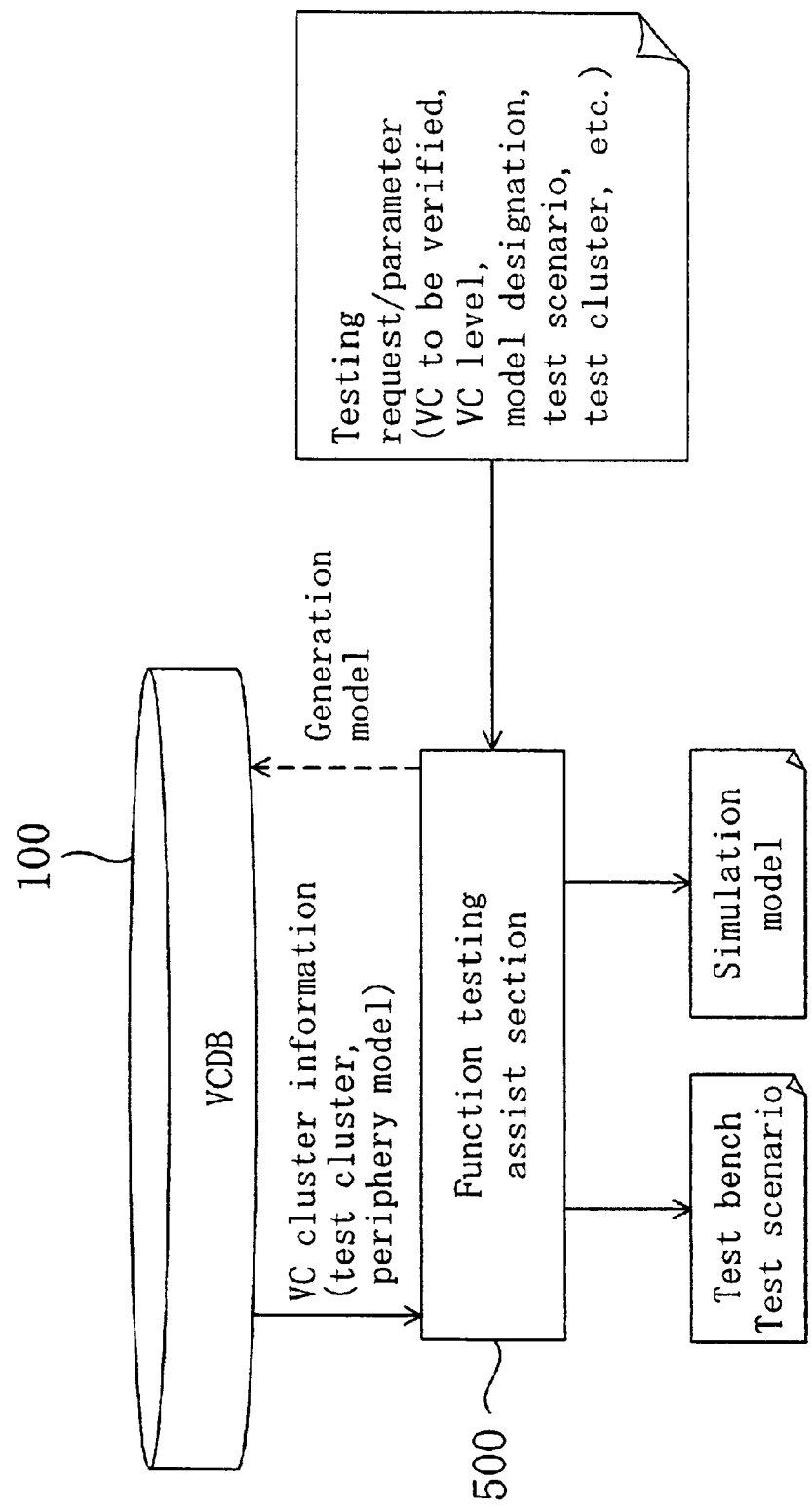
FIG. 18 is a block diagram illustrating the behavior of a function testing assist section in the embodiment of the present invention.

FIG. 18 is a block diagram illustrating the behavior of the function testing assist section 500. First, a testing request (parameters) for desired testing (simulation) is input into the function testing assist section 500. That is, as the testing request, parameters are input, including VCs to be verified, the level of the VCs, the model to be used among the synchronization model, the description optimization model, the behavior checker incorporation model, and the like (model designation), the test scenario to be used, and the test bench to be prepared. On receipt of the request, the function testing assist section 500 retrieves information on the VC cluster corresponding to the testing request, information on the shared test cluster and the peripheral model cluster, and the like from the VCDB 100, to generate a test bench, a test scenario, and a task for simulation and a simulation model (e.g., a purpose-specific function testing model and a system testing model). The generated model can be stored in the VCDB 100.

Figure 19:
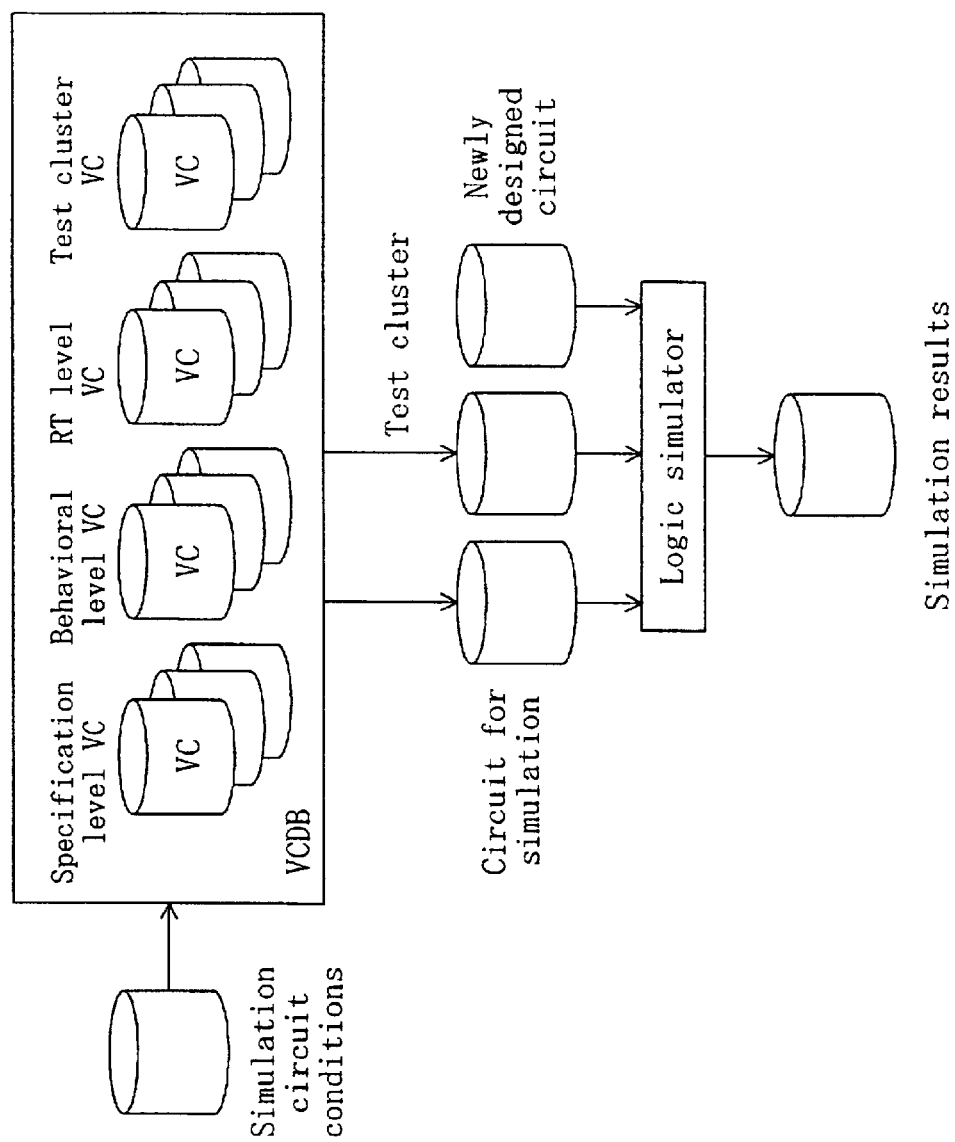
FIG. 19 is a schematic view illustrating a general simulation procedure using VCs in the specification, behavior, and function layers in the embodiment of the present invention.

FIG. 19 schematically illustrates a general simulation procedure using VCs in the specification, behavior, and RT levels. When simulation circuit conditions are input into the VCDB 100, a logic simulator executes simulation using pre-designed circuits for simulation and a newly-designed circuit if required, and outputs simulation results.

EXAMPLE OF GENERATION OF SYNCHRONIZATION MODEL

Figure 20:
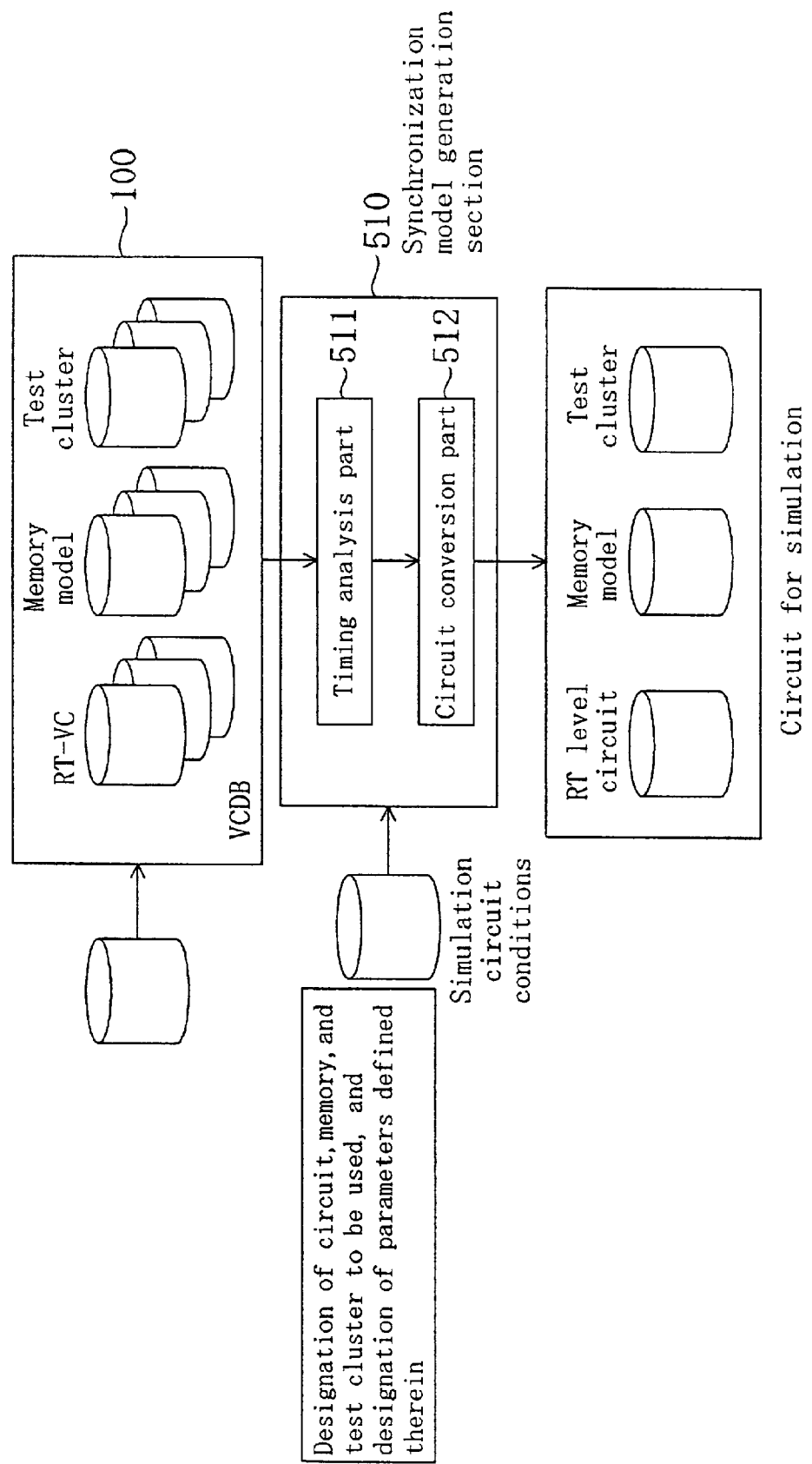
FIG. 20 is a view illustrating a model generation method employed by a synchronization model generation section in the function testing assist section in the embodiment of the present invention.

FIG. 20 is a view illustrating a model generation method employed by a synchronization model generation section 510 as part of the function testing assist section 500. The synchronization model generation section 510 generates a synchronization model in response to the input of simulation circuit conditions relating to designation of the circuit, memory, and test cluster to be used, designation of parameters defined therein, and the like, with reference to descriptions in simulation models for the RT-VC, the memory model, the test cluster (function layer), and the like. The synchronization model generation section 510 includes a timing analysis part 511 and a circuit change part 512, which generate a synchronization model in the procedure described below to generate a circuit for simulation including a RT level circuit, a memory model, and a test cluster (function layer).

Figure 21:
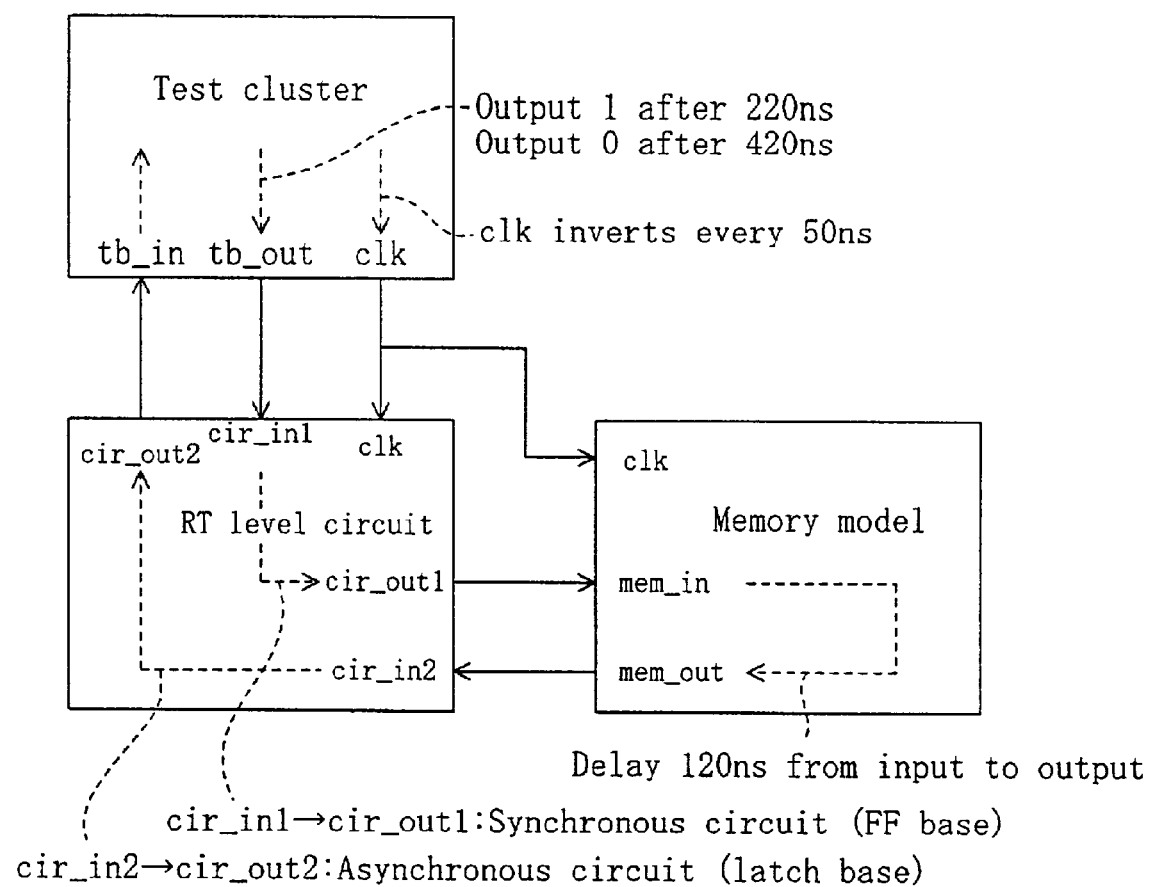
FIG. 21 is a block diagram illustrating descriptions in a simulation model for the shared test cluster, a RT level circuit, and a memory model in the VCDB in the embodiment of the present invention.

FIG. 21 is a block diagram illustrating descriptions in simulation models for a test cluster, a RT level circuit, and a memory model in the VCDB 100. Assume that a signal tb-out output from the test cluster to the RT level circuit is turned to "1" in the lapse of 220 ns and to "0" in the lapse of 420 ns. Also assume that a clock clk that is inverted every 50 ns is output from the test cluster to the RT level circuit. The RT level circuit receives the signal tb-out as an input signal cir-in1 and outputs a memory request signal cir-out1 to the memory model via a synchronous circuit basically composed of a flipflop. Assume that the memory model has a delay time of 120 ns from receipt of the memory request signal as an input signal mem-in until output of a memory output signal mem-out. The RT level circuit receives the signal mem-out as an input signal cir-in2 and outputs a signal cir-out2 via an asynchronous circuit basically composed of a latch. The test cluster receives the signal cir-out2 as an input signal tb-in.

Figure 22A:
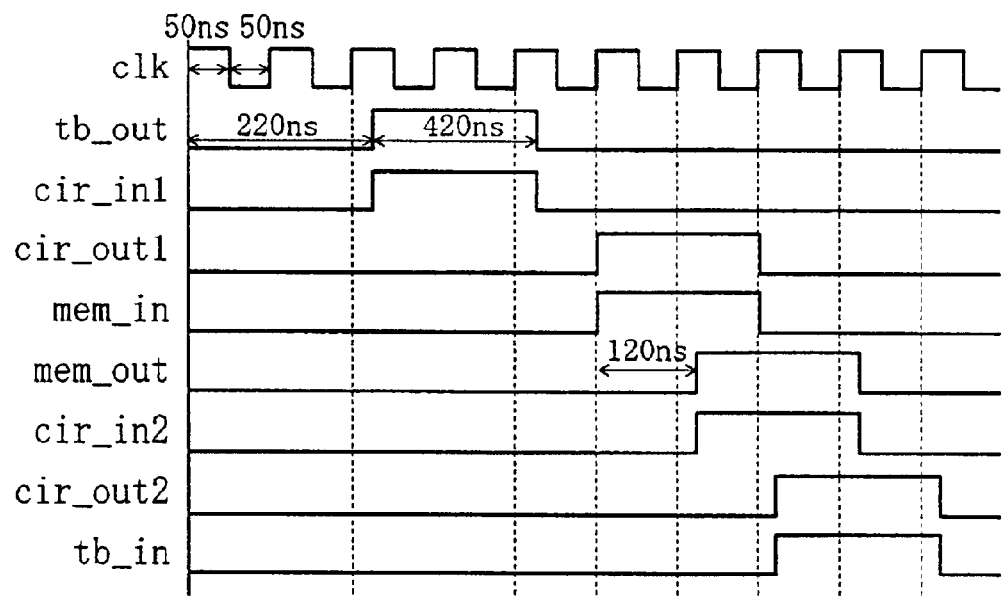
FIGS. 22(a) and 22(b) are timing charts of simulation models (in the function layer) before and after being synchronized by the synchronization model generation section, respectively.
Figure 22B:
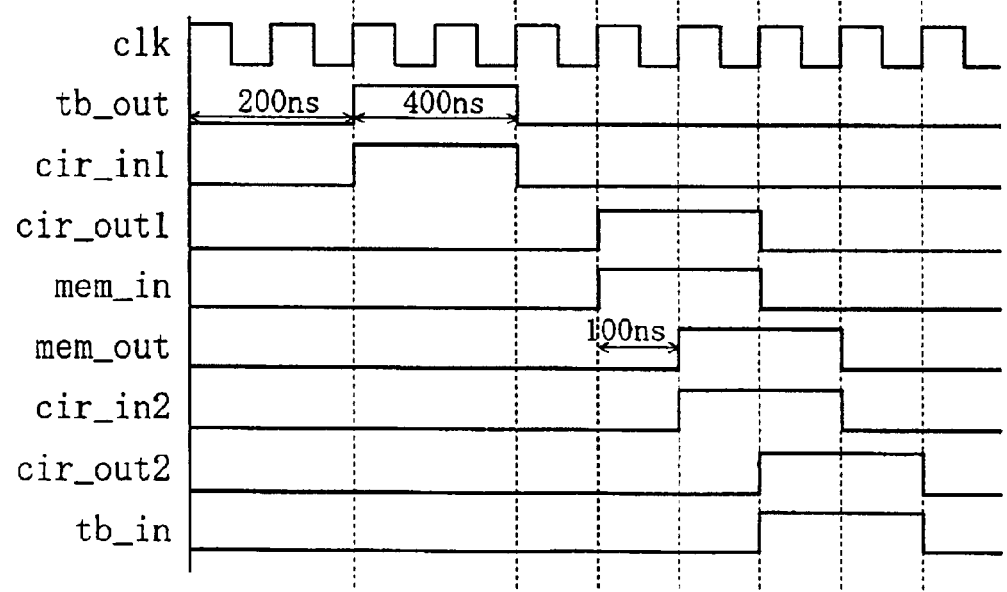

FIGS. 22(*a*) and 22(*b*) are timing charts of the simulation models (function level) before and after being synchronized by the synchronization model generation section 510, respectively. For example, the rise and fall timings, 220 ns and 420 ns, of the signal tb-out in the original simulation model are changed to 200 ns and 400 ns, respectively, that are multiples of the half cycle of the clock, 50 ns. Also, the delay time, 120 ns, of the memory model in the original simulation model is changed to 100 ns that is a multiple of 50 ns. It would be appreciated that a minute displacement of edges of the clock is allowed.

In general, a circuit to be designed operates under complicate timing control. In the conventional simulation method, a simulation model is prepared according to the timing in the real behavior. In the case of simulation for to function testing, however, no inconvenience is likely to arise actually when the timing of the half cycle of the clock is used for operation ignoring a minute delay time and the like, unlike the actual behavior. This serves to enhance the speed of the simulation.

In the above example, the timing of the simulation was synchronized with the multiple of the half cycle of the clock. It may also be synchronized with a multiple of another cycle synchronizing with the clock, such as the quarter cycle of the clock.

Example 1 of Generation of Description Optimization Model

FIG. 23 is a view illustrating a model generation method employed by a description optimization model generation section 520A as part of the function testing assist section 500. The description optimization model generation section 520A generates a description optimization model in response to the input of simulation circuit conditions relating to designation of the circuit and test cluster to be used, and the like, with reference to descriptions in simulation models on the RT-VC, the shared test cluster, and the like. The description optimization model generation section 520A includes a circuit retrieval part 521 and a circuit change part 522, which generate a description optimization model in the procedure described below to generate a circuit for simulation including a RT level circuit and a test cluster.

FIG. 24 illustrates an example of the operation by the description optimization model generation section 520A. First, the circuit retrieval part 521 retrieves from the VCDB 100 a description of a circuit VC and a description of a test cluster VC on the setting of the value of a conditional signal line. Assume that the description of the circuit VC includes the condition that if flg1 is "1" execute operation 1*a* otherwise execute operation 1*b*, and that it is found from the description of the test cluster VC that flg1 varies but flg2 does not vary (#0, #100 in the test cluster VC description represent time). It is found from these descriptions that since flg2 is kept "0", operation 2*a* is never executed in this simulation but operation 2*b* is invariably executed. Finding this fact, the circuit change part 522 deletes the operation 2*a* and the conditional sentence in the control description 2, to generate a modified simulation model. As a result, in the control description 2 in the circuit VC description for simulation, it is read that operation 2*b* be executed irrespective of whether or not flg2 is "0". By this change in description, however, the correspondence with the original circuit description may be lost. A reference is therefore additionally prepared as information for retrieving the correspondence with the original description. That is, for example, although the value of flg2 is not mentioned in the modified circuit description, it can be recognized to be invariably "0" by referring to this reference.

By modifying the circuit description as described above, the time that may otherwise be wasted by the operation unnecessary for simulation can be saved, whereby the circuit description for simulation is optimized.

Example 2 of Generation of Description Optimization Model

Figure 25:
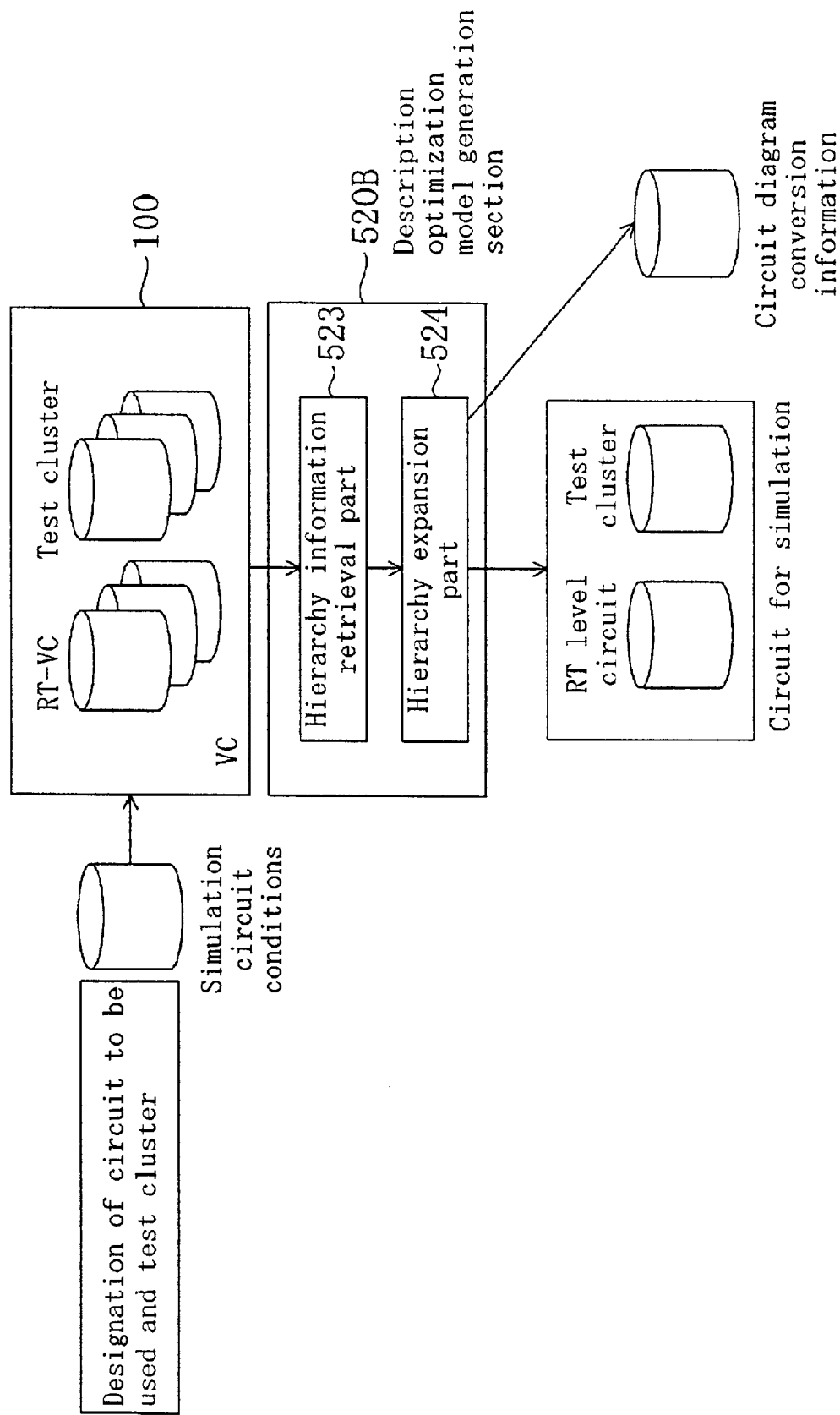
FIG. 25 is a view illustrating a model generation method employed by a description optimization model generation section in the function testing assist section in the embodiment of the present invention.

FIG. 25 is a view illustrating a model generation method employed by a description optimization model generation section 520B as part of the function testing assist section 500. The description optimization model generation section 520B generates a description optimization model in response to the input of the simulation circuit conditions relating to designation of the circuit and test cluster to be used, with reference to descriptions in simulation models on the RT-VC, the test cluster, and the like. The description optimization model generation section 520B includes a hierarchy information retrieval part 523 and a hierarchy expansion part 524, which generate a description optimization model in the procedure described below to generate a circuit for simulation including a RT level circuit and a test cluster as well as circuit diagram conversion information.

Figure 26:
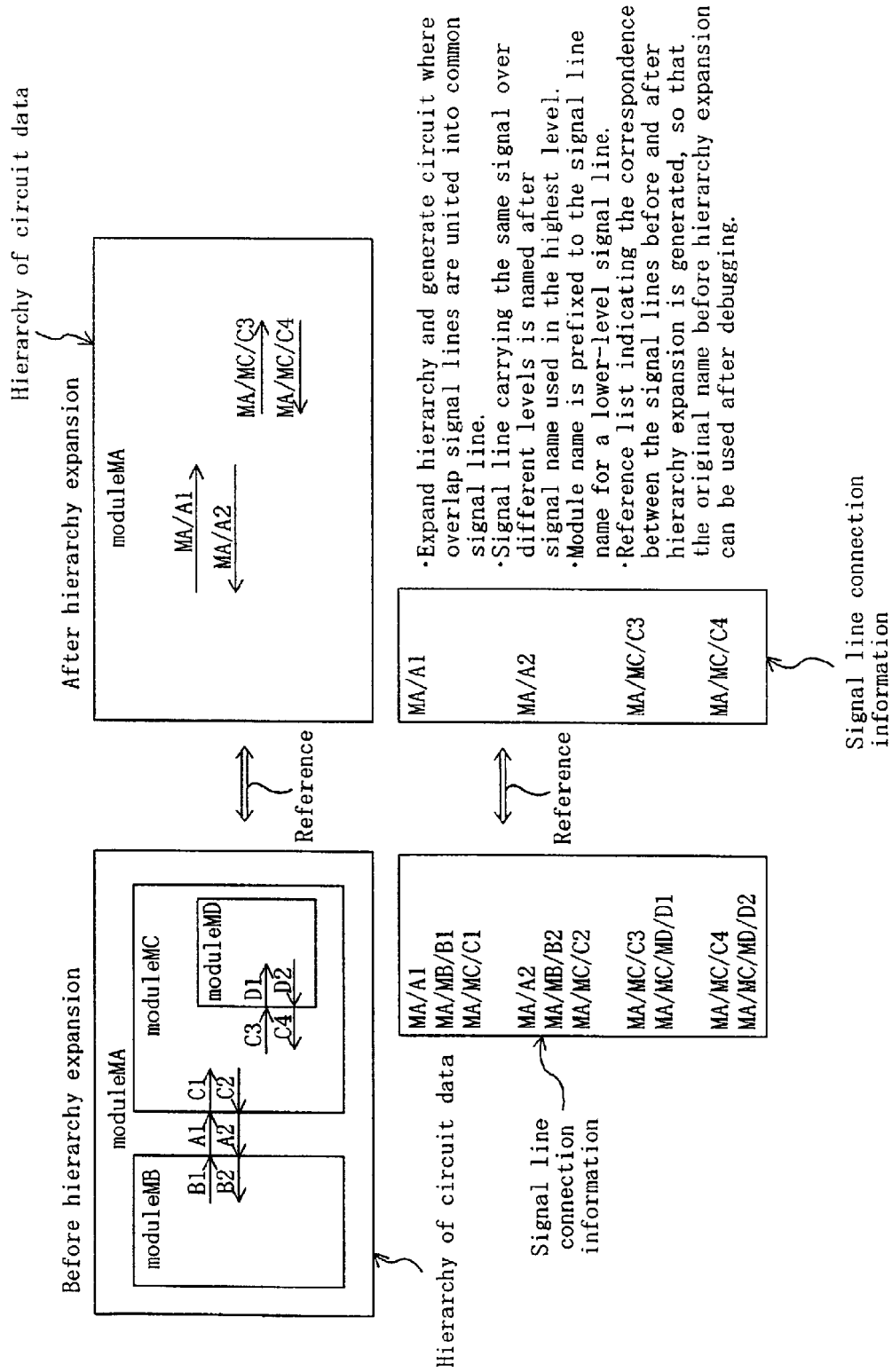
FIG. 26 illustrates an example of operation used when generating a circuit for simulation and information on circuit diagram conversion in the embodiment of the present invention.

FIG. 26 illustrates an example of the operation by the description optimization model generation section 520B. Assume that a module MA exists in the highest level, modules MB and MC in the lower level, and a module MD in the lowest level in the hierarchical order. The hierarchy information retrieval part 523 retrieves the hierarchy of circuit data and signal line connection information before hierarchy expansion. As a result, the following are recognized. A signal supplied from an element in the module MB to an element in the module MC includes signal operation B1 in the module MB, signal operation A1 in the module MA, and signal operation C1 in the module MC. A signal supplied from an element in the module MC to an element in the module MB includes signal operation C2 in the module MC, signal operation A2 in the module MA, and signal operation B2 in the module MB. A signal supplied from an element in the module MC to an element in the module MD includes signal operation C3 in the module MC and signal operation D1 in the module MD. A signal supplied from an element in the module MD to an element in the module MC includes signal operation D2 in the module MD and signal operation C4 in the module MC. The signal line connection information includes descriptions corresponding to the above data.

The signals B1, A1, and C1 actually refer to one signal flowing on one signal line. These different names for the respective modules are used to facilitate the design. During simulation, this distinction of names is unnecessary. The hierarchy expansion part 524 therefore generates a circuit where overlap signal lines are united into a common signal line by expanding the hierarchy. The signal line carrying the same signal over different levels is named after the signal name used in the highest level. As a result, the original ten names of signals can be reduced to four in the simulation model after the hierarchy expansion. This increases the simulation speed.

The module name may be prefixed to the signal line name for a lower-level signal line. A reference list indicating the correspondence between the signal lines before and after the hierarchy expansion may be prepared, so that the original signal names before the hierarchy expansion can be used after debugging.

Example 3 of Generation of Description Optimization Model

Figure 27:
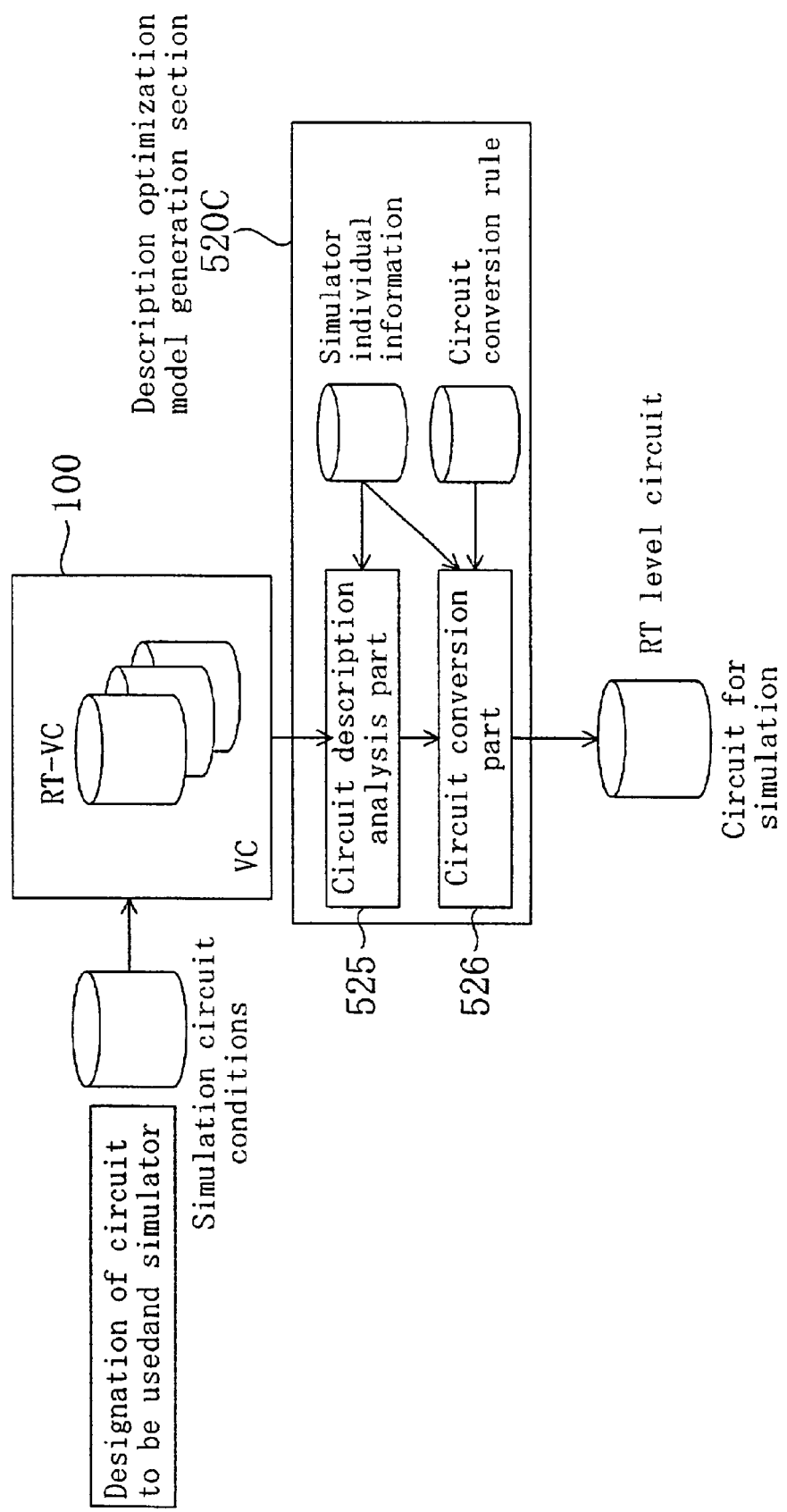
FIG. 27 is a view illustrating a model generation method employed by another description optimization model generation section in the function testing assist section in the embodiment of the present invention.

FIG. 27 is a view illustrating a model generation method employed by a description optimization model generation section 520C as part of the function testing assist section 500. The description optimization model generation section 520C generates a description optimization model in response to the input of simulation circuit conditions relating to designation of the circuit and simulator to be used, with reference to a description in a simulation model on the RT-VC in the VCDB 100. The description optimization model generation section 520C includes a circuit description analysis part 525, a circuit conversion part 526, simulator specific information, and circuit conversion rules. The circuit description analysis part 525 and the circuit conversion part 526 generate a description optimization model in the procedure described below to generate a circuit for simulation including a RT level circuit.

Figure 28:
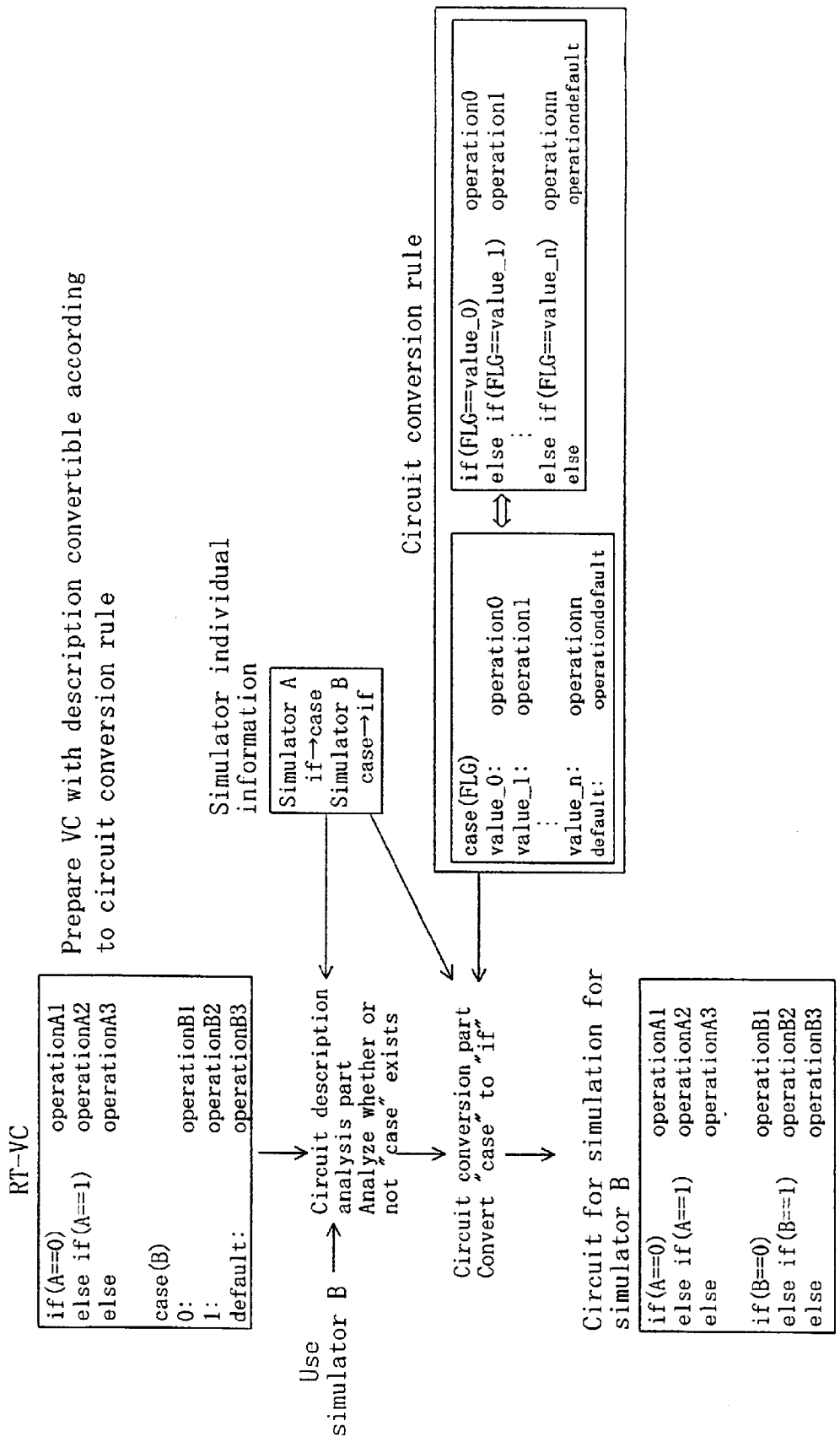
FIG. 28 illustrates an example of operation used when generating a circuit for simulation including a RT level circuit in the embodiment of the present invention.

FIG. 28 illustrates an example of the operation by the description optimization model generation section 520C. RT-VCs in the VCDB 100 have been formed to have descriptions convertible according to the circuit conversion rules. In general, unmodified RT-VC simulation models include "case" sentences and "if" sentences in a mixed manner depending on the type of operation. In some cases, simulation is faster by operation according to an "if" sentence for a certain simulator, while it is faster by operation according to a "case" sentence for another simulator.

Assume in this example that a simulator A provides faster simulation by operation according to a "case" sentence and a simulator B provides faster simulation by operation according to an "if" sentence. When the simulator B is used, therefore, the circuit description analysis part 525 analyzes and searches whether or not a "case" sentence exists in the simulation model. The circuit conversion part 526 converts the "case" sentence existing in the simulation model to an "if" sentence with reference to the simulator specific information and the circuit conversion rules to be observed at case-if conversion.

As a result, there is generated a circuit for simulation allowing for higher-speed operation when the simulator B is used.

Example 4 of Generation of Description Optimization Model

Figure 29:
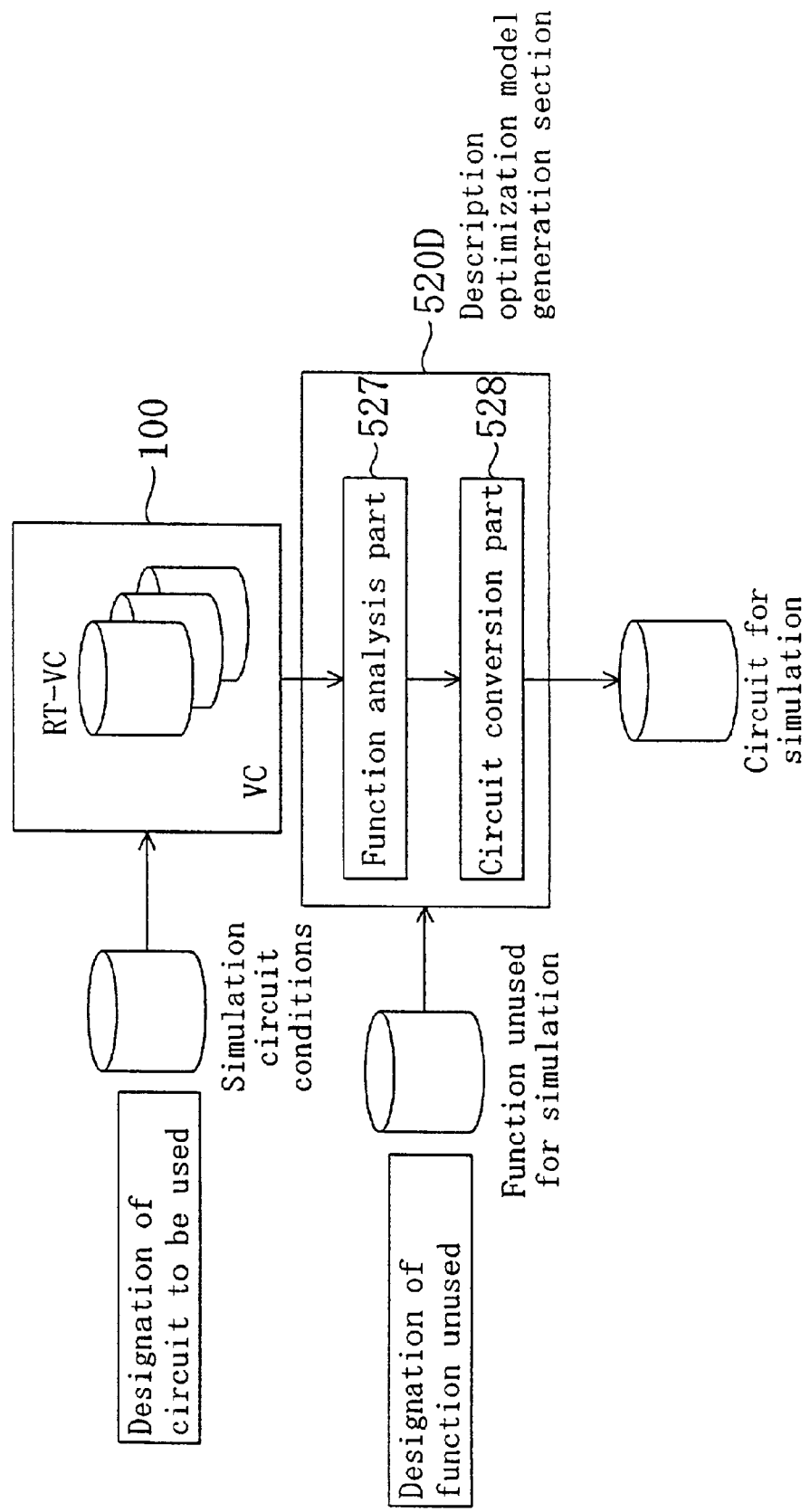
FIG. 29 is a view illustrating a model generation method employed by yet another description optimization model generation section in the function testing assist section in the embodiment of the present invention.

FIG. 29 is a view illustrating a model generation method employed by a description optimization model generation section 520D as part of the function testing assist section 500. The description optimization model generation section 520D generates a description optimization model in response to the input of simulation circuit conditions relating to designation of the circuit to be used and the input on the function unused for simulation, with reference to a description in a simulation model on the RT-VC in the VCDB 100. The description optimization model generation section 520D includes a function analysis part 527 and a circuit conversion part 528, which generate a description optimization model in the procedure described below to generate a circuit for simulation including a RT level circuit.

Figure 30:
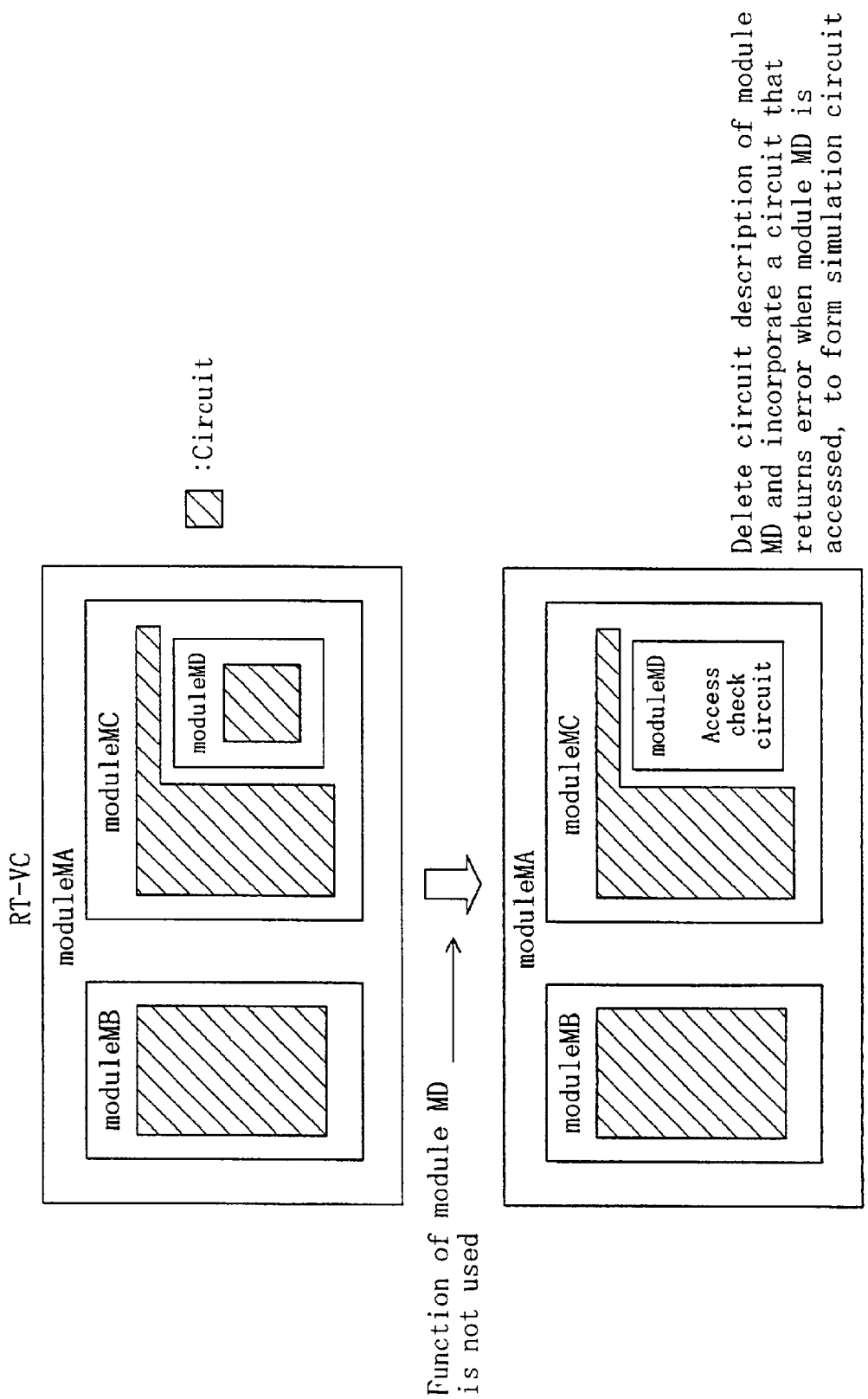
FIG. 30 illustrates an example of operation used when generating a circuit for simulation including a RT level circuit in the embodiment of the present invention.

FIG. 30 illustrates an example of the operation by the description optimization model generation section 520D. There is a region in a circuit that does not contribute to the behavior of the circuit during simulation. Assume that the function analysis part 527 has analyzed the function of the RT-VC shown in FIG. 30 and found that in the levels lower than a module MA, modules MB and MC operate influencing the output but a module MD does not operate at all. In other words, although the module MD is included in the data, it does not influence the simulation results at all. Notified of this fact, the circuit conversion part 528 deletes the circuit description on the module MD and instead incorporates a circuit that returns an error when the module MD is accessed. In other words, such a circuit for simulation that can automatically generate a simulation model detaching the module MD is generated.

As a result, during simulation using a workstation or the like, reduction in simulation speed that may otherwise be caused due to the occupation of the module MD in the memory is avoided. Simulation becomes slow by merely a change in an input signal even if the module MD does not operate. This problem can also be avoided.

Since there is a possibility that the module MD is accessed, an access check circuit is formed for checking a mistake access to the module MD. Such a circuit has a capacitance too small to affect the simulation speed.

(Check Model for Testing)

Hereinbelow, the check function will be described. The check function includes the check on whether or not each VC itself normally operates during testing and the check on whether or not each VC is correctly used in VC-incorporated testing. The behavior checker incorporation model 324 as part of the purpose-specific function testing models 320 executes this function.

Figure 31:
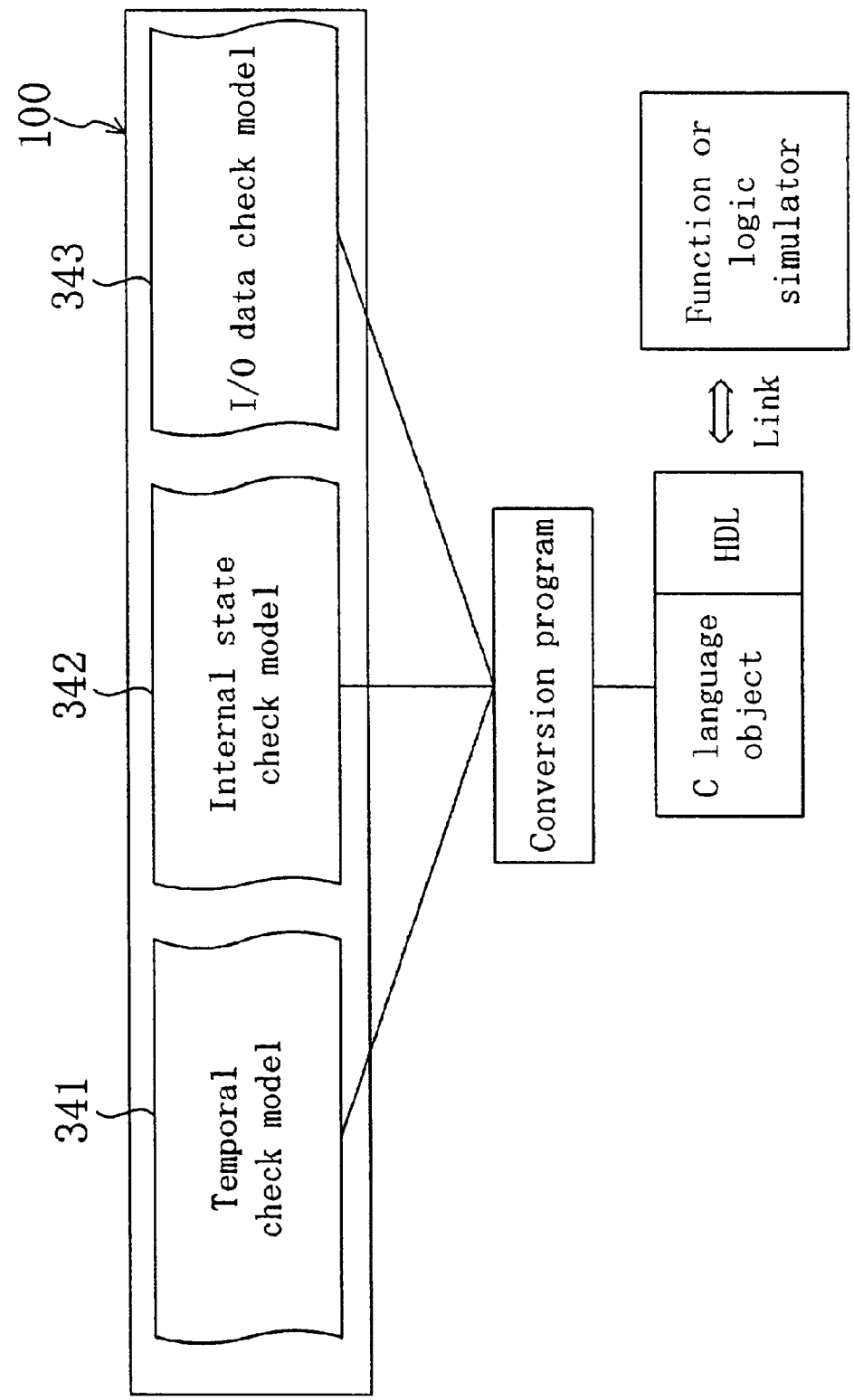
FIG. 31 is a block diagram illustrating a testing check method in the embodiment of the present invention.

FIG. 31 is a block diagram illustrating the testing check method. A model including a temporal check model 341, an internal state check model 342, and an I/O data check model 343 is included in the VCDB 100. According to a conversion program, a check mechanism is incorporated in an actual simulation model depending on the check type. While simulation is being executed according to the conversion program using a language tool and a function or logic simulator, various checks as described below are also performed.

Figure 32:
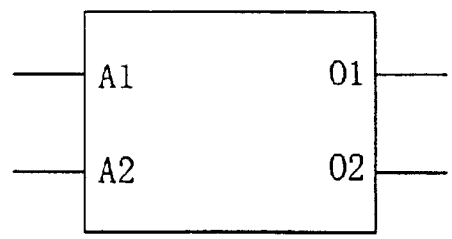
FIG. 32 is a schematic view of the construction of a circuit including I/O pins to be verified in the embodiment of the present invention.

The I/O data check model 343 includes a description for effecting a check as follows. Consider a circuit as shown in FIG. 32 where outputs 01, 02 are output in correspondence with inputs A1, A2. The I/O data check model 343 examines whether or not the restriction on the state values of I/O pins for each VC is observed. For example, the I/O data check model 343 includes a description defining to watch during simulation whether or not a combination of inputs prohibited for the VC is received, or in reverse, whether or not an output in the prohibited state is output during the simulation in the VC-utilizing design.

Figure 33:
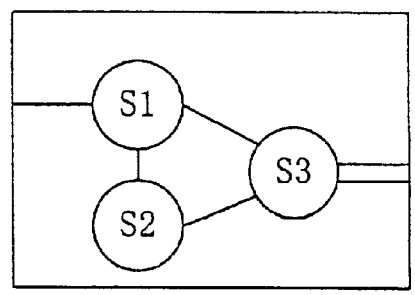
FIG. 33 is a schematic view of the construction of a circuit including an internal state to be verified in the embodiment of the present invention.

The internal state check model 342 includes a description for effecting a check as follows. Consider a circuit as shown in FIG. 33 where internal states S1, S2, and S3 exist. The internal state check model 342 includes a description defining to watch during simulation whether or not an internal state prohibited for the VC exists in a signal inside the VC or during the simulation in the design.

Figure 34A:
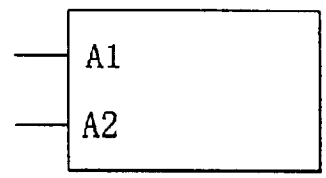
FIGS. 34(a) and 34(b) are a schematic view of the construction of a circuit to be verified and a signal timing chart, respectively, in the embodiment of the present invention.
Figure 34B:
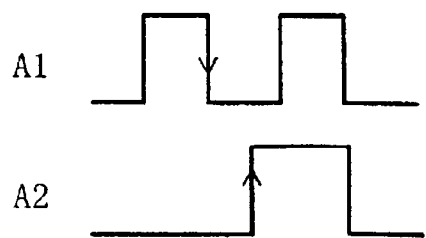

The temporal check model 341 includes a description for effecting the check on the temporal logic of I/O pins and Internal pins as follows. Consider a circuit as shown in FIG. 34(a) where input signals A1, A2 have waveforms as shown in FIG. 34(b). If there is a restriction that when the input signal A1 shifts from HIGH to LOW the input signal A2 must be HIGH before the input signal A1 becomes HIGH next, the temporal check model 341 includes a description defining to watch whether or not the restriction is observed.

In simulation using the conventional test pattern, if an abnormal state occurs in an internal deep region, such occurrence may not be reported to external pins during simulation in some cases. With the provision of the check models 341, 342, and 343 shown in FIG. 31, an abnormal phenomenon can be instantly detected at the very place and time of the occurrence of such a phenomenon. In addition, when an error occurs, which rule the error violates can be determined.

The above three check items may conventionally be described using HDL or the C language. However, describing these check items itself is considerably difficult, and moreover the amount of description becomes great. In contrast, by storing the above check models in the VCDB 100 as in this embodiment, these checks can be done with improved easiness and precision.

(Synthesis of VC Interface)

If the conventional technique is applied to the VCDS without any change, the LSI designer will not be able to use VCs in the VCDB as they are. More specifically, in the design of a circuit in combination of VCs, if such VCs have data I/O interfaces different in specification or procedure (protocol), signal transmission between these VCs is not attained by just connecting the VCs via signal lines. For example, a bus interface (I/F) placed between a VC and a bus must be modified to match with a host (e.g., CPU) used in order to use the VC in the design. This means that the number of bus I/Fs equal to the number of VCs used must be modified. This modification work may cause a human error.

The VC interface synthesis section 700 (see FIG. 1) produces an "interface circuit" that has a function of automatically matching interfaces having different procedures.

Figure 35:
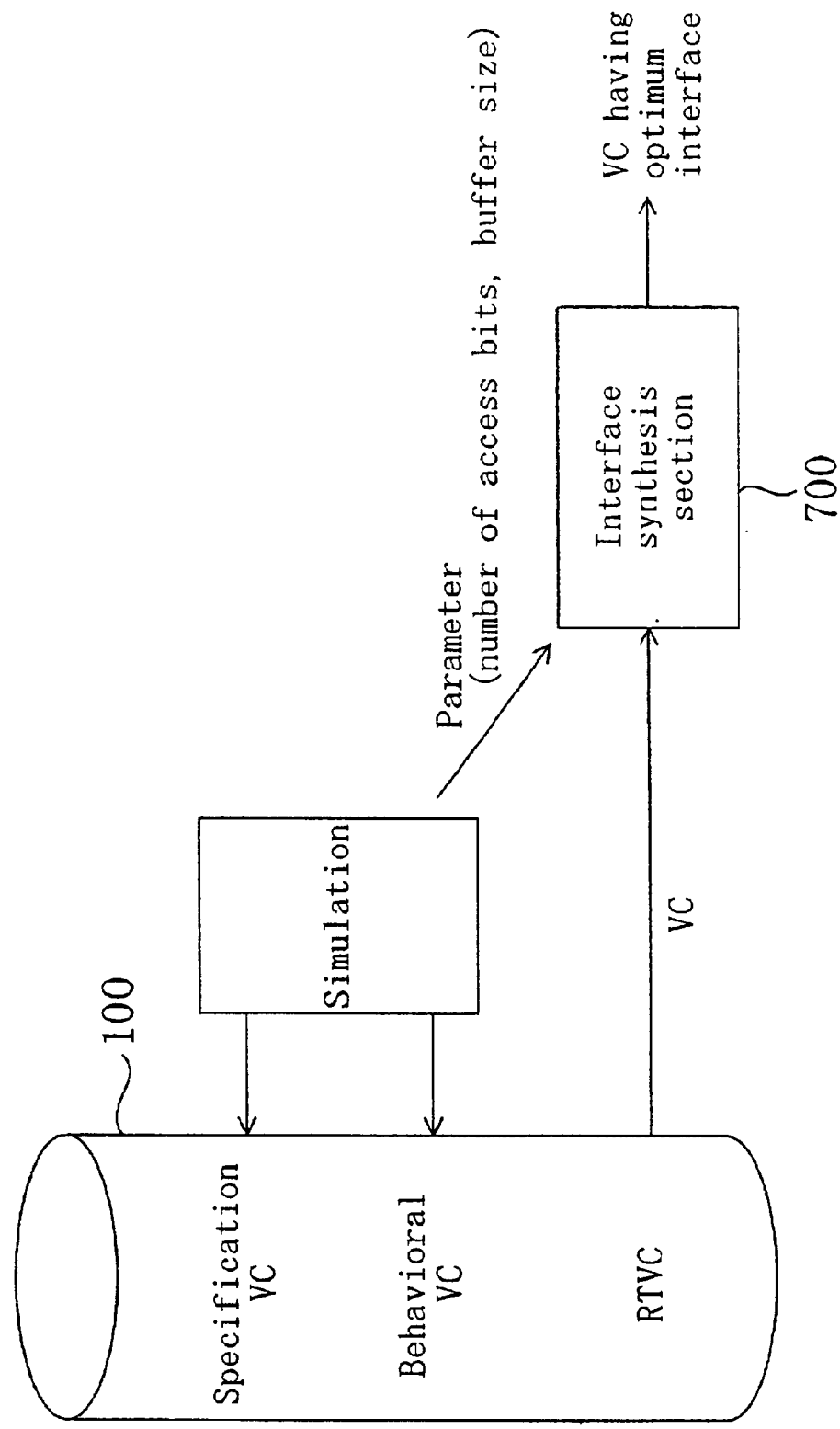
FIG. 35 is a block diagram illustrating a design method using a VC interface synthesis section in the embodiment of the present invention.

FIG. 35 is a block diagram illustrating a design method using the VC interface synthesis section 700. As a result of simulation of a circuit designed, VCs in the RT layer are selected from the VCDB 100. Also from the simulation, parameters (e.g., the number of access bits and the buffer size) of an interface are known. The VC interface synthesis section 700 selects or synthesizes proper VCs while properly matching the parameters, to determine VCs having an optimum interface.

For example, if the number of access bits is different between interfaces, signal transmission is not possible. If the buffer size is different between interfaces, signal transmittance at a constant speed is not possible. The VC interface synthesis section 700 determines proper VCs while attempting to match these parameters with each other. In this way, it becomes possible to design using VCs automatically provided with optimum interfaces.

Application to Bus I/F

Figure 36:
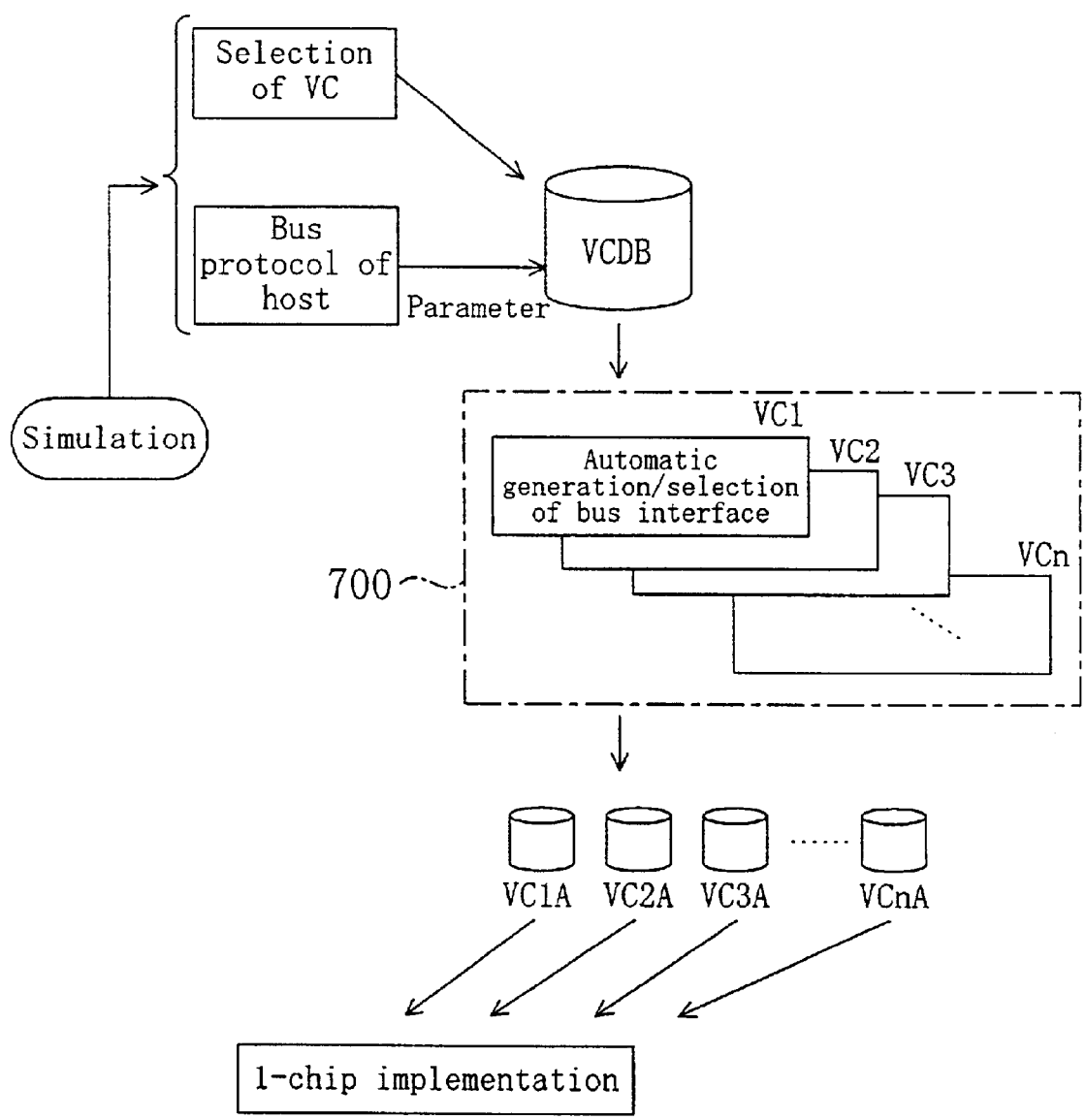
FIG. 36 is a view illustrating a flow of implementation of the interface synthesis method shown in FIG. 35 to a bus I/F as an interface between a bus and a VC.

FIG. 36 illustrates a flow of implementation of the interface synthesis method shown in FIG. 35 to a bus I/F between a bus and a VC.

First, optimum VCs (RT layer) are selected. Concretely, VCs (VC1, VC2, ... ) are selected from the VCDB 100 in conformity with the bus protocol of the host (e.g., CPU) used in the simulation. At this time, from the bus protocol of the host, parameters such as the number of access bits and the buffer size are known. On receipt of such information, the VC interface synthesis section 700 automatically determines interfaces conforming to the bus protocol of the host for the respective VC1, VC2, .... More specifically, the VC interface synthesis section 700 receives conditions such as parameters output exclusively from the simulations in the behavioral level, the specification level, and the like, and automatically defines the parameters so that the specification of the bus protocol requested by the host and the specification of the interfaces possessed by the VCs themselves match with each other, in other words, so that the interfaces are absorbed. If an appropriate VC is found among those retrieved from the VCDB 100, the VC is selected. Otherwise, an appropriate VC is generated. In this way, VC1A, VC2A, ... having matched interfaces are generated, which are then used for a one-chip implementation.

Example of Bus I/F

Figure 37:
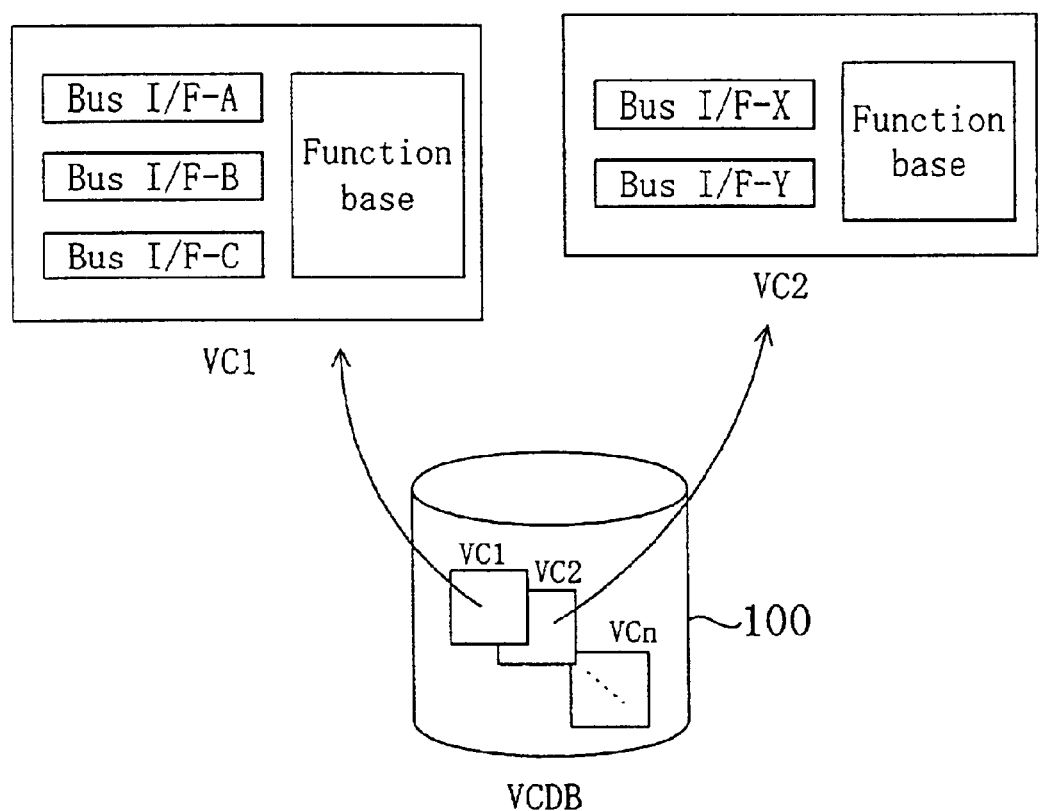
FIG. 37 is a block diagram of the structure of a VC (RT layer) including a bus I/F in the VCDB in the embodiment of the present invention.

FIG. 37 is a block diagram illustrating structures of VCs (RT layer) in the VCDB 100 in this example. As shown in FIG. 37, each VC has bus I/Fs separated from a function base, so that the function base is kept irrespective of the timing and the like in the bus I/Fs. Various bus I/Fs conforming to the bus protocol of the host used are generated. In the example shown in FIG. 37, VC1 in the VCDB 100 includes three bus I/Fs (bus I/F-A, B. C) and a function base, and VC2 includes two bus I/Fs (bus I/F-X, Y) and a function base.

FIG. 38 shows the bit width, the read/write cycle, and the maximum bus clock frequency for the respective bus I/Fs (bus I/F-A, B, C, X, Y) in the form of a table. By preparing a plurality of bus I/Fs for each VC as in this example, the parameter matching during interface synthesis can be done more swiftly.

Figure 39:
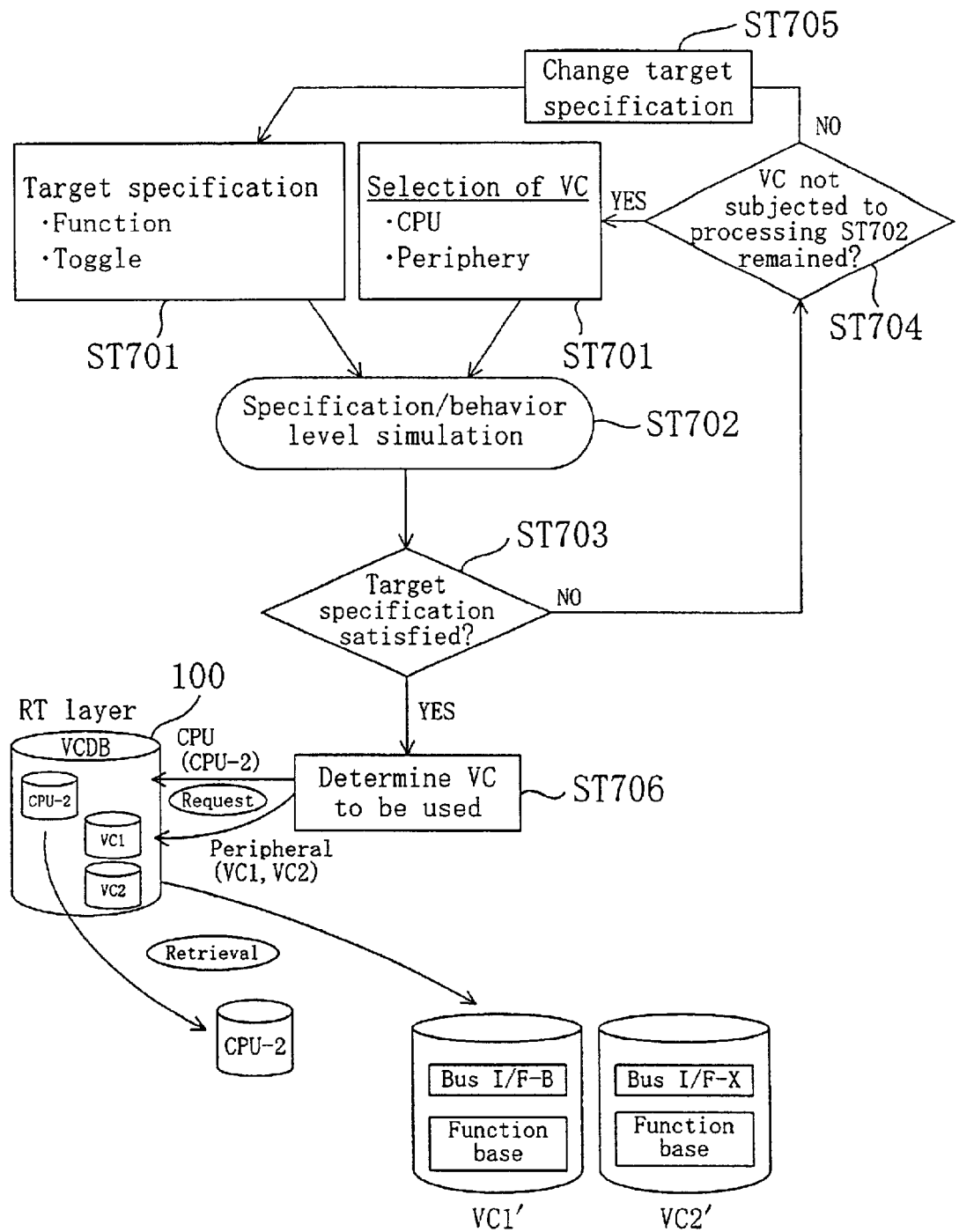
FIG. 39 is a flowchart showing an interface synthesis procedure in the embodiment of the present invention.

FIG. 39 is a flowchart showing an interface synthesis procedure. Referring to FIG. 39, the procedure for automatically generating bus I/Fs will be described.

First, at step ST701, a target specification (function, operating frequency, etc.) is determined, and VCs* for the CPU and the peripheral are selected.

At step ST702, simulation in the specification/behavior levels is executed. At step ST703, whether or not a selected VC* satisfies the target specification is determined.

If the VC* does not satisfy the target specification, the process proceeds to step ST704, where whether or not there remains a VC* that has not been subjected to the simulation at step ST702 is determined. If YES, the process returns to step ST701, and the operation at steps ST701, ST702, and ST703 is repeated until a VC* that satisfies the target specification is found. If there no more remains a VC* that has not been subjected to the simulation at step ST702 although no selected VC* has satisfied the target specification, the target specification is changed at step ST705. The process then returns to step ST701.

The above operation is repeated until a VC* satisfying the target specification is found. Once such VC* is found, the VC to be used, as well as the bus I/F to be used for the VC, are determined at step ST706.

Figures 40, 41:
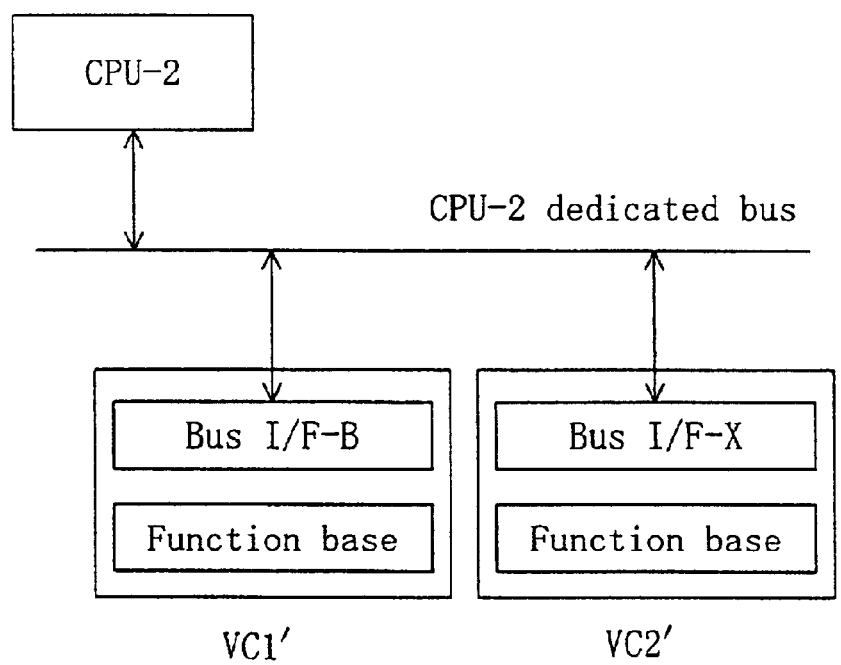
FIG. 40 shows the specifications of CPUs for interface synthesis in the form of a table in the embodiment of the present invention.
FIG. 41 is a block diagram illustrating the connection state among RT-VCs selected during the interface synthesis in the embodiment of the present invention.

Assume that CPU-2 among three CPUs (CPU-1, 2, 3) shown in FIG. 40 has been selected as a result of simulation. The bus protocol of CPU-2 prepared for the VC in the function layer (RT-VC) is as shown in FIG. 40. The bus I/F matching with the bus protocol of CPU-2 is selected from the bus I/Fs in VC1 and VC2 shown in FIG. 38. As a result, bus I/F-B for VC1 and bus I/F-X for VC2 are selected.

Referring back to FIG. 39, in the RT layer in the VCDB 100, three RT-VCs of CPU-2, VC1' including bus I/F-B and the function base, and VC2' including bus I/F-X and the function base are generated.

FIG. 41 is a block diagram illustrating the connection state between the generated RT-VCs. The two VCs, VC1' and VC2', are connected with CPU-2 via a CPU-2 dedicated bus. Since the bus parameters (the number of bits, the operating frequency, etc.) of VC1', VC2', and the host (CPU-2) are matched with one another, proper signal transmission is ensured among VC1', VC2', and CPU-2. Thus, automatic design is realized.

(Structure for System Testing)

Hereinbelow, hierarchical test clusters in the system testing model will be described. As described above, the test cluster includes a test bench, a test scenario, a task, and a model. The test bench includes a system structure and a function model for testing. The test scenario refers to a flow of testing in the system level, i.e., a system behavioral sequence. The task refers to a task for initializing a VC or executing a specific function. The model refers to a link to a simulation model, a VC model, or a peripheral simulation model to be used by the structure of the test bench.

As shown in FIG. 1, the VC cluster body section in the VCDB 100 has the hierarchical structure composed of the layers of specification VCs 301, the behavioral VCs 302, and the RT-VCs 303. Hereinbelow, hierarchical test clusters generated for system testing will be described.

Hierarchical Arrangement of Test Cluster

Figure 42:
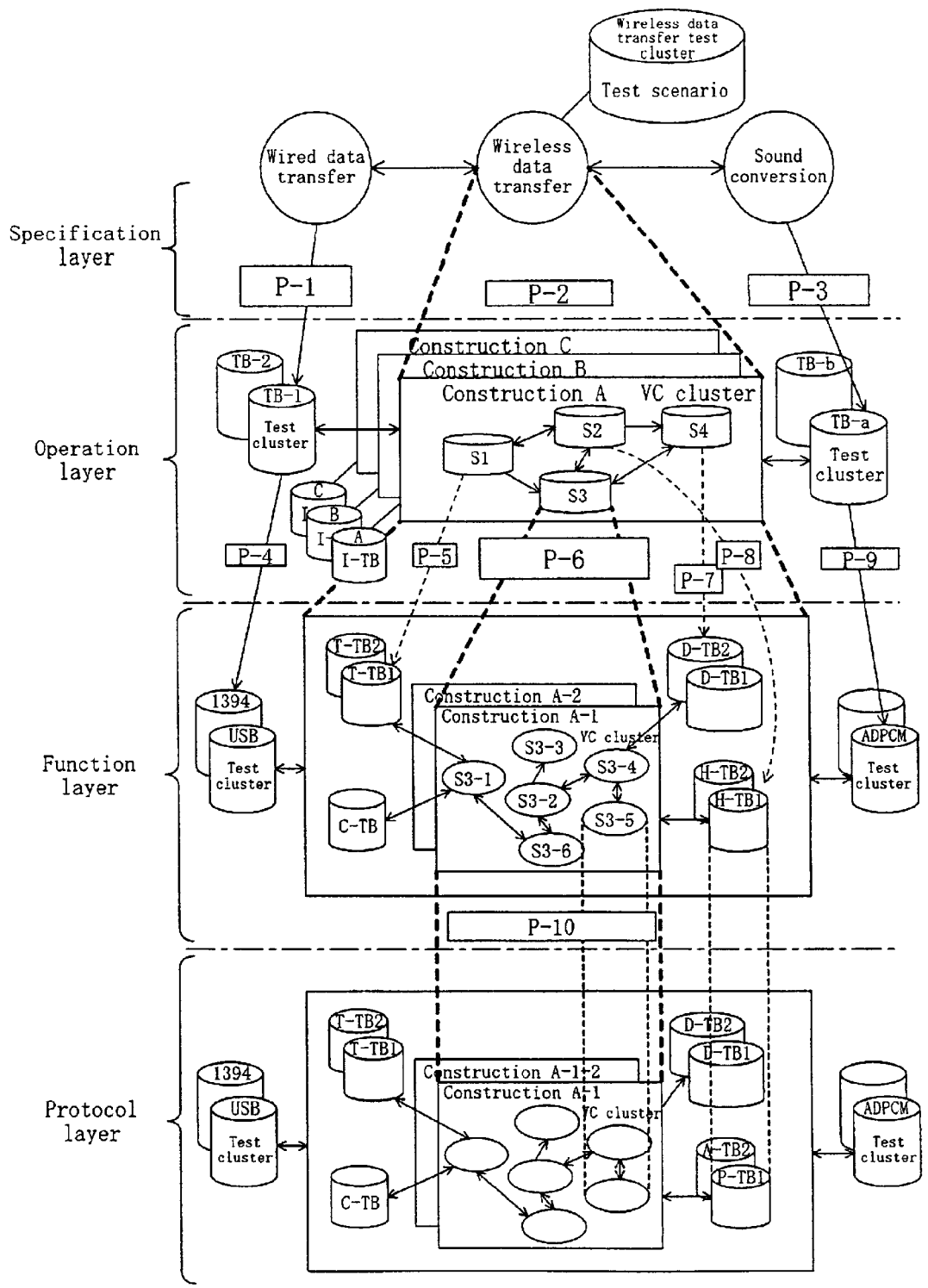
FIG. 42 is a block diagram illustrating the entire structure of test clusters arranged hierarchically in correspondence with the VC cluster in the embodiment of the present invention.
Figure 43:
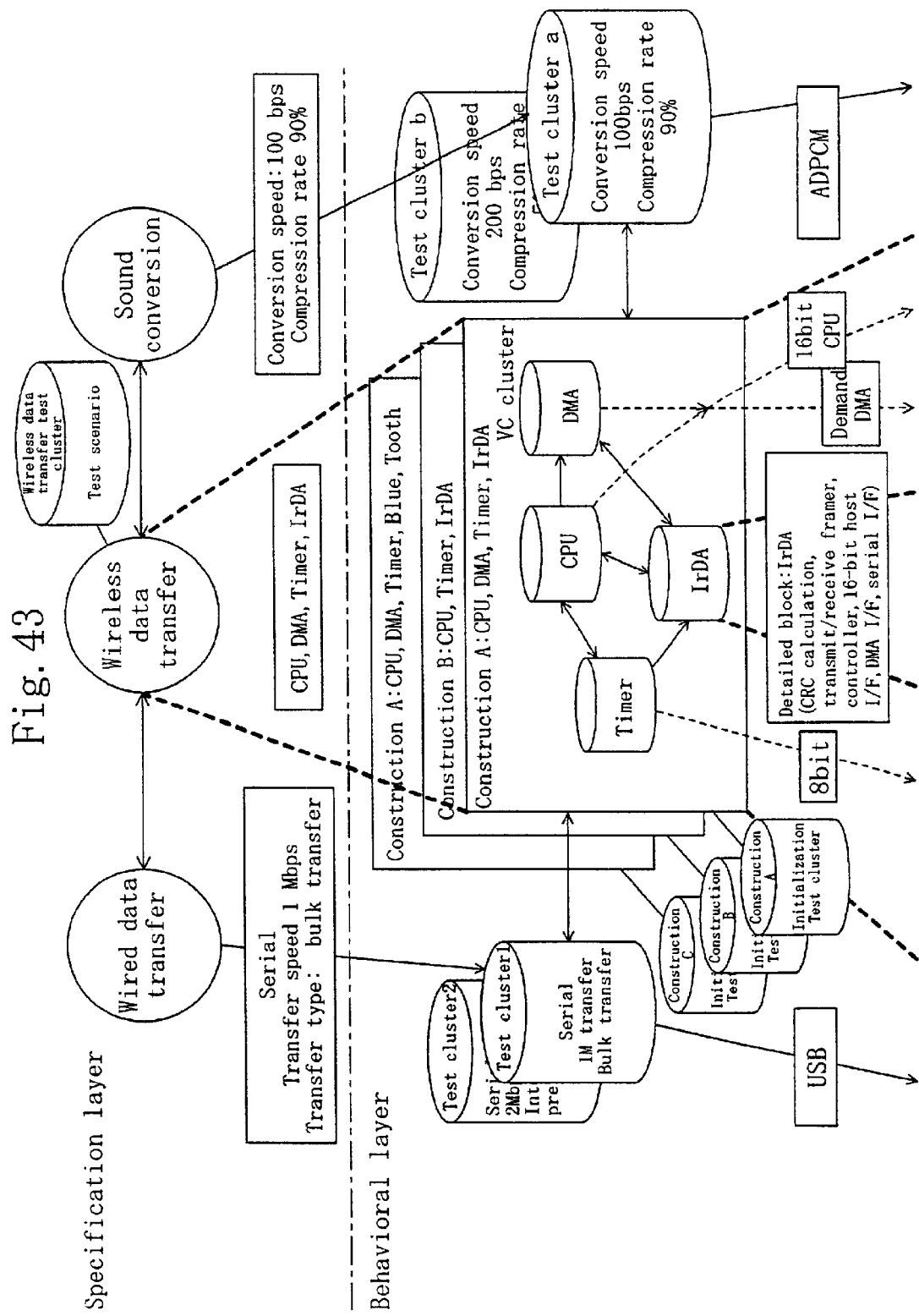
FIG. 43 is a partial enlarged view illustrating in detail the construction of the specification layer and the behavioral layer in FIG. 42.
Figure 44:
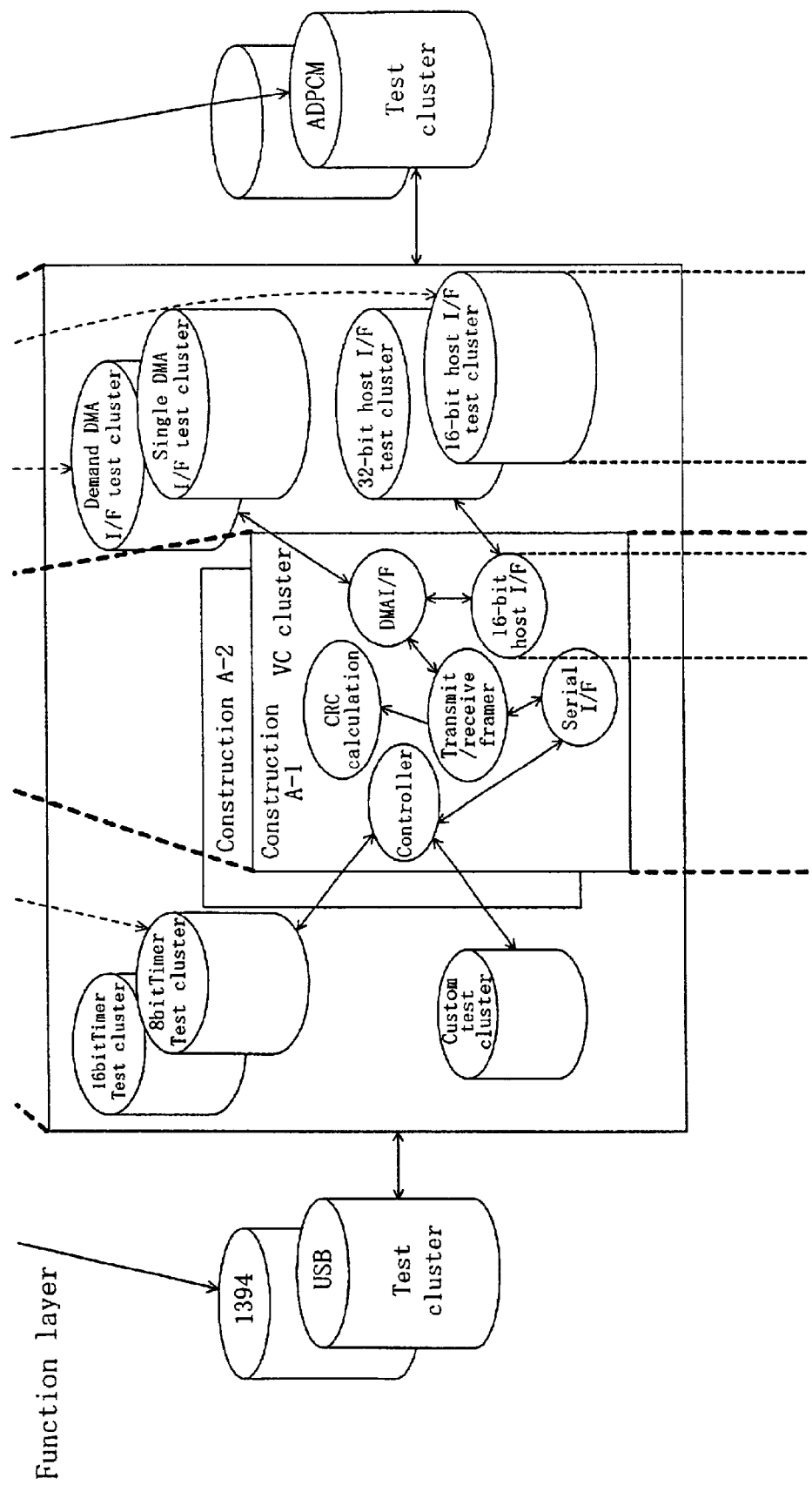
FIG. 44 is a partial enlarged view illustrating in detail the construction of the function layer in FIG. 42.
Figure 45:
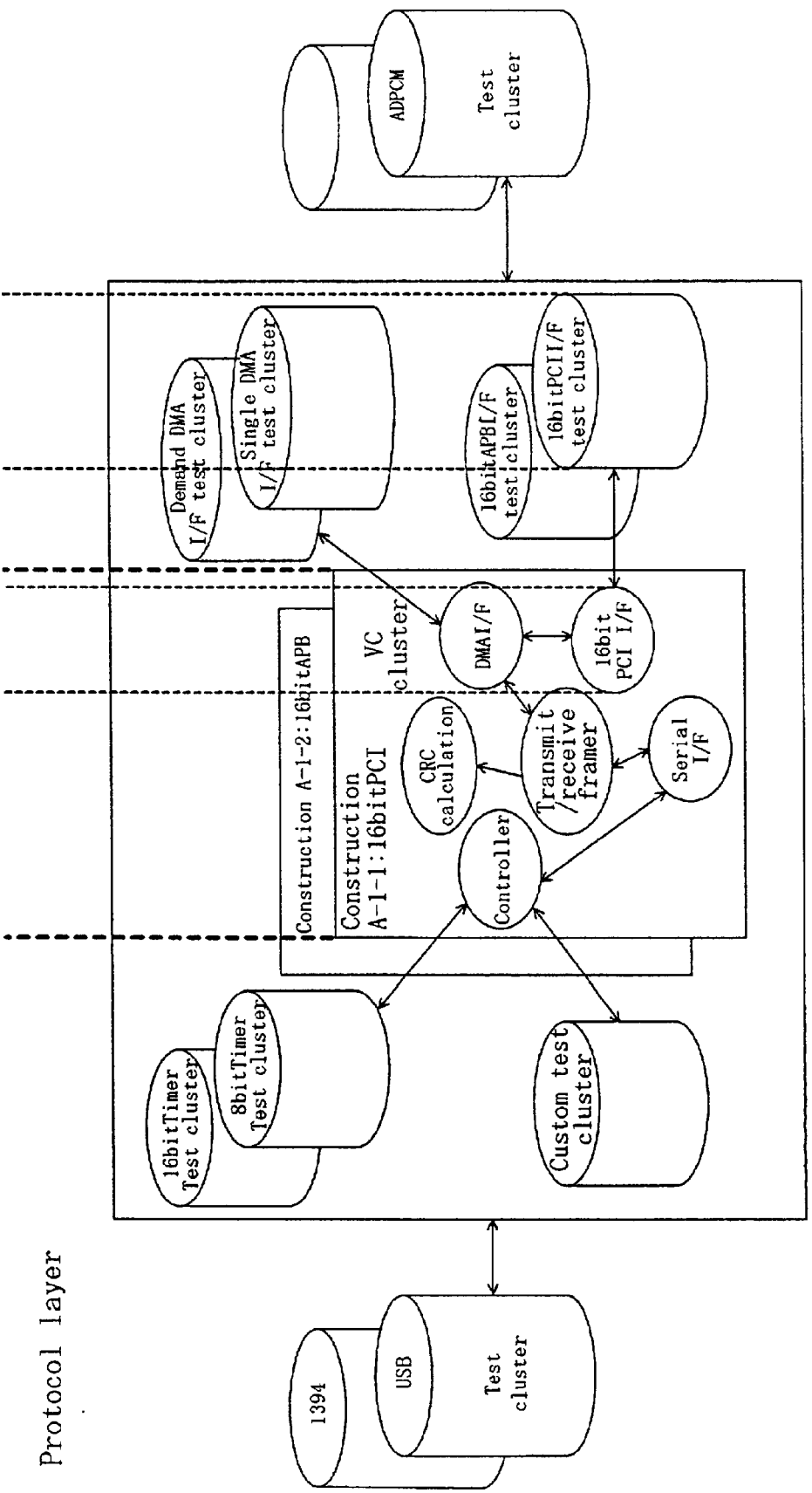
FIG. 45 is a partial enlarged view illustrating in detail the construction of the protocol layer in FIG. 42.

FIG. 42 is a block diagram illustrating the entire structure of hierarchical test clusters. FIGS. 43, 44, and 45 are detailed block diagrams illustrating the structures of the test clusters in the specification/behavior layers, the function layer, and a protocol layer, respectively. Parameters P-1 to 10, test clusters, sequence models S1 to S4, and components S3-1 to 6 schematically shown by codes in FIG. 42 are specifically illustrated in FIGS. 43 to 45.

The above test clusters may be obtained from the test cluster 304 belonging to the VC cluster 300 shown in FIG. 1, or may be generated using the shared test cluster 410 including test scenarios and peripheral models already prepared. For example, there are test scenarios and peripheral models common to a plurality of VC clusters and those stored in the system testing database 402 outside the VC cluster 300.

Apparatuses may be wired-connected or wireless-connected for transferring sound, for example, as data medium. FIGS. 42 to 45 show, in the form of block diagrams, a system for transferring sound data from an apparatus A to an apparatus B in a wired or wireless manner, as an example. In the following description, it is assumed that a circuit for wireless data transfer is to be designed.

In the specification layer, tasks such as converting wired transferred data to wireless data and then to sound for output, for example, are performed. Once such a task is put into an abstract expression, it can be verified. Testing in the specification layer includes testing of only behavior in such a level that sound data is input and simply transferred transversely, for example.

In the behavioral layer, the sequence control in the wireless data transfer section is particularized into VC clusters having constructions A, B, C, . . . . For example, the VC cluster of construction A includes, as models operating in the sequence, Timer (S1), CPU (S2), IrDA (S3) (a general interface using infrared standardized by Infrared Data Association, a standardization organization in U.S.), and DMA (S4).

Further, in the behavioral layer, the wired data transfer section is particularized into a test cluster 1 (TB-1), a test cluster 2 (TB-2), and the like. For example, the test cluster 1 has parameters such that the transfer form is serial, the transfer speed is 1 Mbps, and the transfer type is bulk transfer. The sound conversion section is particularized into a test cluster a (TB-a), a test cluster b (TB-b), and the like. For example, the test cluster TB-a has parameters such that the conversion speed is 100 bps and the compression rate is 90%. The constructions A, B, C, . . . of the VC clusters have respective initialization test clusters (I-TB-A, B, C, . . . ). Thus, by entering the parameters P-1 to 3 in the specification layer, the corresponding VC cluster in the wireless data transfer section and test clusters in the wired data transfer section and the sound conversion section are selected from a table in the behavioral layer.

In the behavioral layer, the control becomes complicated, having respective sequences. For example, assume that data is input into the VC cluster having the construction A from the test cluster a on the wireless side. The procedure in the VC cluster having the construction A in this instance is expressed in a mere sequence level so that the models S1 to S4 operate in the sequence of "notifying receipt of data— announcement of transfer—transfer in response to transfer permissions". In the actual transfer, the VC cluster having the construction A starts transfer of data to the test cluster 1 in the wired data transfer section. Likewise, when data is input into the VC cluster having the construction B from the test cluster b in the sound conversion section, the models in the VC cluster operate in sequence to output the results to the test cluster 2 in the wired data transfer section.

Next, the expansion from the behavioral layer to the function layer will be described. For example, when the IrDA, one of the models in the VC cluster having the construction A in the behavioral layer, is expanded, there are obtained components of the IrDA model in the function layer, I.e., controller (S3-1), transmit/receive framer (S3-2), CRC calculation (S3-3). DMA I/F (S3-4), 16-bit host I/F (S3-5), and serial I/F (S3-6). These components represent concretely the functions of the infrared communication IrDA, such as the bit width and the error correction method. In the function layer, also, test clusters T-TB, H-TB, D-TB are provided for Timer (S1), CPU (S2), and DMA (S3), respectively. For example, for the Timer model, an 8-bit Timer test cluster (T-TB1) and a 16-bit Timer test cluster (T-TB2) are provided. For the CPU model, a 16-bit host I/F test cluster (H-TB1) and a 32-bit host I/F test cluster (H-TB2) are provided. For the DMA model, a demand DMA test cluster (D-TB1) and a single DMA test cluster (D-TB2) are provided. These test clusters are selected by table retrieval by entering the parameters P-4 to 9. Specifically, the test clusters are retrieved from the database in which models and tasks of the test clusters are stored. Thus, parts have been prepared for the environment of testing. This stage indicates that components have been prepared as database.

The sound conversion section and the wired data transfer section in the function layer have test clusters that are further particularized from the behavioral layer. For example, while the test cluster a in the sound conversion section in the behavioral layer only indicates the conversion speed and the compression rate, the test cluster in the function layer includes using ADPCM (Adaptive Differential Pulse Code Modulation) sound CODEC conversion as the conversion method as a parameter. As a result, a database storing models and tasks corresponding to ADPCM is prepared for the ADPCM test cluster in the sound conversion section in the function layer. Likewise, the wired data transfer section in the function layer is provided with a USB test cluster that includes as a parameter using a USB (Universal Serial Bus) general interface as a communication protocol, and a 1394 test cluster that includes as a parameter using an IEEE 1394 general interface. Thus, the environment for testing has been prepared.

As described above, the system testing database includes hierarchical test clusters, not only for the object circuit to be designed, but also for both the input-side circuit supplying signals to the object circuit and the output-side circuit receiving signals from the object circuit. With this arrangement, actual signal transmit/receive flow through the object circuit to be designed, the input-side circuit, and the output-side circuit in the same hierarchical level, as well as the corresponding behavior such as sequence behavior, can be verified.

For example, as for the constructions A, B of the VC clusters in the behavioral layer, the mere existence of the models in the constructions A, B allows for testing inside the respective constructions, but does not allow for testing of the entire system. On the contrary, in this example, the constructions A, B of the VC clusters are provided with signal transmit/receive functions of receiving data from the test clusters a, b in the sound conversion section and outputting data to the test clusters 1, 2 in the wired data transfer section. In this way, testing of the entire system becomes possible.

This is also applicable to one model in the construction A. For example, as for the IrDA model, the fact that the IrDA model receives some data and outputs some data allows for testing of the design of this portion, but does not allow for testing how this IrDA portion operates in the entire system. By using the hierarchical test clusters as in this example, each model can be verified in the state matching with an actual system. This is also applicable to the lower-level layer such as the function layer.

The protocol layer is provided for verifying the detailed protocol relating to data transmit/receive behavior and the details of timings. For example, as shown in FIGS. 42 and 45, the 16-bit host I/F is particularized in relation to the protocol and the timing, using 16-bit PCI and 32 MHz as parameters, to obtain 16-bit PCI I/F (32 MHz) and a 16-bit PCI I/F test cluster as the test cluster thereof.

Generation Method of Test Cluster

Figure 46:
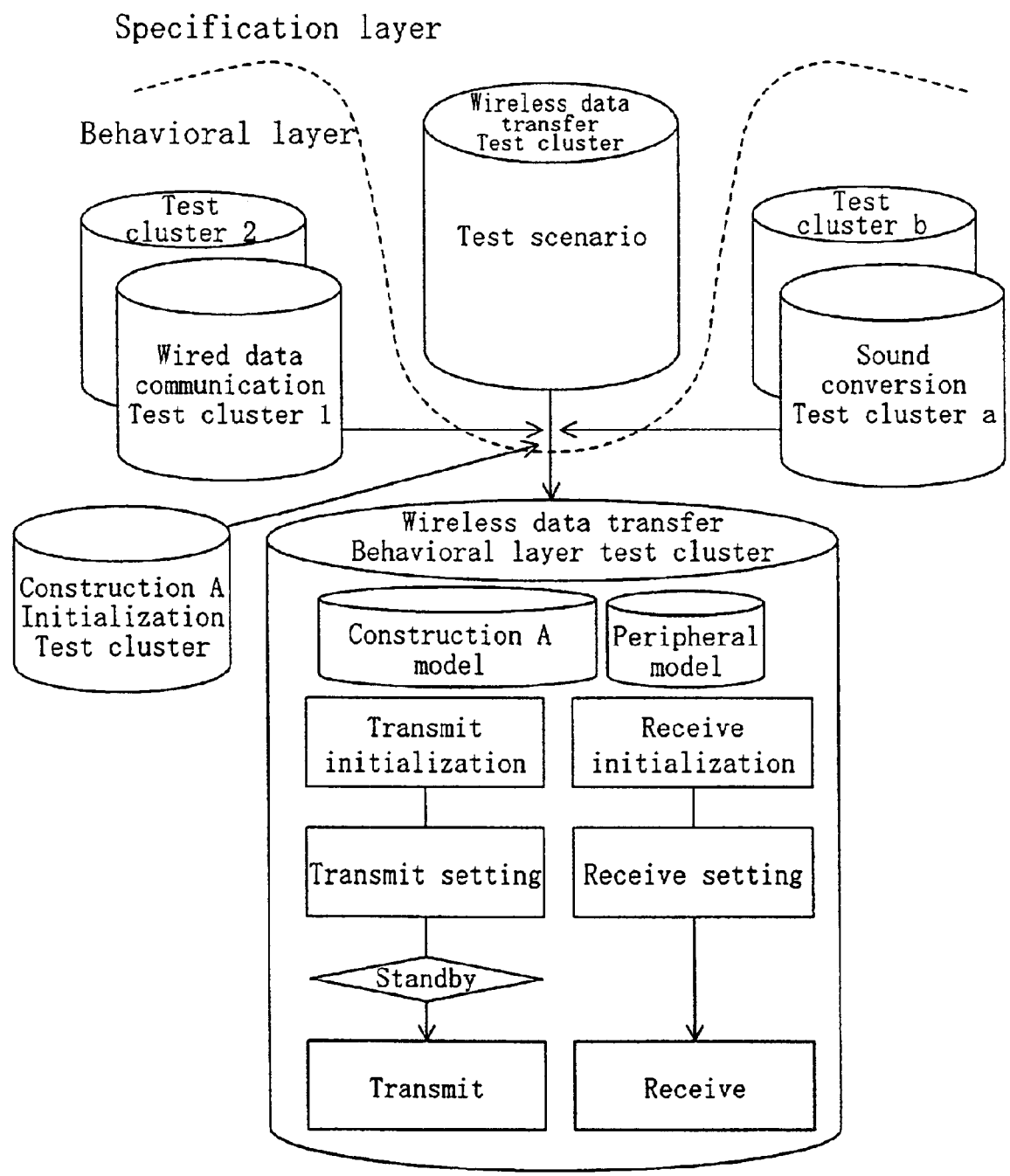
FIG. 46 is a block diagram schematically illustrating a method for generating a test cluster between the specification layer and the behavioral layer in the embodiment of the present invention.
Figure 47:
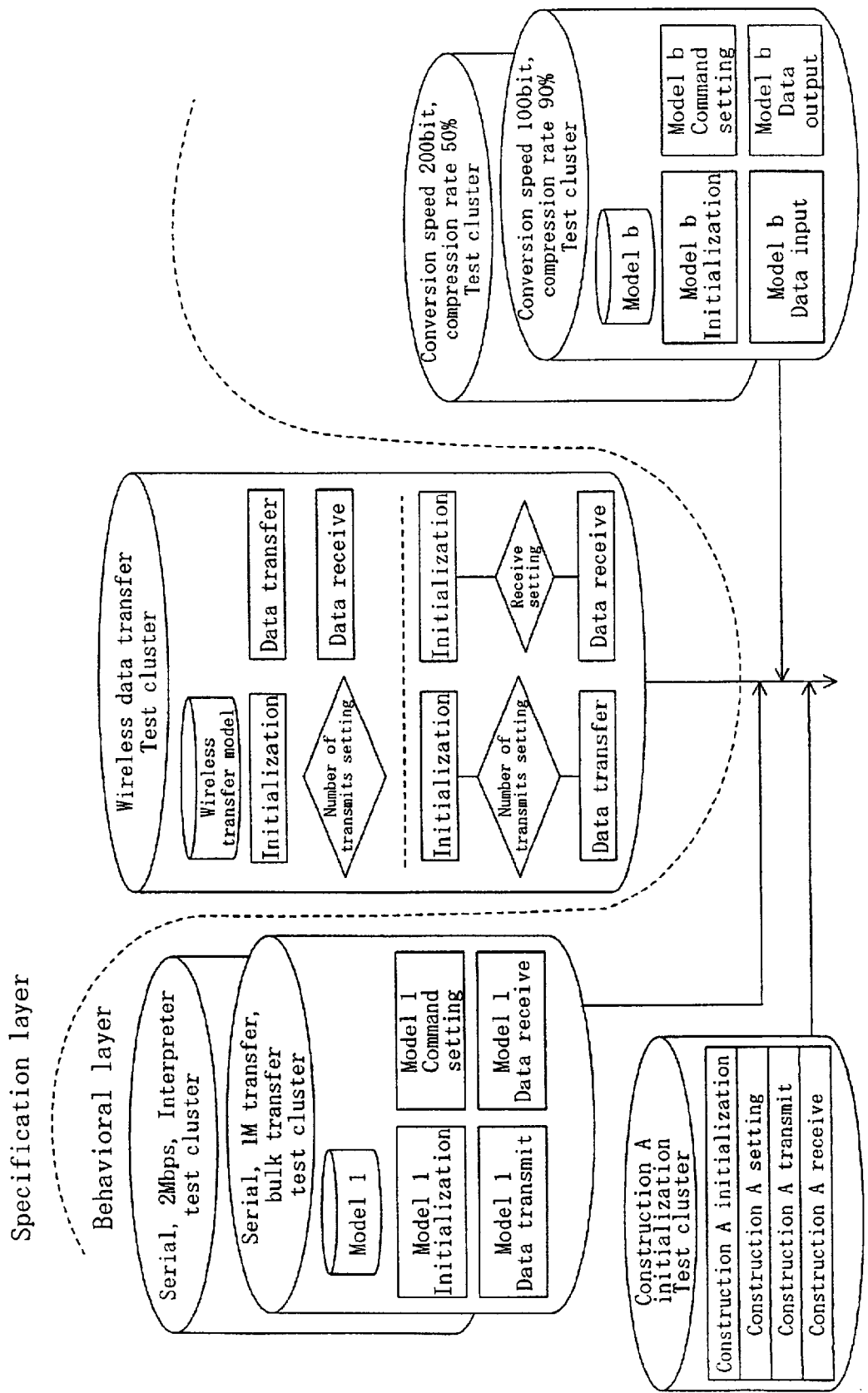
FIG. 47 is a partial enlarged view illustrating in detail the parts for test cluster generation shown in FIG. 46.
Figure 48:
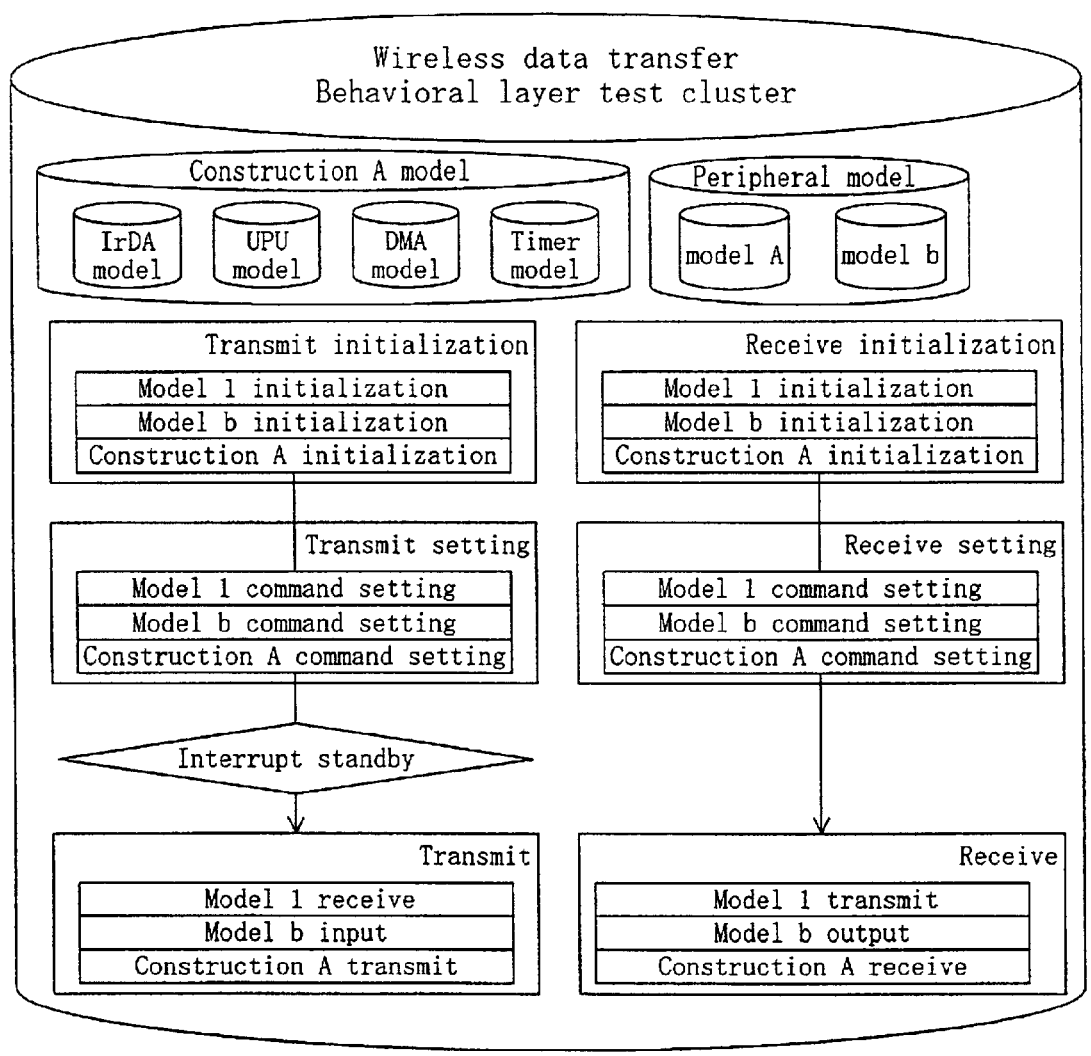
FIG. 48 is a partial enlarged view illustrating in detail the generated test cluster and test scenario shown in FIG. 46.

FIG. 46 is a block diagram illustrating a method for generating test clusters between the specification layer and the behavioral layers. FIGS. 47 and 48 are partial enlarged views illustrating the parts for generating test clusters and the generated test clusters shown in FIG. 46, respectively. FIGS. 46 to 48 are based on the system of the hierarchical test clusters shown in FIGS. 42 to 45.

The test cluster in the wireless data transfer section includes components of a wireless transfer model, initialization, transmit/receive frequency setting, data transmit, and data receive. The test scenario in the wireless data transfer section is divided into the transmit-side and the receive-side each having the steps of initialization, transmit (receive) frequency setting, and data transmit (receive). The test cluster in the wireless data transfer in the behavioral layer is generated by using the test clusters 1, 2 in the wired data transfer section in the behavioral layer, the initialization test cluster for the construction A, and the test clusters a, b in the sound conversion section in the behavioral layer.

The test cluster in the behavioral layer is generated by combining the test cluster in the wireless data transfer section with the test clusters 1, 2, a, b and the initialization test cluster for the construction A. More specifically, along with the test scenario in the wireless data transfer section, models for tasks of initialization, transmit (receive) frequency setting, and data transmit (receive) are sequentially generated for a model 1 in the test cluster 1 in the wired data transfer section in the behavioral layer, a model b in the test cluster a in the sound conversion section in the behavioral layer, and the construction A of the VC cluster in the wireless data transfer section. For example, the initialization of transmit in the test scenario in the wireless data transfer in the specification layer is turned to a detailed command by combining the initialization of the model 1, the initialization of the model b, and the initialization of the construction A.

By the above method, a lower-level test cluster can be constructed from a higher-level test cluster during the particularization of the test cluster in the specification layer. In other words, in the conventional method, test clusters, that is, tasks in the respective levels need to be generated individually. In contrast, the method according to the present invention prepares not only shared test clusters (test clusters and test scenarios) for the object circuit to be designed, but also hierarchical test clusters for both the input-side circuit supplying signals to the object circuit and the output-side circuit receiving signals from the object circuit, to generate the lower-level test cluster using the test clusters in the input-side and output-side circuits as well as the higher-level test cluster. Thus, the higher-level test cluster can be effectively utilized. By this sequential generation of test clusters from the higher level to the lower level, the environment required for testing of the entire system is prepared.

Figure 49:
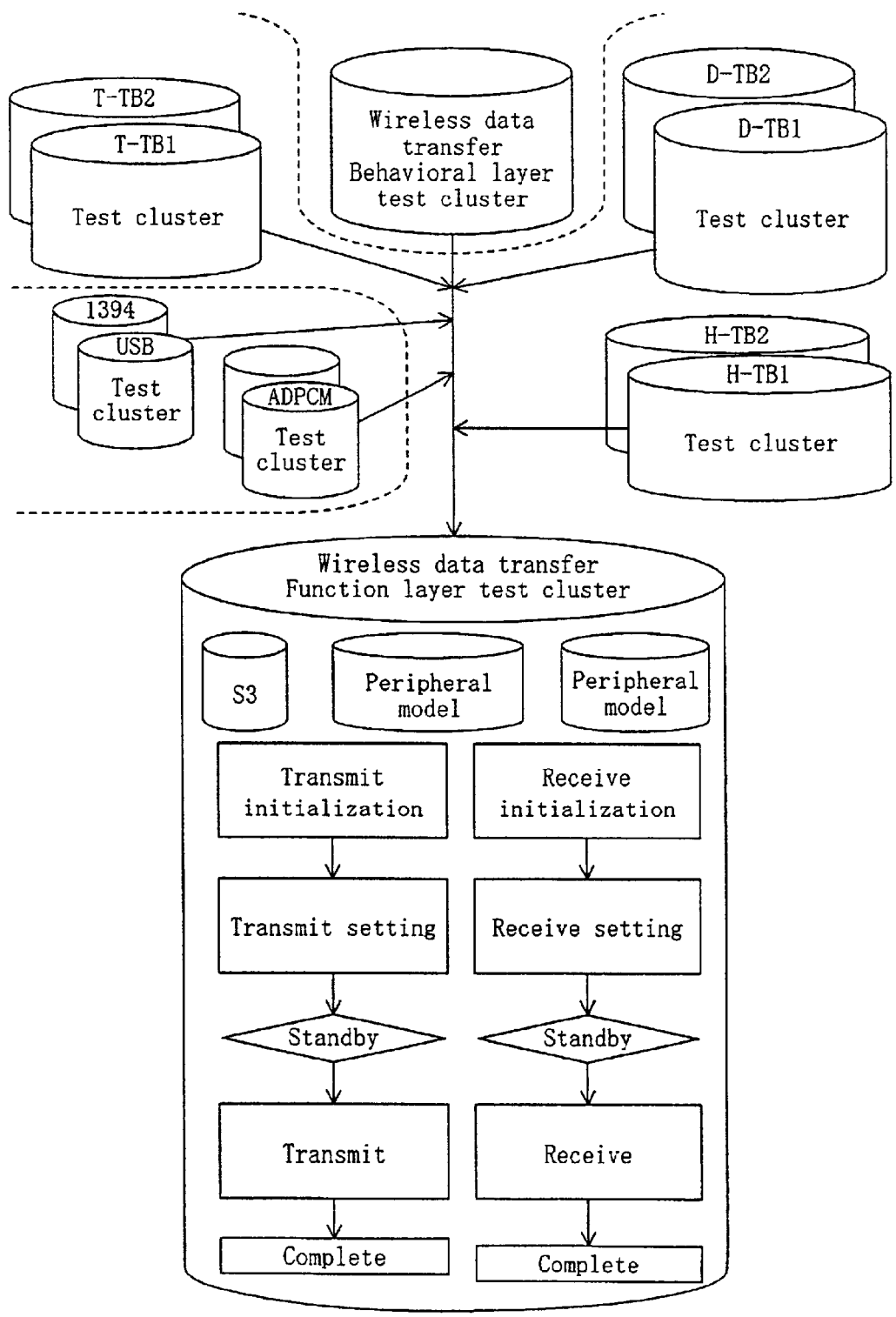
FIG. 49 is a block diagram schematically illustrating a method for generating a test cluster between the behavioral layer and the function layer in the embodiment of the present invention.
Figure 50:
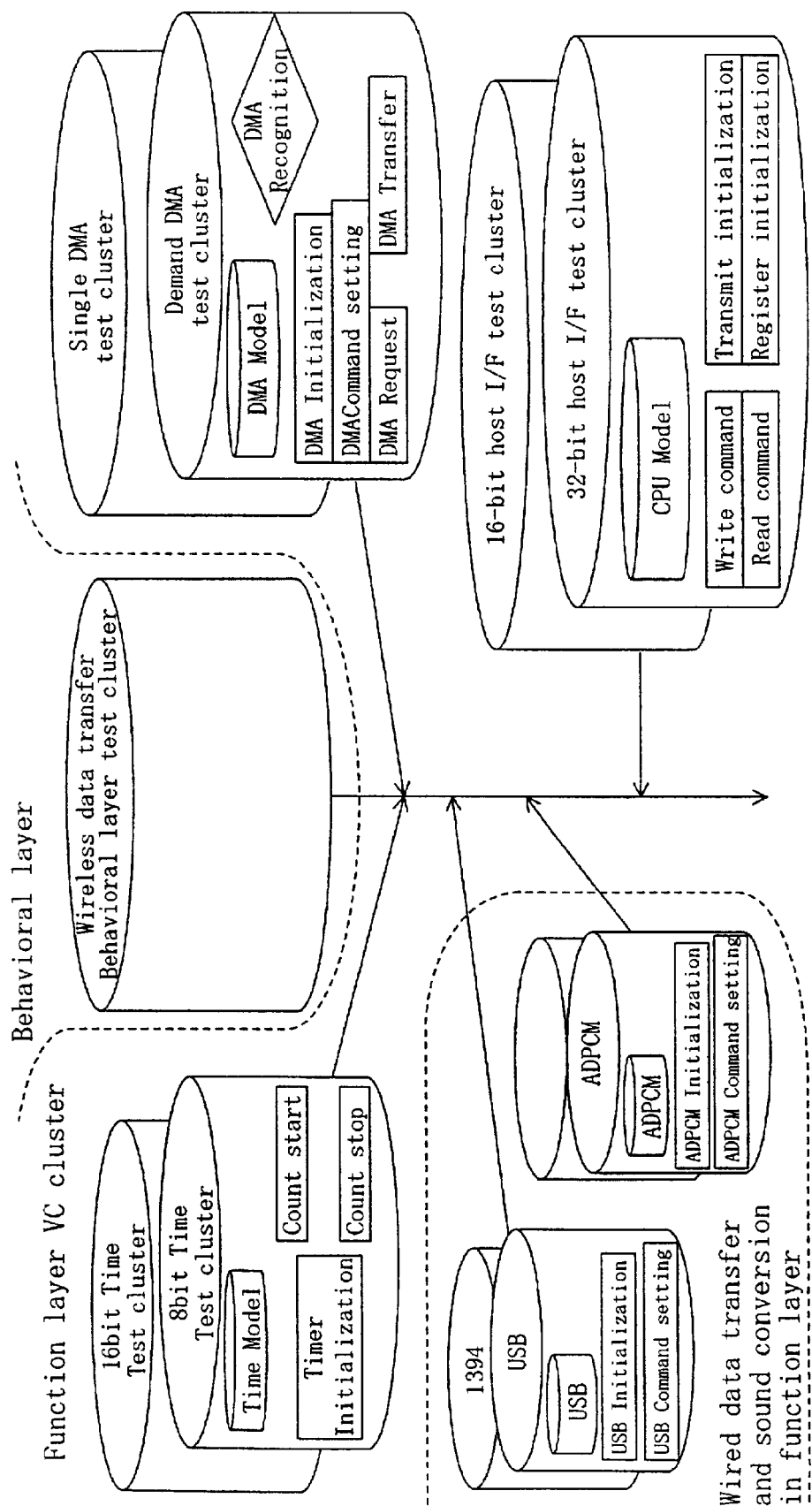
FIG. 50 is a partial enlarged view illustrating in detail the parts for test cluster generation shown in FIG. 49.
Figure 51:
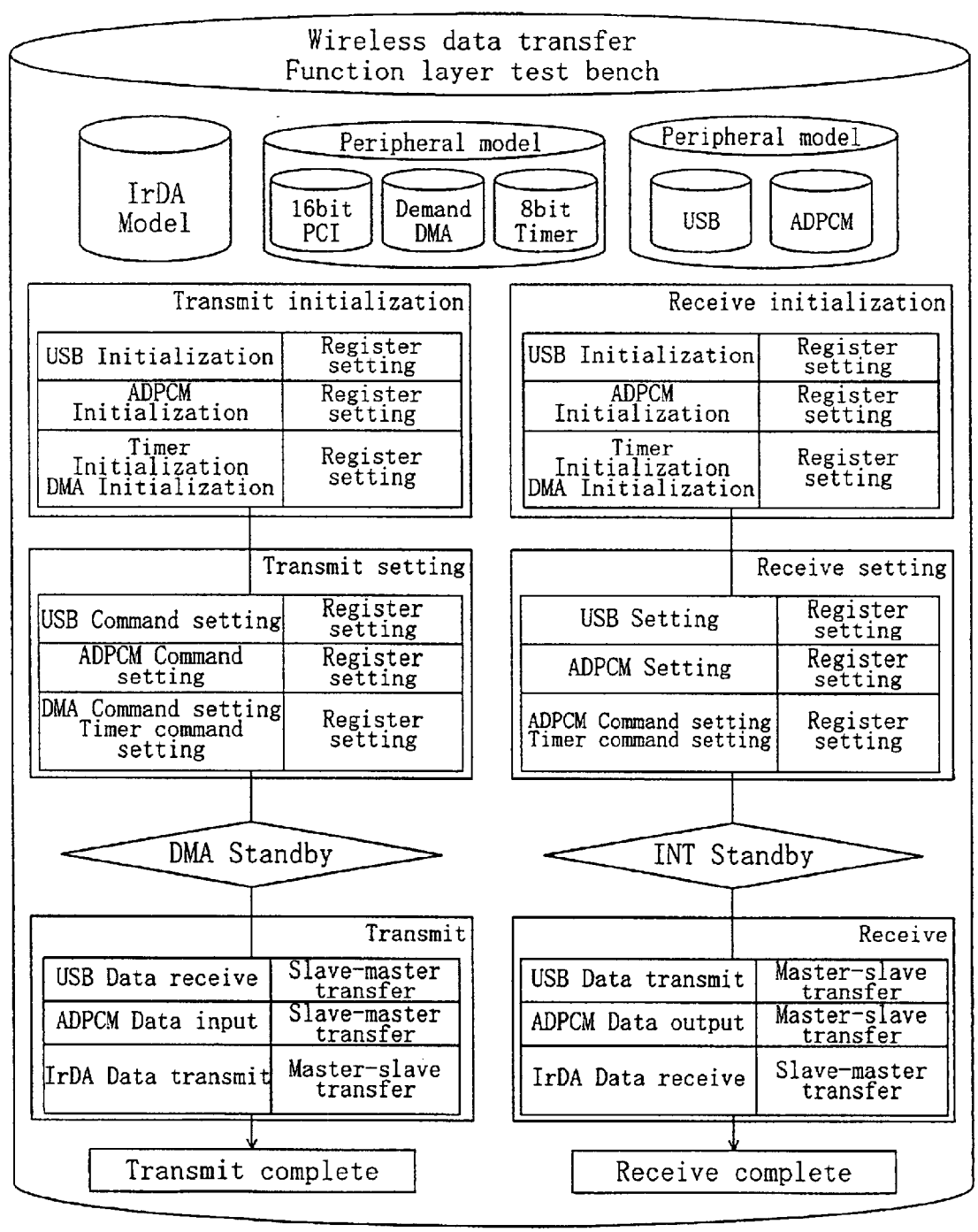
FIG. 51 is a partial enlarged view illustrating in detail the generated test cluster and test scenario shown in FIG. 49.

FIG. 49 is a block diagram illustrating a method for generating test clusters between the behavioral layer and the function layer. FIGS. 50 and 51 are partial enlarged views illustrating the parts for generating test clusters and the generated test clusters shown in FIG. 49, respectively. FIGS. 49 to 51 are also based on the system of the hierarchical test clusters shown in FIGS. 42 to 45.

At this stage, although detailed description on the procedure is omitted, test clusters for the wireless data transfer section in the function layer are generated using: the test clusters in the wireless data transfer section in the behavioral layer; the 8-bit Timer test cluster (T-TB1) and the 16-bit Timer test cluster (T-TB1) and the 16-bit Timer test cluster (T-TB2), the 16-bit host I/F test cluster (H15 TB1) and the 32-bit host I/F test cluster (H-TB2), and the demand DMA test cluster (D-TB1) and the single DMA test cluster (D-TB2) in the VC clusters in the function layer; the ADPCM test cluster in the sound conversion section in the function layer; and the USB test cluster and the 1394 test cluster in the wired data transfer section in the function layer.

Figure 52:
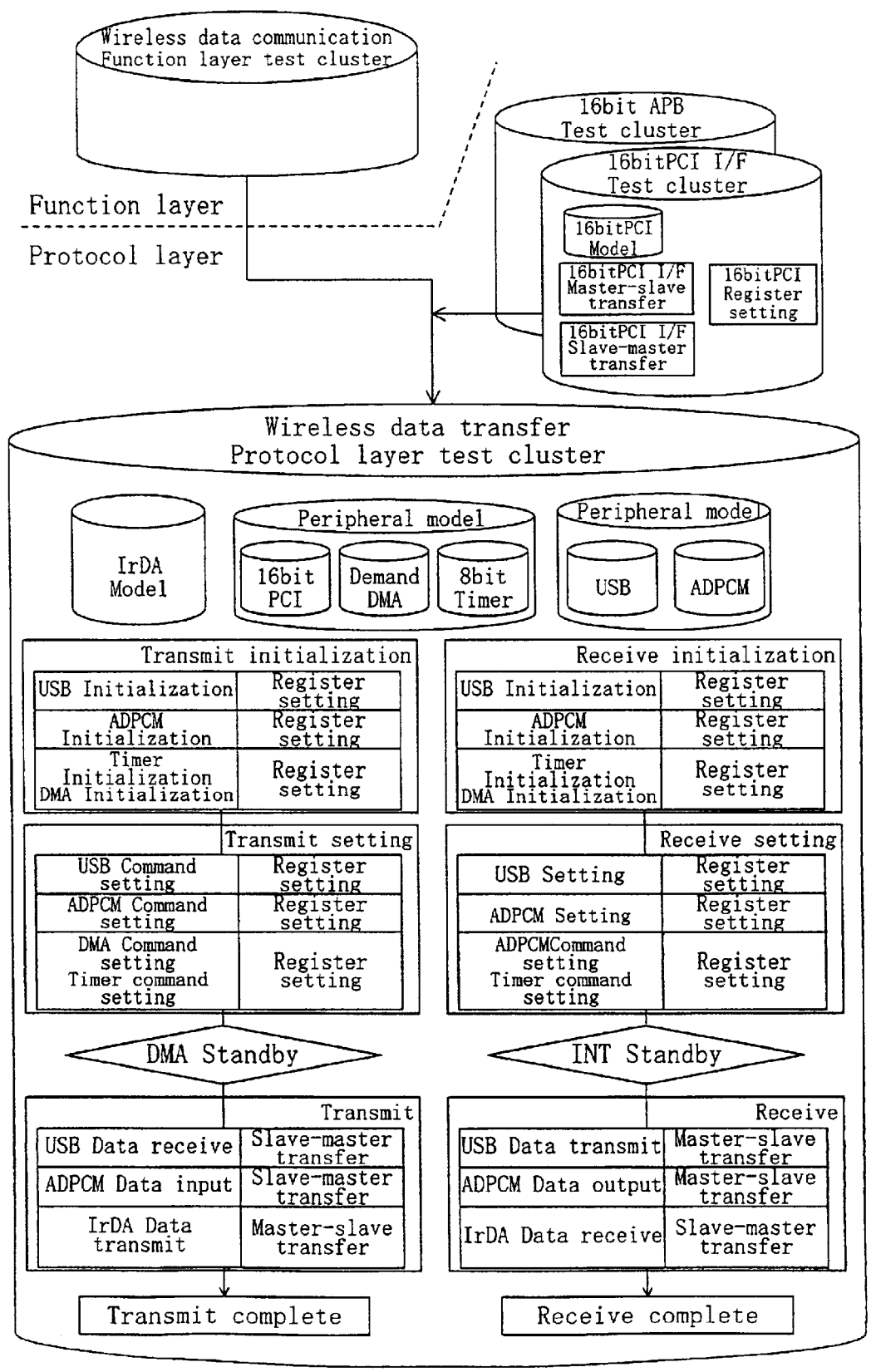
FIG. 52 is a block diagram schematically illustrating a method for generating a test cluster between the function layer and the protocol layer in the embodiment of the present invention.

FIG. 52 is a block diagram illustrating a method for generating test clusters between the function layer and the protocol layer.

At this stage, although detailed description on the procedure is omitted, test clusters for the wireless data transfer section in the protocol layer are generated using: the test clusters in the wireless data transfer section in the function layer; and the 16-bit PCI I/F test cluster and the 16-bit APB I/F test cluster in the VC cluster in the protocol layer. PCI is for Peripheral Component Interconnect that is a high-speed standardized local bus, and APB is for Advanced Peripheral Bus that is a local bus used by ARM Corp.

The thus-generated test clusters may be stored in the VCDB 100 or may be kept in a place other than the VCDB 100 only during testing.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention that fall within the true spirit and scope of the invention.

What is claimed is:

1. A database for design of an integrated circuit device, comprising at least one virtual core cluster, said at least one virtual core cluster comprises a plurality of virtual core layers, each of said virtual core layers being arranged in a hierarchical structure according to a degree of abstraction having at least a specification layer, a behavioral layer or a register transfer layer in said at least one virtual core cluster, each of said virtual core layers having at least one virtual core for storing data required for designing said integrated circuit device, wherein each virtual core of a preceding virtual core layer is implemented as a function to said at least one virtual core of the downstream virtual core layer in a hierarchical manner, and wherein said at least one virtual core cluster includes a test cluster for storing data required for verifying the function of said at least one virtual core and the function of a system constructed using said at least one virtual core, said test cluster being arranged in a hierarchical structure having the same number of virtual core layers as said at least one virtual core cluster in correspondence with the respective hierarchical layers of said at least one virtual core cluster.

2. The database of claim 1, wherein said test cluster includes at least one of a test bench, a test scenario, a task, and a model.

3. The method of claim 1, wherein a portion of functions of the specification layer overlaps a portion of functions of the behavioral layer.

4. A database for design of an integrated circuit device, comprising at least one virtual core cluster, said virtual core cluster comprises a plurality of virtual core layers, each of said virtual core layers being arranged in a hierarchical structure according to a degree of abstraction having at least a specification layer, a behavioral layer or a register transfer layer in said at least one virtual core cluster, each of said virtual core layers having at least one virtual core for storing data required for designing said integrated circuit device, wherein each virtual core of a preceding virtual core layer is implemented as a function to said at least one virtual core of the downstream virtual core layer in a hierarchical manner, and said database further comprising a system testing database for verifying a system when said integrated circuit device is constructed by combining said at least one virtual core of each of said virtual core layers, said system testing database being arranged in a hierarchical structure having the same number of virtual core layers as said at least one virtual core cluster in correspondence with the respective hierarchical layers of said at least one virtual core cluster.

5. The database of claim 4, wherein the system testing database includes a test cluster for storing data required for verifying the function of the virtual cores and the function of the system constructed using the virtual cores, the test cluster being arranged in a hierarchical structure of layers of the same number of layers as the virtual core cluster in correspondence with the respective hierarchical layers of the virtual core cluster.

6. The database of claim 5, wherein the test cluster includes at least one of a test bench, a test scenario, a task, and a model that are shared in testing of different system LSI implementations using the virtual cores.

7. The database of claim 5, wherein the system testing database includes a peripheral model cluster connected to the peripheral of the virtual cores to be used for testing of the system, the peripheral model cluster being arranged in a hierarchical structure of the same number of layers as the virtual core cluster in correspondence with the respective hierarchical layers of the virtual core cluster.

8. A database for design of an integrated circuit device, comprising at least one virtual core cluster, said virtual core cluster comprises a plurality of virtual core layers, each of said virtual core layers being arranged in a hierarchical structure according to a degree of abstraction having at least a specification layer a behavioral layer or a register transfer layer in said at least one virtual core cluster, each of said virtual core layers having at least one virtual core for storing data required for designing said integrated circuit device, said at least one virtual core cluster including: specification/behavior virtual cores for storing data in specification/behavior levels required for constructing said integrated circuit device; and register transfer virtual cores for storing data in a register transfer level required for satisfying the specification/behavior specified by said data stored in said specification/behavior virtual cores, said database further comprising purpose-specific function testing models specified according to the testing purpose used for verifying the function of said integrated circuit device, said purpose-specific function testing models being linked to said register transfer virtual cores, wherein each virtual core of a preceding virtual core layer is implemented as a function to said at least one virtual core of the downstream virtual core layer in a hierarchical manner.

9. The database of claim 8, wherein the purpose-specific function testing models include a synchronization model that changes signal timing used during function testing to a multiple of a given cycle synchronizing with a clock.

10. The database of claim 8, wherein the purpose-specific function testing models include a description optimization model that deletes operation unused during function testing among operation items used in actual behavior of the integrated circuit device.

11. The database of claim 8, wherein the purpose-specific function testing models include a description optimization model that unifies signal lines extending over a plurality of different layers for circuit data found in the respective layers in the virtual core cluster.

12. The database of claim 8, wherein the purpose-specific function testing models include a description optimization model that unifies circuit description formats for the integrated circuit device into a format with which a simulator used during function testing exhibits a highest operation speed.

13. The database of claim 8, wherein the purpose-specific function testing models include a description optimization model that deletes a description on a portion of the integrated circuit device that does not operate during function testing.

14. The database of claim 13, wherein the purpose-specific function testing models include means for detecting an attempt of activating the deleted description and warning during the testing using the description optimization model.

15. The database of claim 8, wherein the purpose-specific function testing models include means for checking whether or not circuit behavior is normal during testing of the integrated circuit device and warning upon detection of abnormal behavior.

16. A database for design of an integrated circuit device, comprising at least one virtual core cluster, said virtual core cluster comprises a plurality of virtual core layers, each of said virtual core layers being arranged in a hierarchical structure according to a degree of abstraction having at least a specification layer, a behavioral layer or a register transfer layer in said at least one virtual core cluster, each of said virtual core layers having at least one virtual core for storing data required for designing said integrated circuit device, said database further comprising information on a technique for optimizing fault test in a body of said at least one virtual core, wherein each virtual core of a preceding virtual core layer is implemented as a function to said at least one virtual core of the downstream virtual core layer in a hierarchical manner.

17. A database for design of an integrated circuit device, comprising at least one virtual core cluster, said virtual core cluster comprises a plurality of virtual core layers, each of said virtual core layers being arranged in a hierarchical structure according to a degree of abstraction having at least a specification layer, a behavioral layer or a register transfer layer in said at least one virtual core, cluster, each of said virtual core layers having at least one virtual core for storing data required for designing said integrated circuit device, said database further comprising a model for analyzing a toggle in a body of said at least one virtual core, wherein each virtual core of a preceding virtual core layer is implemented as a function to said at least one virtual core of the downstream virtual core layer in a hierarchical manner.

18. A database for design of an integrated circuit device, comprising at least one virtual core cluster, said virtual core cluster comprises a plurality of virtual core layers, each of said virtual core layers being arranged in a hierarchical structure according to a degree of abstraction having at least a specification layer, a behavioral layer or a register transfer layer in said at least one virtual core cluster, each of said virtual core layers having at least one virtual core for storing data required for designing said integrated circuit device, said database further comprising a virtual core interface model usable for constructing a system LSI by combining said at least one virtual core cluster, serving as a coupling model for combining said at least one virtual core in different said virtual core layers in the respective said at least one virtual core cluster, wherein each virtual core of a preceding virtual core layer is implemented as a function to said at least one virtual core of the downstream virtual core layer in a hierarchical manner.

19. The database of claim 18, wherein the virtual core interface model comprises:

an input section and an output section arranged in a hierarchical structure of the same number of layers as the virtual core cluster in correspondence with the respective hierarchical layers of the virtual core cluster; and conversion means located between the input section and the output section for converting a parameter set for each layer of the virtual core cluster.

20. A method for designing an integrated circuit device using a virtual core database comprising at least one virtual core cluster, said virtual core cluster comprises a plurality of virtual core layers, each of said virtual core layers being arranged in a hierarchical structure according to a degree of abstraction having at least a specification layer, a behavioral layer or a register transfer layer in said at least one virtual core cluster, each of said virtual core layers having at least one virtual core for storing data required for designing said integrated circuit device, wherein each virtual core of a preceding virtual core layer is implemented as a function to said at least one virtual core of the downstream virtual core layer in a hierarchical manner, the method comprising the step of:

in response to a request for verifying said integrated circuit device, retrieving information on said at least one virtual core cluster in said virtual core database and generating a test cluster for verifying said integrated circuit device.

21. The method of claim 20, wherein at least one of a test bench, a scenario, a task, and a model is generated as the test cluster.

22. A method for designing an integrated circuit device using a virtual core database comprising at least one virtual core cluster, said virtual core cluster comprises a plurality of virtual core layers, each of said virtual core layers being arranged in a hierarchical structure according to a degree of abstraction having at least a specification layer, a behavioral layer or a resister transfer layer in said at least one virtual core cluster, each of said virtual core layers having at least one virtual core for storing data required for designing said integrated circuit device, wherein each virtual core of a preceding virtual core layer is implemented as a function to said at least one virtual core of the downstream virtual core layer in a hierarchical manner, the method comprising the step of:

in response to a request for verifying said integrated circuit device, generating purpose-specific function testing models specified according to the testing purpose used for verifying the function of said integrated circuit device, said purpose-specific function testing models being linked to said at least one virtual core in a function layer in said least one virtual core cluster.

23. The method of claim 22, wherein a synchronization model that changes signal timing used during function testing to a multiple of a given cycle synchronizing with a clock is generated as the purpose-specific function testing model.

24. The method of claim 22, wherein a description optimization model that deletes a process unused during function testing among processes used in actual behavior of the integrated circuit device is generated as the purpose-specific function testing model.

25. The method of claim 22, wherein a description optimization model that unifies signal lines extending over a plurality of different layers for circuit data found in the respective layers in the virtual core cluster is generated as the purpose-specific function testing model.

26. The method of claim 22, wherein a description optimization model that unifies circuit description formats for the integrated circuit device into a format with which a simulator used during function testing exhibits a highest operation speed is generated as the purpose-specific function testing model.

27. The method of claim 22, wherein a description optimization model that deletes description on a portion of the integrated circuit device that does not operate during function testing is generated as the purpose-specific function testing model.

28. The method of claim 27, wherein the description optimization model includes means for detecting an attempt of activating the description deleted in the testing using the description optimization model and warning.

29. The method of claim 22, wherein means for checking whether or not circuit behavior is normal during testing of the integrated circuit device and warning upon detection of abnormal behavior is generated as the purpose-specific function testing model.

30. A method for designing an integrated circuit device using a virtual core database comprising at least one virtual core cluster, said virtual core cluster comprises a plurality of virtual core layers, each of said virtual core layers being arranged in a hierarchical structure according to a degree of abstraction having at least a specification layer, a behavioral layer or a register transfer layer in said at least one virtual core cluster, each of said virtual core layers having at least one virtual core for storing data required for designing said integrated circuit device, wherein each virtual core of a preceding virtual core layer is implemented as a function to said at least one virtual core of the downstream virtual core layer in a hierarchical manner, the method comprising the step of:

generating a system testing model for verifying a system when said integrated circuit device is constructed by combining said at least one virtual core, the system testing database being arranged in a hierarchical structure having the same number of virtual core layers as said at least one virtual core cluster in correspondence with the respective hierarchical layers of said at least one virtual core cluster.

31. A method for designing an integrated circuit device using a virtual core database and a CPU for testing, the virtual core database comprising at least one virtual core cluster, said virtual core cluster comprises a plurality of virtual core layers, each of said virtual core layers being arranged in a hierarchical structure according to a degree of abstraction having at least a specification layer, a behavioral layer or a register transfer layer in said at least one virtual core cluster, each of said virtual core layers having at least one virtual core for storing data required for designing said integrated circuit device, wherein each virtual core of a preceding virtual core layer is implemented as a function to said at least one virtual core of the downstream virtual core layer in a hierarchical manner, the method comprising the step of:

retrieving a virtual core from said virtual core database according to simulation results, while retrieving a parameter relating to said CPU used according to said simulation results, to select or generate an interface in compliance with said parameter of said CPU used, and store said interface in said at least one virtual core.

32. The method of claim 31, wherein the interface is a bus interface for allowing transmit/receive of a signal between the CPU and a bus, and the bus interface is stored separately from a virtual core function base in the virtual core, the bus interface being generated in compliance with a protocol of the CPU used.

33. A method for designing an integrated circuit device using a virtual core database comprising at least one virtual core cluster, said virtual core cluster comprises a plurality of virtual core layers, each of said virtual core layers being arranged in a hierarchical structure according to a degree of abstraction having at least a specification layer, a behavioral layer or a register transfer layer in said at least one virtual core cluster, each of said virtual core layers having at least one virtual core for storing data required for designing said integrated circuit device, wherein each virtual core of a preceding virtual core layer is implemented as a function to said at least one virtual core of the downstream virtual core layer in a hierarchical manner, the method comprising the step of analyzing a toggle in a body of said at least one virtual core.

34. A method for designing an integrated circuit device using a virtual core database comprising at least one virtual core cluster, said virtual core cluster comprises a plurality of virtual core layers, each of said virtual core layers being arranged in a hierarchical structure according to a degree of abstraction having at least a specification layer, a behavioral layer or a register transfer layer in said at least one virtual core cluster, each of said virtual core layers having at least one virtual core for storing data required for designing said integrated circuit device, wherein each virtual core of a preceding virtual core layer is implemented as a function to said at least one virtual core of the downstream virtual core layer in a hierarchical manner, the method comprising the step of:

optimizing fault test in a body of said at least one virtual core.

* * * * *